(12) United States Patent
Hall et al.

(10) Patent No.: US 9,569,955 B2
(45) Date of Patent: *Feb. 14, 2017

(54) UNIVERSAL MULTI-FUNCTION WALL SWITCH

(71) Applicant: David R. Hall, Provo, UT (US)

(72) Inventors: David R. Hall, Provo, UT (US); Austin Benjamin Carlson, Provo, UT (US); Clint J Cook, American Fork, UT (US); Davido Loyal Hyer, Spanish Fork, UT (US); Devon Mack Lawless, Provo, UT (US); Emily Brimhall, Alpine, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/683,012

(22) Filed: Apr. 9, 2015

(65) Prior Publication Data

US 2015/0348401 A1 Dec. 3, 2015

Related U.S. Application Data

(63) Continuation of application No. 14/682,077, filed on Apr. 8, 2015, and a continuation of application No.
(Continued)

(51) Int. Cl.
*E06B 9/307* (2006.01)
*G08C 17/02* (2006.01)
(Continued)

(52) U.S. Cl.
CPC ............... *G08C 17/02* (2013.01); *E06B 9/307* (2013.01); *E06B 9/308* (2013.01); *E06B 9/32* (2013.01); *E06B 9/322* (2013.01); *E06B 9/326* (2013.01); *E06B 9/38* (2013.01); *E06B 9/74* (2013.01); *F16H 57/021* (2013.01); *G01R 19/0092* (2013.01); *G05B 19/0426* (2013.01); *H02P 29/027* (2013.01); *E06B 2009/285* (2013.01); *E06B 2009/3222* (2013.01); *E06B 2009/6809* (2013.01); *G05B 2219/25011* (2013.01);
(Continued)

(58) Field of Classification Search
CPC ............ G08C 2201/92; G08C 2201/91; G08C 2201/93; E06B 9/307
USPC ........................................... 160/1, 7, 176.1 P
See application file for complete search history.

(56) References Cited

U.S. PATENT DOCUMENTS 6,597,374 B1 * 7/2003 Baker .................. H03J 1/0025
345/173
6,979,962 B2 12/2005 Cavarec et al.
(Continued)

*Primary Examiner* — David Purol

(57) ABSTRACT

An apparatus in accordance with the invention includes a directional switching device configured to provide directional control along multiple axes (e.g., perpendicular axes). Directional control along a first axis enables selection of a current function from a plurality of functions. Similarly, directional control along a second axis increases or decreases an amount associated with the current function. In certain embodiments, an indicator, such as colored light, may indicate the current function of the directional switching device. Selection of a first function from the plurality of functions may enable the directional switching device to wirelessly control a first device, while selection of a second function from the plurality of functions may enable the directional switching device to wirelessly control a second device. A corresponding method is also disclosed herein.

9 Claims, 44 Drawing Sheets

Related U.S. Application Data

14/682,085, filed on Apr. 8, 2015, and a continuation of application No. 14/682,091, filed on Apr. 8, 2015, and a continuation of application No. 14/682,100, filed on Apr. 9, 2015, and a continuation of application No. 14/682,104, filed on Apr. 9, 2015, and a continuation of application No. 14/682,108, filed on Apr. 9, 2015, and a continuation of application No. 14/682,110, filed on Apr. 9, 2015, and a continuation of application No. 14/682,989, filed on Apr. 9, 2015.

(60) Provisional application No. 61/977,008, filed on Apr. 8, 2014, provisional application No. 62/005,140, filed on May 30, 2014, provisional application No. 62/051,048, filed on Sep. 16, 2014, provisional application No. 61/977,008, filed on Apr. 8, 2014, provisional application No. 61/977,008, filed on Apr. 8, 2014, provisional application No. 61/977,008, filed on Apr. 8, 2014.

(51) Int. Cl.

| | |
|---|---|
| *H02P 29/02* | (2016.01) |
| *G01R 19/00* | (2006.01) |
| *F16H 57/021* | (2012.01) |
| *E06B 9/74* | (2006.01) |
| *E06B 9/308* | (2006.01) |
| *E06B 9/32* | (2006.01) |
| *E06B 9/322* | (2006.01) |
| *E06B 9/326* | (2006.01) |
| *E06B 9/38* | (2006.01) |
| *G05B 19/042* | (2006.01) |
| *E06B 9/68* | (2006.01) |
| *E06B 9/28* | (2006.01) |

(52) U.S. Cl.
CPC .. *G05B 2219/2642* (2013.01); *G08C 2201/30* (2013.01); *G08C 2201/92* (2013.01); *G08C 2201/93* (2013.01); *Y10T 74/2186* (2015.01)

(56) References Cited

U.S. PATENT DOCUMENTS

| | | |
|---|---|---|
| 7,406,995 B2 | 8/2008 | Huang |
| 7,417,397 B2 | 8/2008 | Berman et al. |
| 7,466,090 B2 | 12/2008 | Meewis et al. |
| 7,639,907 B2 * | 12/2009 | Elberbaum ............ G08C 17/02 385/15 |
| 7,673,665 B2 | 3/2010 | Rossato |
| 7,743,012 B2 * | 6/2010 | Chambers ........... G06F 3/04886 707/770 |
| 7,941,245 B1 | 5/2011 | Popat |
| 8,091,604 B2 | 1/2012 | Kluck |
| 8,106,768 B2 | 1/2012 | Neumann |
| 8,190,275 B2 | 5/2012 | Chang |
| 8,307,878 B2 | 11/2012 | Faller et al. |
| 8,508,169 B2 | 8/2013 | Zaharchuk et al. |
| 8,528,621 B2 | 9/2013 | Murphy et al. |
| 8,581,163 B2 | 11/2013 | Grehant et al. |
| 8,723,454 B2 | 5/2014 | Skinner et al. |
| 8,723,466 B2 | 5/2014 | Chambers et al. |
| 8,866,343 B2 | 10/2014 | Abraham et al. |
| 2009/0224955 A1 * | 9/2009 | Bates ..................... G08C 17/02 341/175 |
| 2011/0298581 A1 * | 12/2011 | Hsu .................. H04N 21/42225 340/4.3 |
| 2012/0095605 A1 * | 4/2012 | Tran ........................ B05D 5/00 700/285 |
| 2012/0144299 A1 * | 6/2012 | Patel .................... G06F 3/0488 715/702 |

* cited by examiner

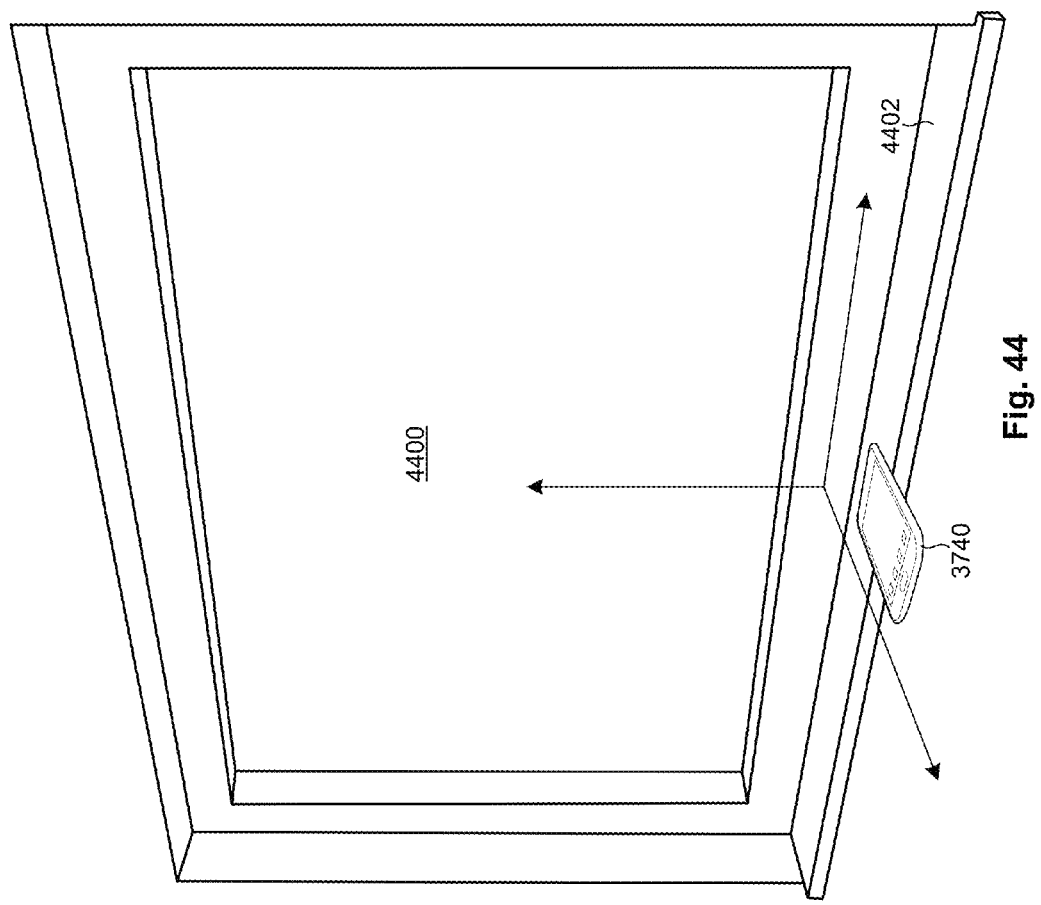

UNIVERSAL MULTI-FUNCTION WALL SWITCH

RELATED APPLICATIONS

This application claims priority to U.S. Provisional Patent No. 61/977,008 filed on Apr. 8, 2014 and entitled "Intelligent Window Coverings"; U.S. Provisional Patent No. 62/005,140 filed on May 30, 2014 and entitled "Universal Motorized Blind Tilt Mechanism"; and U.S. Provisional Patent No. 62/051,048 filed on Sep. 16, 2014 and entitled "Cable Pull Switch with Power and Data Pass-Through Capability." This application is also a continuation of U.S. patent application Ser. No. 14/682,077 filed on Apr. 8, 2015 entitled "Motorized Gearbox Assembly with Through-Channel Design;" U.S. patent application Ser. No. 14/682,085 filed on Apr. 8, 2015 entitled "Headrail Bracket for Installing a Motorized Gearbox Assembly in a Window Covering;" U.S. patent application Ser. No. 14/682,091 filed on Apr. 8, 2015 entitled "Pull Cord for Controlling a Window Covering;" U.S. patent application Ser. No. 14/682,100 filed on Apr. 9, 2015 entitled "Video Display Adapter for Controlling a Window Covering;" U.S. patent application Ser. No. 14/682,104 filed on Apr. 9, 2015 entitled "Pull Cord with Integrated Charging Port;" U.S. patent application Ser. No. 14/682,108 filed on Apr. 9, 2015 entitled "Intelligent Window covering Incorporating Security Features; U.S. patent application Ser. No. 14/682,110 filed on Apr. 9, 2015 entitled "Intelligent Window Covering Incorporating Climate Control Features;" and U.S. patent application Ser. No. 14/682,989 filed on Apr. 9, 2015 entitled "Smart Device Position and Orientation Synchronization Function."

BACKGROUND

Field of the Invention

This invention relates to apparatus and methods for automating window blinds and other windows coverings.

Background of the Invention

Home automation, also known as home monitoring, home control, smart home, connected home, or the like, is becoming more and more prevalent. This increase is due in large part to modern-day advances in software and electronics, coalescence around a number of home automation protocols, and larger numbers of manufacturers willing to build smart devices using these protocols. Home automation may be as simple as automating a few devices in a relatively small home or space, or as complicated as automating an entire residence or building comprising hundreds or even thousands of smart devices. The number and type of smart devices that are available has dramatically increased as more and more manufacturers, including various major technology players, are getting involved in this space. Some of the most popular home automation devices currently utilized include lights, window coverings, thermostats, audio and video systems, door locks, security systems, and the like.

Nevertheless, outfitting a home with smart devices can be a difficult decision for a home or business owner. Many times, the home or business owner already owns a large number of conventional non-smart devices. Replacing these devices can be expensive and/or wasteful. For example, a home or business owner may have already made a substantial investment in manually-operated window coverings such as window blinds. Replacing the window blinds with automated versions of the same can be prohibitively expensive in addition to requiring significant amounts of labor. Retrofitting the window blinds can also be problematic in that multiple different designs and sizes of window blinds may exist, and retrofit solutions may be limited in terms of the designs and sizes they can work with. Retrofitting the window blinds may also require significant modifications to the window blinds to make the retrofit solution function properly. In certain cases, retrofitting window blinds may require removing the window blinds and cutting or otherwise modifying various components thereof.

Many offerings in terms of automated window blinds or window coverings may also fail to capitalize on their special placement within a home or building, namely on or near windows or other openings. The proximity of window blinds to windows and other openings make it possible for smart window blinds to provide a wide variety of features and functions not normally associated with window blinds.

In view of the foregoing, what are needed are apparatus and methods to automate window coverings such as window blinds. Ideally, such apparatus and methods will enable different types and sizes of existing window blinds to be automated. Such apparatus and methods will also ideally enable retrofitting window blinds while minimizing modifications thereto. Yet further needed are apparatus and methods that take advantage of the special placement of window blinds within a home or building. Specifically, apparatus and methods are needed to enable window blinds to provide features and functions not normally associated with window blinds, but capitalize on their placement near windows, entryways, or other openings.

SUMMARY

The invention has been developed in response to the present state of the art and, in particular, in response to the problems and needs in the art that have not yet been fully solved by currently available apparatus and methods. Accordingly, apparatus and methods in accordance with the invention have been developed to automate window blinds and other windows coverings. The features and advantages of the invention will become more fully apparent from the following description and appended claims, or may be learned by practice of the invention as set forth hereinafter.

In a first embodiment of the invention, an apparatus in accordance with the invention includes a motor and a gearbox coupled to the motor and configured to apply torque to a tilt rod of a window blind. The gearbox is configured to enable the tilt rod to pass completely through the gearbox. In certain embodiments, the gearbox includes a shaft configured to apply torque to the tilt rod. This shaft may extend from a first end of the gearbox to a second end of the gearbox and may include a through-channel to enable the tilt rod to pass completely therethrough. A corresponding method is also disclosed herein.

In a second embodiment of the invention, an apparatus in accordance with the invention includes a headrail bracket configured to be inserted into a headrail at an angle from a top thereof. The headrail bracket includes clips to engage a top edge of the headrail, and an attachment mechanism to attach to a gearbox assembly configured to rotate a tilt rod of a window blind tilting mechanism. In certain embodiments, the headrail bracket is a single component with a substantially low profile. This headrail bracket may span a top of the headrail. In other embodiments, the headrail bracket includes a first component to secure a first end of the gearbox assembly to the headrail and a second component to secure a second end of the gearbox assembly to the headrail. In certain embodiments, the first component slides over the first end of the gearbox assembly and the second component slides over the second end of the gearbox assembly. A corresponding method is also disclosed herein.

In a third embodiment of the invention, an apparatus in accordance with the invention includes a window covering actuation mechanism and a gearbox assembly configured to electromechanically operate the window covering actuation mechanism. A pull cord is configured to receive "cord gestures" from a user. These "cord gestures" may include one or more of pull sequences, pull durations, numbers of pulls, durations between pulls, and strength of pulls. In certain embodiments, "cord gestures" may also be defined by pull direction. A controller receives the cord gestures and translates the cord gestures into commands for controlling the gearbox assembly. A corresponding method is also disclosed herein.

In a fourth embodiment of the invention, a system in accordance with the invention includes a video display adapter, such as a USB or HDMI dongle, configured to generate a signal when a video display (e.g., a television, projector, etc.) is turned on or off. A controller receives the signal and automatically actuates a motorized window covering in response to the signal. In certain embodiments, the motorized window covering receives the signal directly from the video display adapter without requiring any intervening electronic devices. A corresponding method is also disclosed herein.

In a fifth embodiment of the invention, an apparatus in accordance with the invention includes a gearbox assembly configured to electromechanically operate a window covering actuation mechanism. A pull cord is provided to at least one of power the gearbox assembly and charge a battery to power the gearbox assembly. In certain embodiments, manual operation of the pull cord is used to control the gearbox assembly. An electrical conductor and associated electrical connector may be incorporated into the pull cord. A corresponding method is also disclosed herein.

In a sixth embodiment of the invention, an apparatus in accordance with the invention includes a gearbox assembly configured to electromechanically operate a window covering. A controller, incorporated into the window covering, is provided to control the gearbox assembly. A security device, such as a camera, motion sensor, audio sensor, proximity sensor, impact sensor, or the like, communicates with the controller and is configured to monitor security at a window associated with the window covering. Such a security sensor may, for example, monitor opening and/or closing of the window, breaking of the window, or the like. In certain embodiments, operation of the window covering is triggered in response to conditions sensed by the security device. A corresponding method is also disclosed herein.

In a seventh embodiment of the invention, an apparatus in accordance with the invention includes a gearbox assembly configured to electromechanically operate a window covering. A controller, incorporated into the window covering, is provided to control the gearbox assembly. A temperature sensor communicates with the controller and monitors temperature proximate a window associated with the window covering. The temperature sensor may monitor the temperature of the window, temperature external to the window, temperature internal to the window, temperature within a headrail of the window covering, or the like. The controller is further configured to relay at least one of commands and information to an HVAC controller to regulate room temperature in accordance with the monitored temperature. A corresponding method is also disclosed herein.

In an eighth embodiment of the invention, a method in accordance with the invention includes prompting a user to align a mobile device with a geometric feature (e.g., a window sill, corner, etc.) of a window. The method further determines a position and orientation of the window using sensors of the mobile device. Based on the position and orientation of the window, the method determines a position of the sun over time relative to the window. The method automatically adjusts a window covering of the window to take into account the position of the sun over time. For example, the method may automatically tilt slats of a window blind or open or close a window covering to take into account the position of the sun over time. A corresponding system is also disclosed herein.

In a ninth embodiment of the invention, an apparatus in accordance with the invention includes a directional switching device configured to provide directional control along multiple axes (e.g., perpendicular axes). Directional control along a first axis enables selection of a current function from a plurality of functions. Similarly, directional control along a second axis increases or decreases an amount associated with the current function. In certain embodiments, an indicator, such as colored light, may indicate the current function of the directional switching device. Selection of a first function from the plurality of functions may enable the directional switching device to wirelessly control a first device, while selection of a second function from the plurality of functions may enable the directional switching device to wirelessly control a second device. A corresponding method is also disclosed herein.

In a tenth embodiment of the invention, an apparatus in accordance with the invention includes a motor and a gearbox coupled to the motor and configured to actuate a window covering. The gearbox includes an internal wall enclosing gears of the gearbox, and an external wall enclosing the internal wall and creating a cavity between the internal wall and the external wall. The external wall is configured to support an output shaft extending from the internal wall. A corresponding method is also disclosed herein.

In an eleventh embodiment of the invention, an apparatus in accordance with the invention includes a motor and a gearbox coupled to the motor and comprising an output shaft configured to actuate a window covering. A position encoder, directly driven by the output shaft, is configured to measure at least one of an angular position and a number of rotations of the output shaft. The angular position and number of rotations may be used to calculate an angular position of slats of a window blind and/or an amount a window covering is opened or closed. A corresponding method is also disclosed herein.

In a twelfth embodiment of the invention, a method for calibrating an automated window covering includes electromechanically actuating a window covering and measuring electrical current required to actuate the window covering. The method further measures movement of the window covering, where such movement includes one or more of a change in position and velocity of the window covering. The method estimates a size (e.g., height, width, area, etc.) of the window covering and/or an amount of force required to actuate the window covering based on the measured electrical current and movement. A corresponding apparatus is also disclosed herein.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which:

FIG. 44 shows a technique or application for utilizing sensors of a mobile device to determine a position and orientation of a window.

DETAILED DESCRIPTION

It will be readily understood that the components of the present invention, as generally described and illustrated in the Figures herein, may be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

Figure 1:
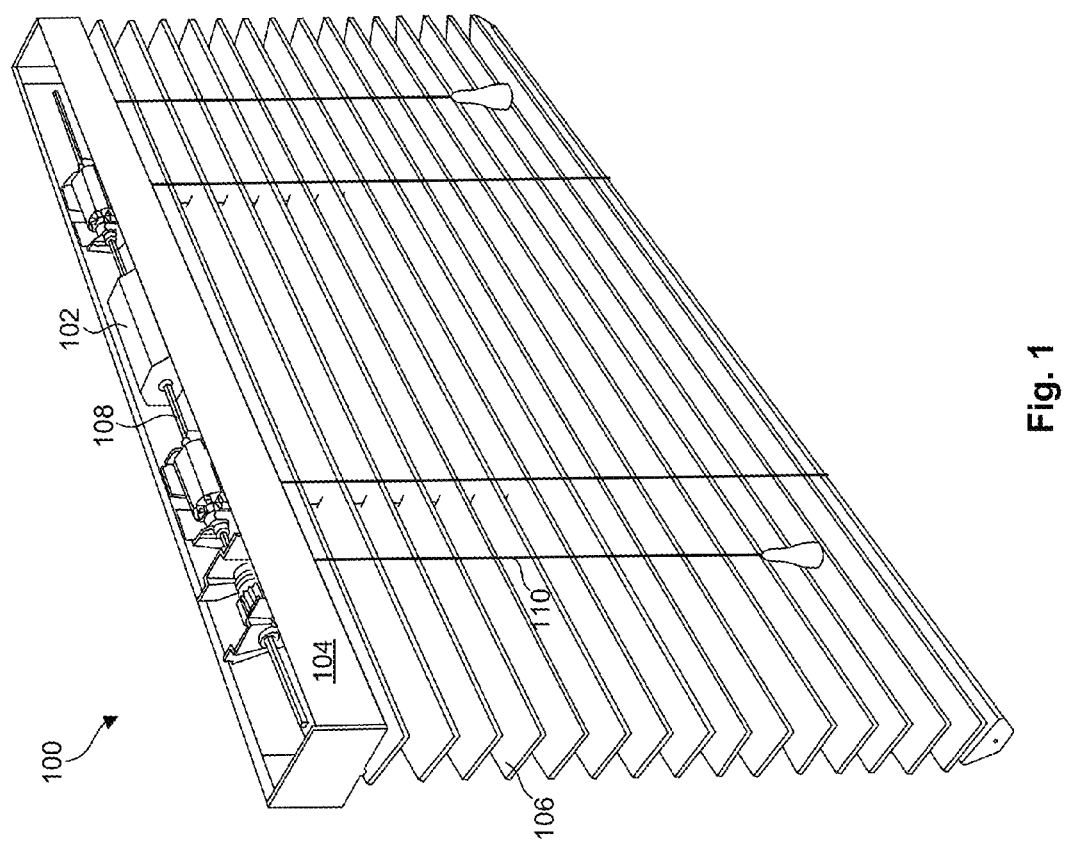
FIG. 1 is a perspective view showing one embodiment of a window blind retrofitted with a motorized gearbox assembly in accordance with the invention.

Referring to FIG. 1, one example of a window covering 100, in this example a conventional window blind 100, is illustrated. As shown, the window blind 100 includes a headrail 104, containing various components, and slats 106. In the illustrated embodiment, the window blind 100 is retrofitted with a motorized gearbox assembly 102 configured to automatically tilt the slats 106 of the window blind 100.

In order to retrofit the window blind 100 with a motorized gearbox assembly 102 in accordance with the invention, various components of the window blind 100 may be removed or replaced. For example, the manual tilt mechanism may be removed since it may interfere with operation of the motorized gearbox assembly 102. Similarly, a tilt wand or other tilt controls used in association with the manual tilt mechanism may be removed. The tilt wand or other tilt controls may, in certain embodiments, be replaced with a specialized pull cord and switching mechanism, the likes of which will be discussed in association with FIGS. 24 through 26. The specialized pull cord may, in certain embodiments, be used to control the motorized gearbox assembly 102 using various "cord gestures." The pull cord may also be configured to charge an internal battery and/or send data or commands to the motorized gearbox assembly 102 through an electrical conductor and connector integrated therein.

In certain embodiments, the motorized gearbox assembly 102 may be configured to work alongside a manual tilt mechanism, thereby allowing the slats 106 to be tilted manually with a tilt cord, tilt wand, or the like, as well as automatically with the motorized gearbox assembly 102. This may involve replacing or modifying a conventional manual tilt mechanism with a manual tilt mechanism that is compatible with the motorized gearbox assembly 102. In other embodiments, the manual tilt mechanism and any associated tilt wand or cord may be removed completely such that the motorized gearbox assembly 102 has complete control over the slat tilting feature of the window blind 100.

As further shown in FIG. 1, the motorized gearbox assembly 102 may be configured to engage and rotate a tilt rod 108 of the window blind 100 in order to tilt the slats 106. As shown, the motorized gearbox assembly 102 is positioned at an intermediate point along the tilt rod 108. To facilitate this, the motorized gearbox assembly 102 may be designed to enable the tilt rod 108 to pass completely through the motorized gearbox assembly 102. This feature is advantageous in that it enables the motorized gearbox assembly 102 to be placed at any point along the tilt rod 108, so long as it doesn't interfere or coincide with support brackets or other window blind components. This feature may also reduce or eliminate the need to cut or modify the tilt rod 108 to accommodate the motorized gearbox assembly 102 within the headrail 104. Installing the motorized gearbox assembly 102 may be accomplished by removing the tilt rod 108, placing the motorized gearbox assembly 102 at a desired location within the headrail 104, and reinserting the tilt rod 108 such that it passes entirely or partially through the motorized gearbox assembly 102.

Figure 2:
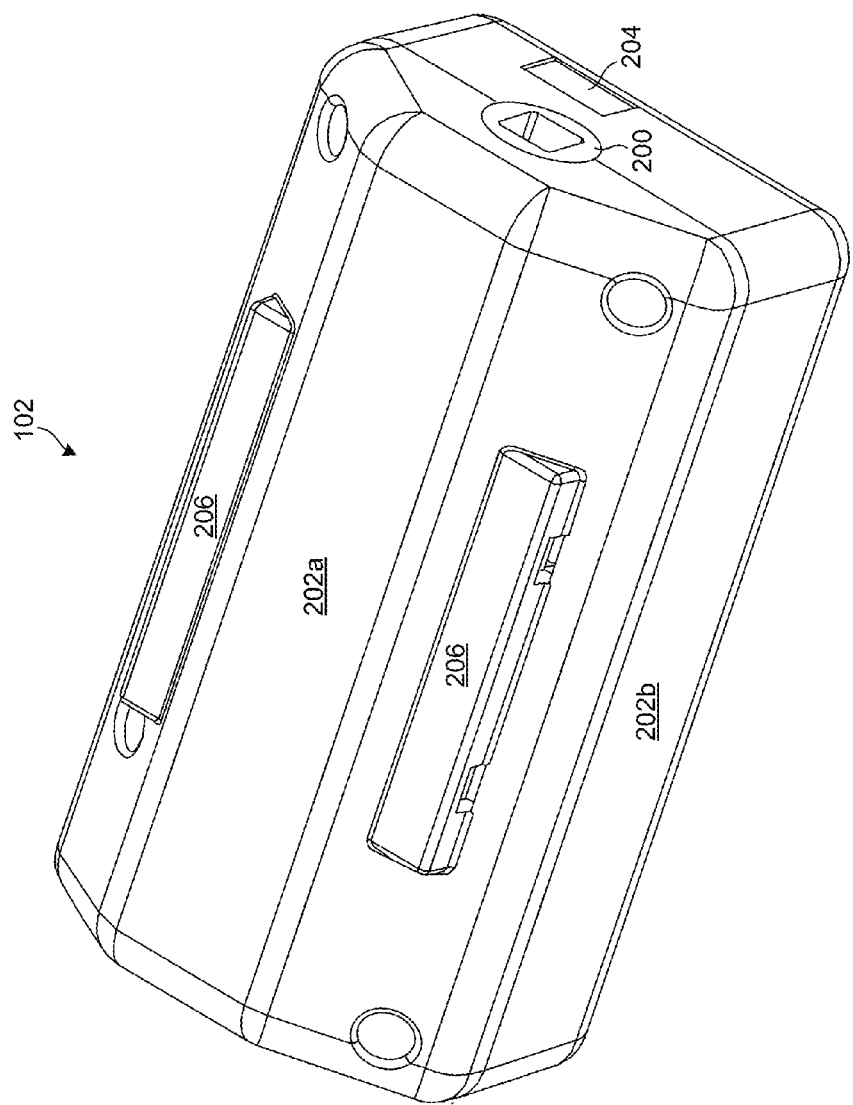
FIG. 2 is a perspective view showing one embodiment of a motorized gearbox assembly in accordance with the invention.

Referring to FIG. 2, a perspective view showing one embodiment of a motorized gearbox assembly 102 in accordance with the invention is illustrated. As shown, the motorized gearbox assembly 102 has a substantially rectangular footprint to enable it to fit within a headrail 104 of a window blind 100. An output shaft 200 of the motorized gearbox assembly 102 engages and applies torque to a tilt rod 108. An output port 204 allows the motorized gearbox assembly 102 to connect to a battery and other external equipment or sensors. In the illustrated embodiment, the motorized gearbox assembly 102 includes a two piece housing 202a, 202b, namely a lower housing component 202b and an upper housing component 202a, that enclose various internal components. In the illustrated embodiment, the upper housing component 202a incorporates a pair of mounting fixtures 206 to engage a headrail bracket, the likes of which will be discussed in association with FIG. 3.

Figure 3:
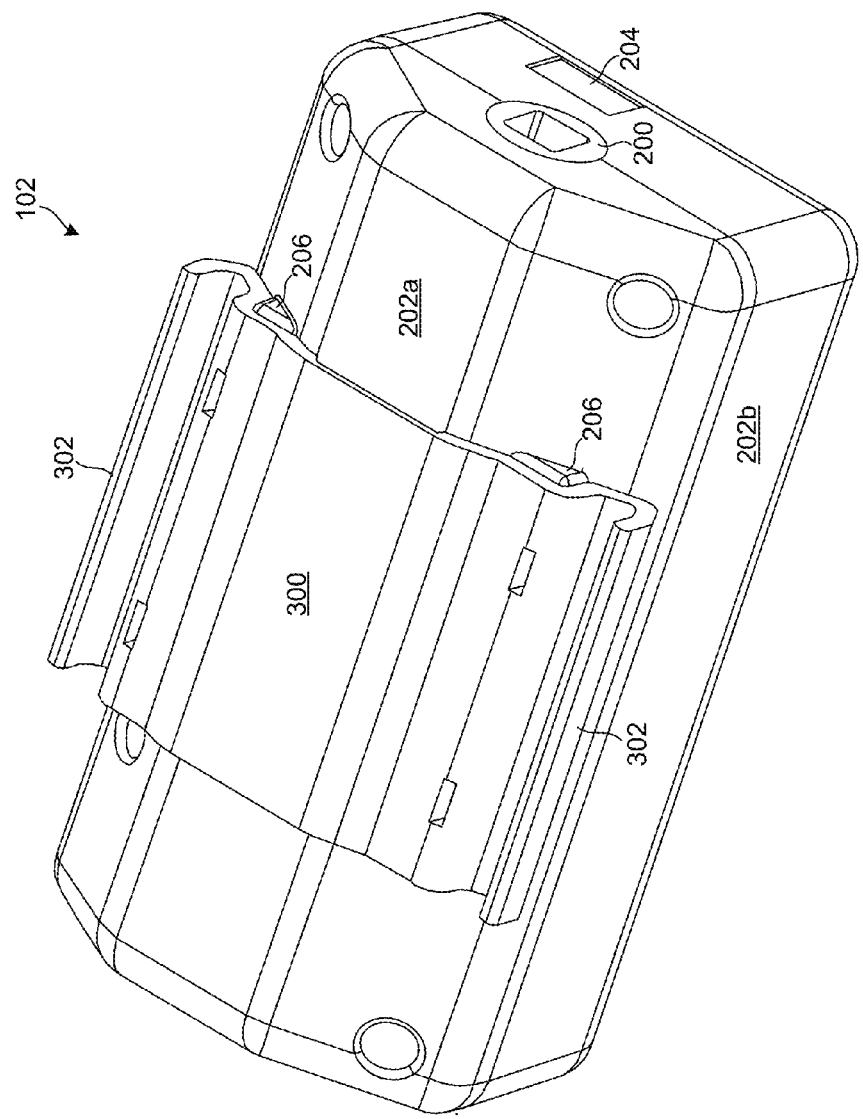
FIG. 3 is a perspective view showing one embodiment of a headrail bracket for use with a motorized gearbox assembly in accordance with the invention.

Referring to FIG. 3, one embodiment of a headrail bracket 300 for use with a motorized gearbox assembly 102 in accordance with the invention is illustrated. The headrail bracket 300 attaches to the mounting fixtures 206 previously discussed. The headrail bracket 300 is configured to be inserted into the headrail 104 at an angle (compared to its eventual orientation) from a top of the headrail 104. The low profile of the headrail bracket 300 allows the headrail bracket 300 to be angled and inserted in this manner. Once within the headrail 104, the headrail bracket 300 may be repositioned to span the top of the headrail 104. A pair of flanges 302 on the headrail bracket 300 may engage (e.g., snap into) corresponding lips or grooves on each side of the headrail 104. The headrail bracket 300 substantially stablilizes the motorized gearbox assembly 102 within the headrail 104 and keeps the motorized gearbox assembly 102 from rotating or moving when applying torque to the tilt rod 108.

One advantage of the headrail bracket 300 illustrated in FIG. 3 is that it maintains the motorized gearbox assembly 102 at a substantially consistent position relative to a top of the headrail 104. The instant inventors have found that although different depths and dimensions of headrails 104 may be used with different window blinds 100, the tilt rod 108 may nevertheless be positioned substantially consistently relative to a top of the headrail 104. The headrail bracket 300, because it is mounted to a top of the headrail 104, may ensure that the motorized gearbox assembly 102 is attached to the headrail 104 in a way that it consistently aligns with the tilt rod 108.

Figure 4:
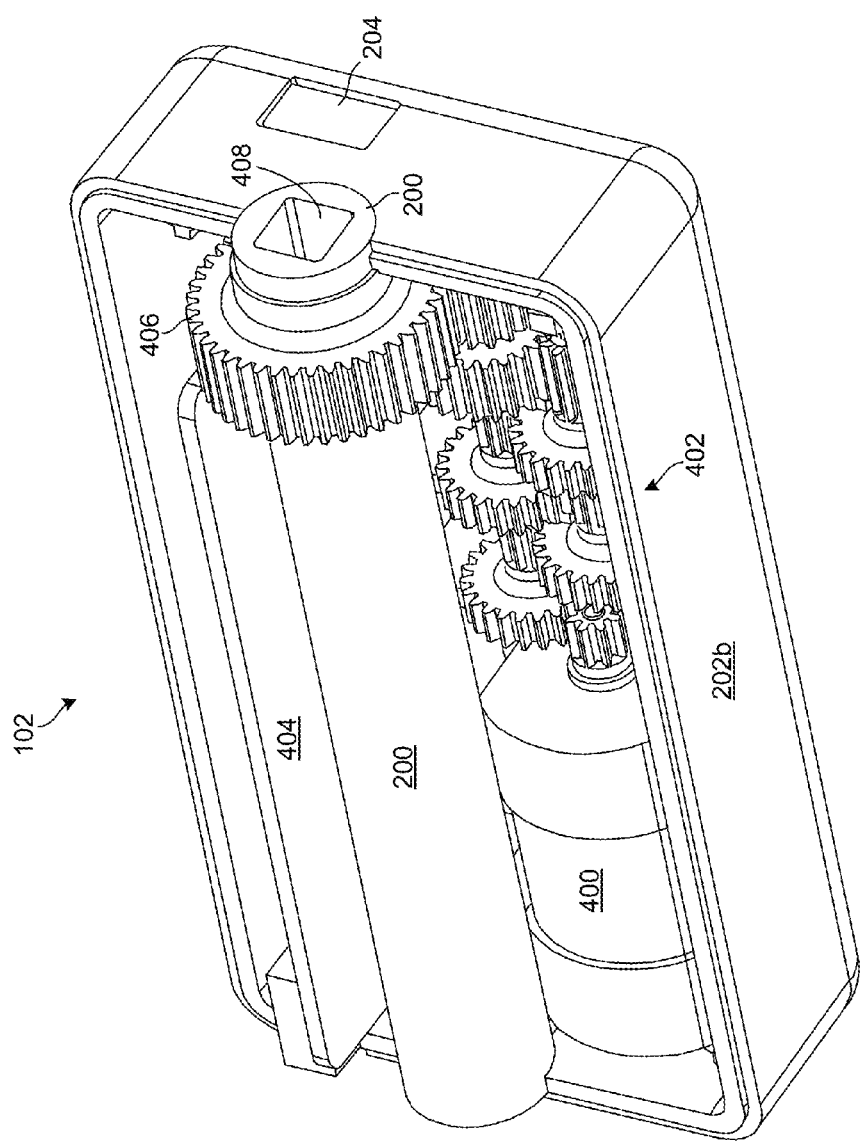
FIG. 4 is a perspective view showing various internal components, including an output shaft having a through-channel, of a motorized gearbox assembly in accordance with the invention.

Referring to FIG. 4, various internal components within the motorized gearbox assembly 102 are illustrated. As shown, the motorized gearbox assembly 102 includes a motor 400 and a power transmission system 402 having one or more stages of gears to reduce the gear ratio of the motor 400. In certain embodiments, the gear ratio may be between 100:1 and 1000:1. The instant inventors have found that a gear ratio of 720:1 (i.e., seven hundred and twenty turns of the motor 400 produces a single turn of the output shaft 200) works well in the present application. As shown, the power transmission system 402 drives a main gear 406 coupled to the output shaft 200. The output shaft 200 may, in turn, be used to drive the tilt rod 108.

As shown, the output shaft 200 extends the length of the motorized gearbox assembly 102. The output shaft 200 includes a through-channel 408, extending the length of the output shaft 200, to enable the tilt rod 108 to pass therethrough. This through-channel 408 (along with any required adapter inserts) may be keyed to enable the output shaft 200 to interlock with and apply torque to the tilt rod 108. The output shaft 200 may ride on bearing surfaces at each end of the motorized gearbox assembly 102.

Figure 5:
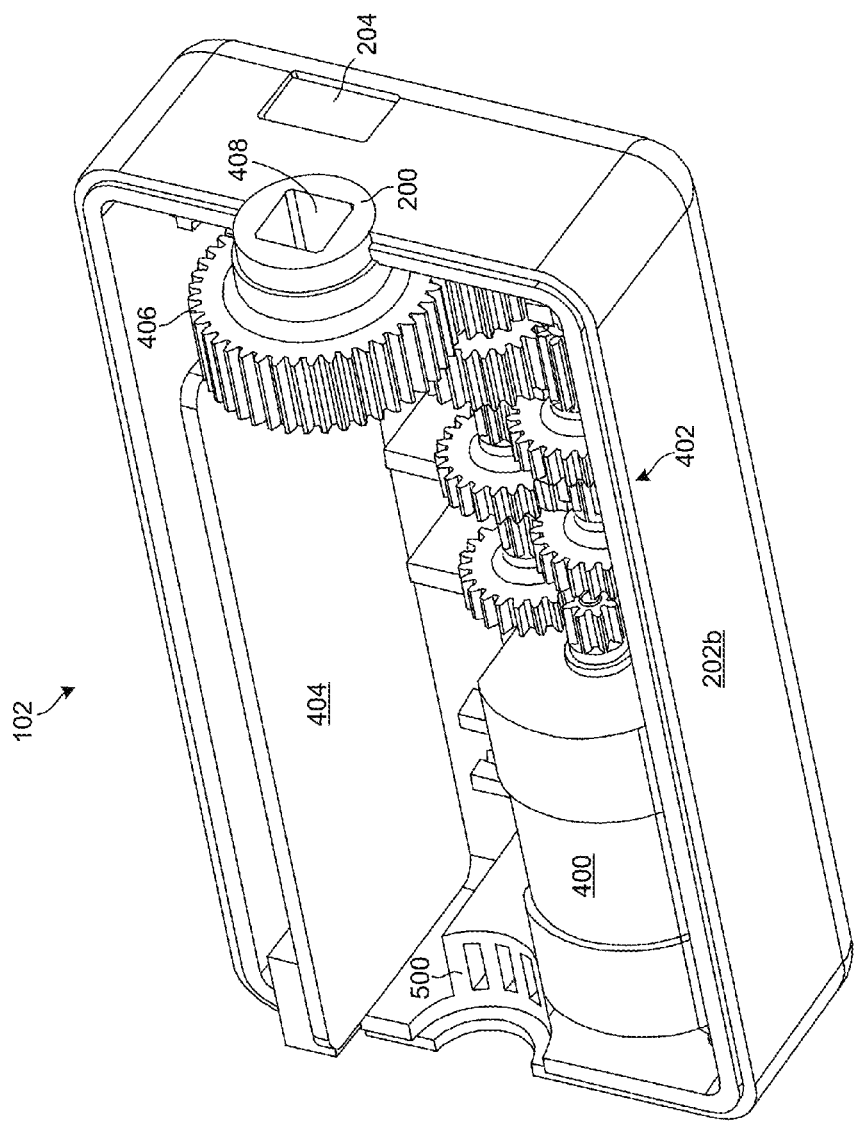
FIG. 5 is a perspective view showing various internal components of a motorized gearbox assembly with its output shaft removed.
Figure 6:
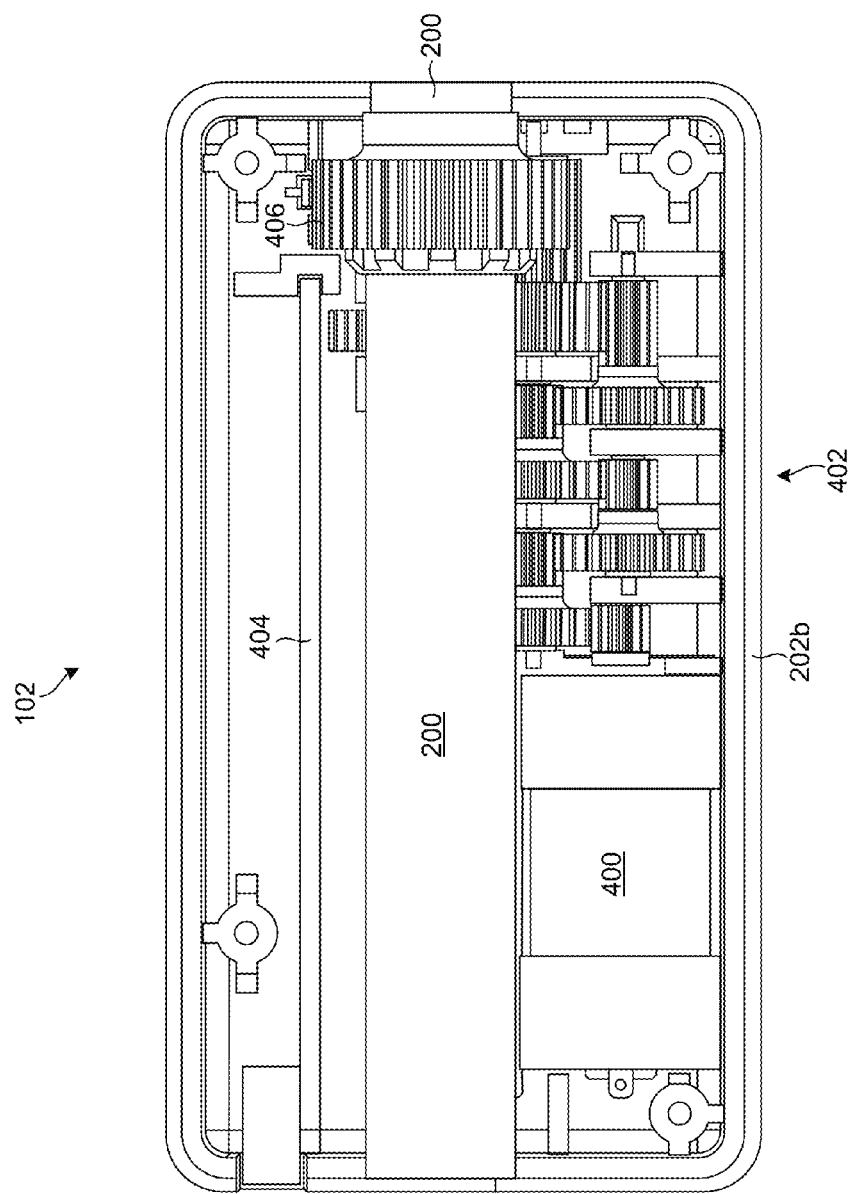
FIG. 6 is a top view showing various internal components of a motorized gearbox assembly in accordance with the invention.
Figure 7:
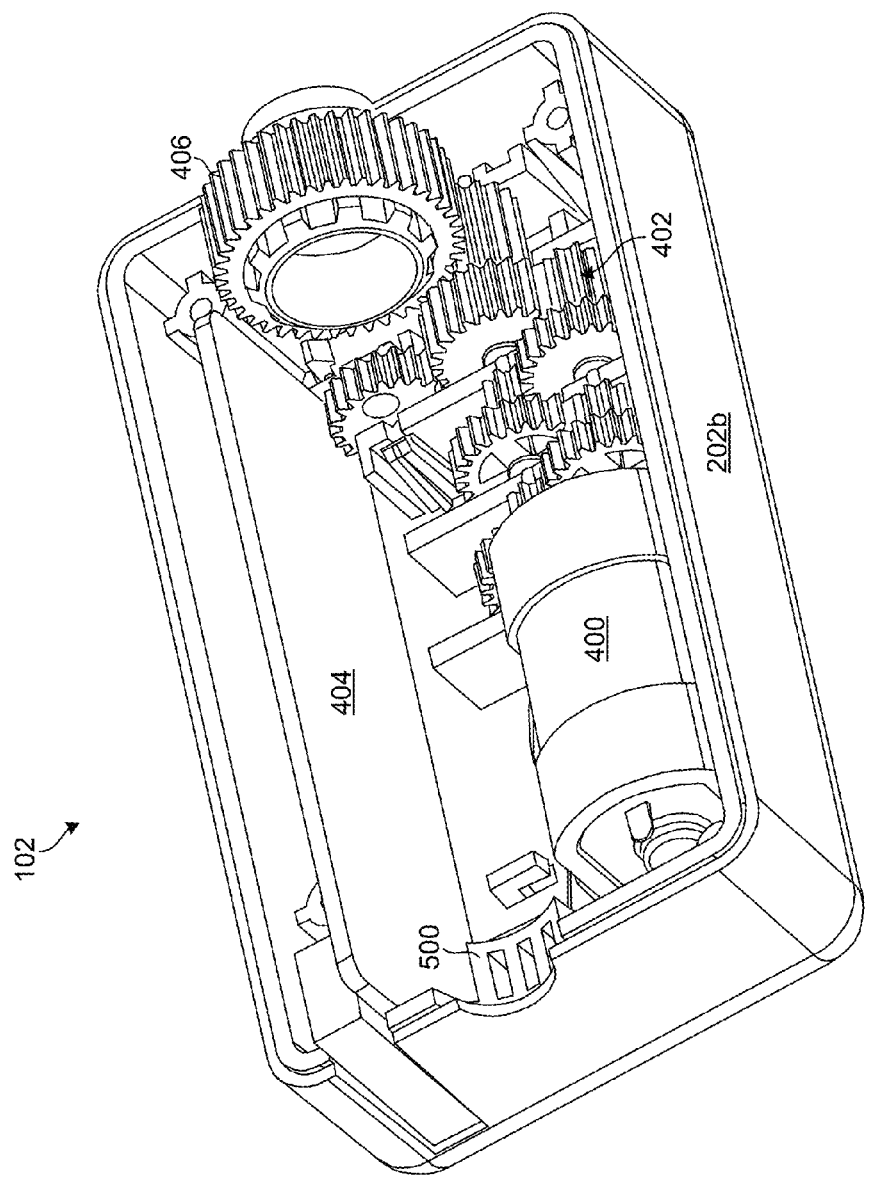
FIG. 7 is another perspective view of internal components of a motorized gearbox assembly with its output shaft removed.

As shown, the motorized gearbox assembly 102 includes a circuit board 404. Electronics (e.g., processor, memory, communication modules, etc.) to control the motor 400 and/or gather data associated with the motorized gearbox assembly 102 may reside on the circuit board 404. Such electronics, as well as code executing on such electronics, will be discussed in greater detail in association with FIGS. 37 through 39. FIG. 5 shows the motorized gearbox assembly 102 of FIG. 4 with most of the output shaft 200 removed. As shown, the lower housing component 202*b* includes a bearing surface 500 to support the output shaft 200. FIG. 6 shows a top view of the motorized gearbox assembly 102 of FIG. 4. As shown in FIG. 6, the output shaft 200 is offset somewhat relative to a centerline of the motorized gearbox assembly 102. This provides additional space for the motor 400 and power transmission system 402 on one side of the output shaft 200. This may also more accurately align the motorized gearbox assembly 102 with off-center tilt rods 108 of many conventional window blinds 100. FIG. 7 shows the same internal components of the motorized gearbox assembly 102 as FIG. 5 from a different perspective, particularly showing additional detail of the power transmission system 402.

Figure 8:
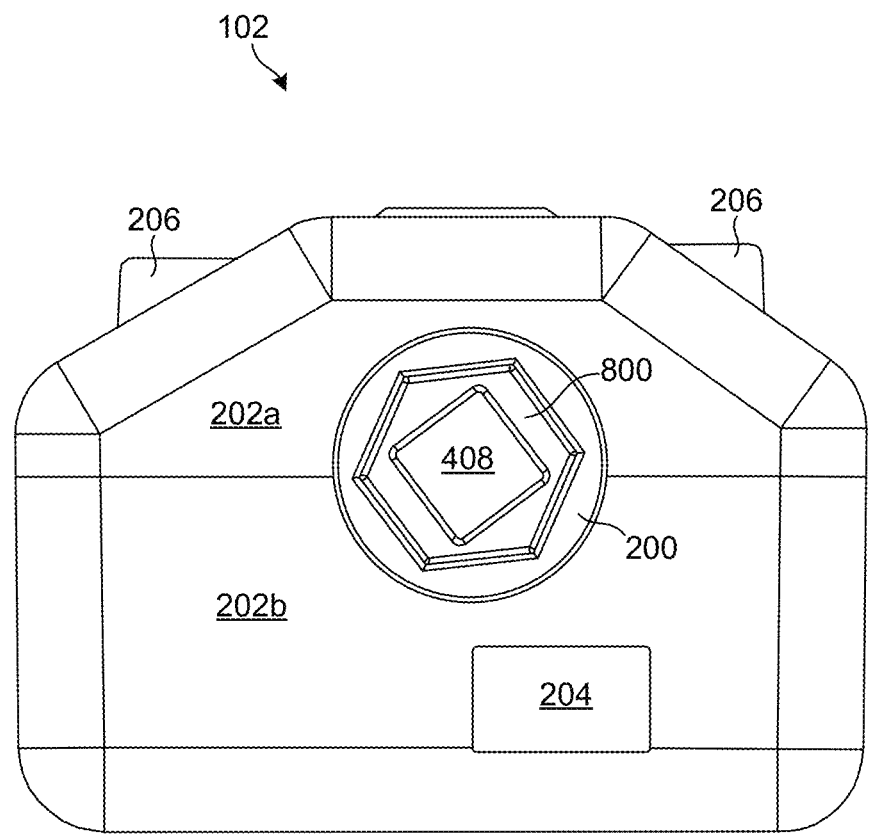
FIG. 8 is an end view of a motorized gearbox assembly in accordance with the invention, particularly showing an output shaft with an adapter insert to interlock with and apply torque to a tilt rod.
Figure 9:
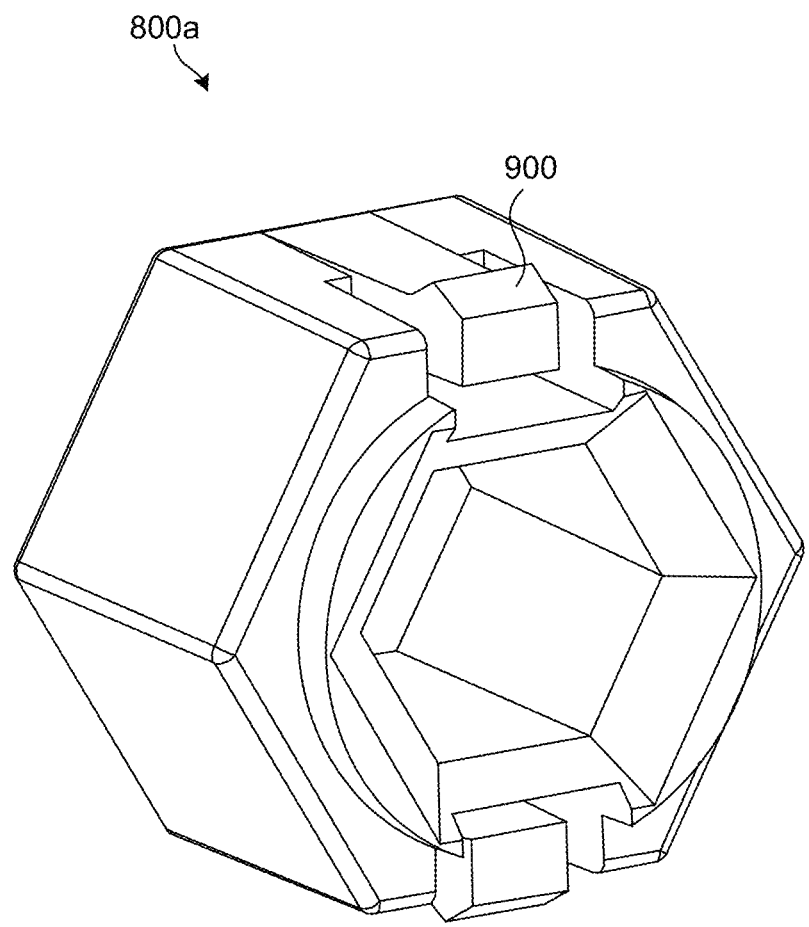
FIG. 9 is a perspective view of one embodiment of an adapter insert to interlock with a first type of tilt rod.
Figure 10:
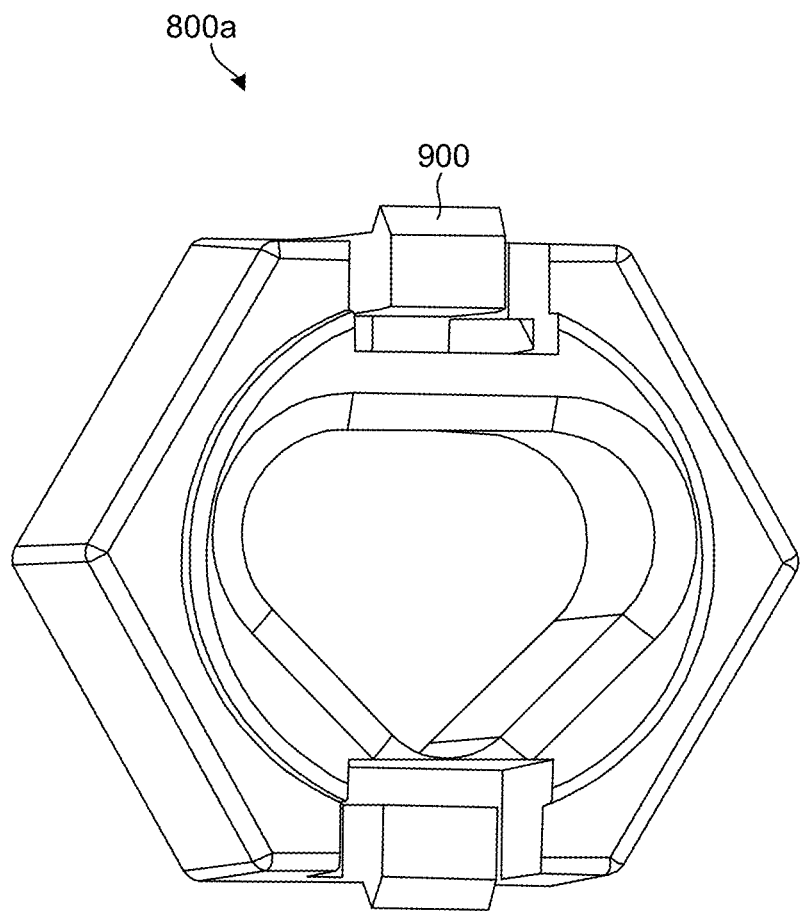
FIG. 10 is a perspective view of another embodiment of an adapter insert to interlock with a second type of tilt rod.

Referring to FIG. 8, an end of the motorized gearbox assembly 102 is illustrated. In certain embodiments, the motorized gearbox assembly 102 is configured to operate with different types of tilt rods 108, which may have different diameters and cross-sectional shapes. To accommodate varying tilt rods 108, different adapter inserts 800 may be used with the motorized gearbox assembly 102. These adapter inserts may have an external shape that interlocks with an internal shape of the output shaft 200, and an internal shape that interlocks with an external shape of a specific tilt rod 108. In certain embodiments, the internal shape of the output shaft 200 is configured to interlock with a larger diameter tilt rod 108 and the adapter inserts 800 are used to reduce the size of the through-channel 408 and interlock with smaller diameter tilt rods 108 with the same or a different cross-sectional shape. In other embodiments, the internal shape of the output shaft 200 is not designed to interlock with any type of tilt rod 108. Instead, adapter inserts 800 may be used for all types of tilt rods 108. In such embodiments, the internal shape of the output shaft 200 is used primarily to interlock with different adapter inserts 800. FIGS. 9 and 10 show two different types of adapter inserts 800 configured to interlock with two different types of tilt rods 108.

In certain embodiments, the internal shape of the output shaft 200 provides a backing surface that an adapter insert 800 may rest against when inserted into the output shaft 200. This allows the adapter insert 800 to sit substantially flush with the output shaft 200 and ensures that the adapter insert 800 cannot be pushed into the output shaft 200 further than necessary. In certain embodiments, a retention feature (such as a snapping mechanism, etc.) may be provided to retain the adapter insert 800 in the output shaft 200. FIGS. 9 and 10 show different embodiments of adapter inserts 800 having a retention feature 900 configured to engage a corresponding retention feature within the output shaft 200. In these examples, the retention feature 900 is a resilient arm that deflects when the adapter insert 800 is inserted into an output shaft 200 or removed from the output shaft 200. This resilient arm may engage a groove or depression in the output shaft 200 to keep the adapter insert 800 retained therein.

Figure 11:
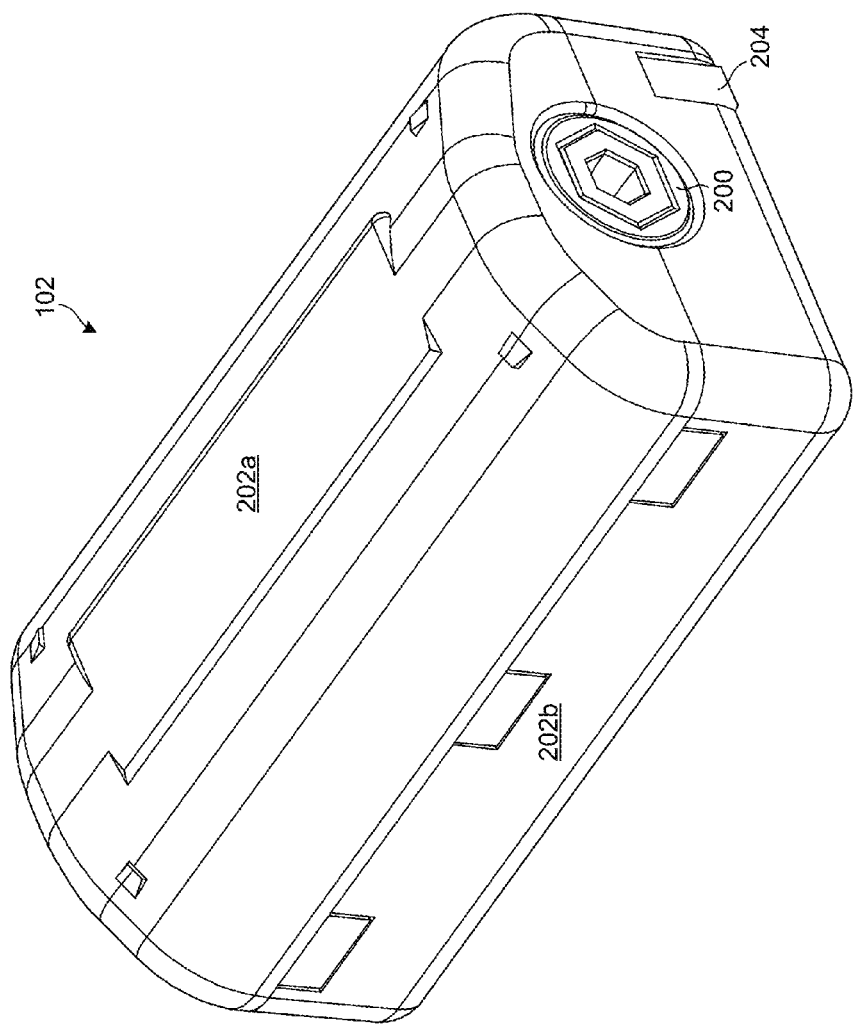
FIG. 11 is a perspective view of one embodiment of a motorized gearbox assembly comprising an internal and external wall to reduce gearbox noise.

Referring to FIG. 11, another embodiment of a motorized gearbox assembly 102 in accordance with the invention is illustrated. This embodiment uses a multi-wall design to reduce noise produced by the motorized gearbox assembly 102, as well as increase the gearbox's rigidity and provide other benefits. Like the previous embodiments, the motorized gearbox assembly 102 includes both an upper housing component 202*a* and a lower housing component 202*b*. As will be discussed in more detail hereafter, this embodiment uses a different type of headrail bracket 300 to stabilize the motorized gearbox assembly 102 within a headrail 104 of a window blind 100.

Figure 12:
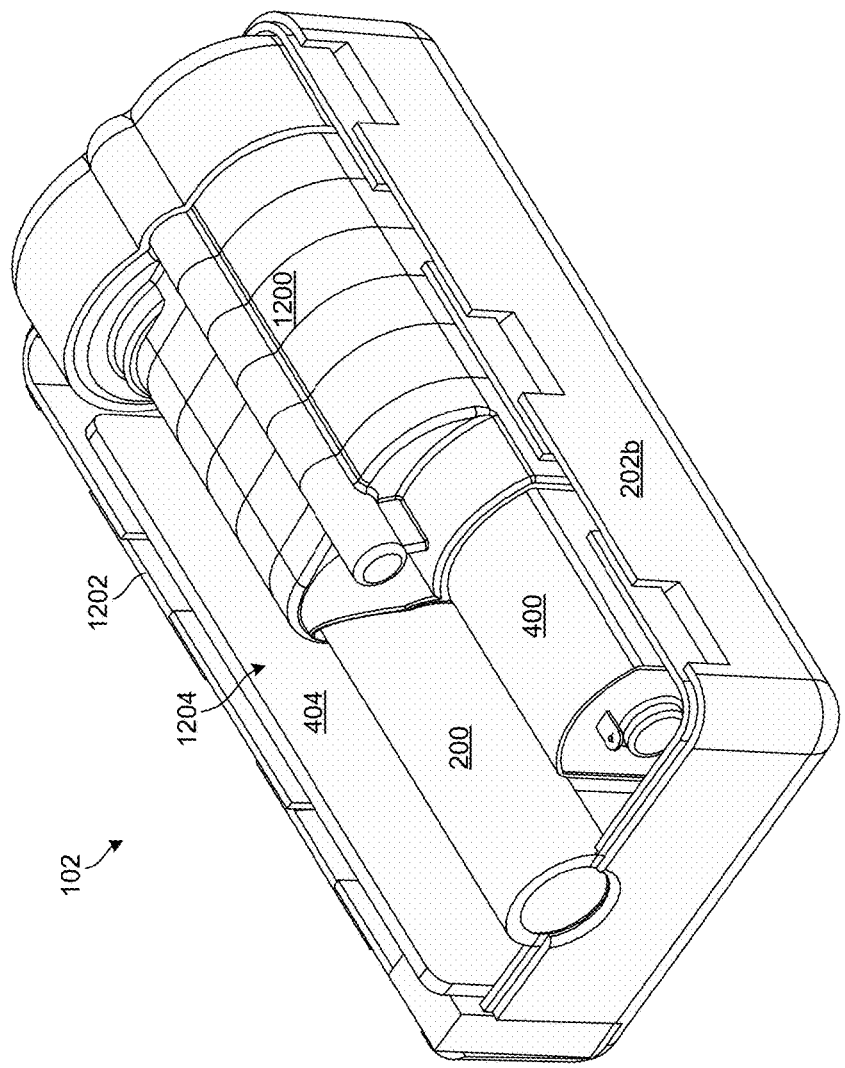
FIG. 12 is a perspective view of various internal components of the motorized gearbox assembly illustrated in FIG. 11.

Referring to FIG. 12, a perspective view of various internal components of the motorized gearbox assembly 102 is illustrated. As shown, the motorized gearbox assembly 102 includes an internal wall 1200, enclosing gears of the gearbox 102, and an external wall 1202 that encloses the internal wall 1200 and creates a cavity 1204 between the internal wall 1200 and the external wall 1202. The cavity 1204 is used to accommodate the circuit board 404 and motor 400 previously described. As further illustrated in FIG. 12, the external wall 1202 is configured to support, by way of a bearing surface, an output shaft 200 extending from the internal wall 1200.

The multi-wall design illustrated in FIG. 12 provides various advantages compared to the single-wall design illustrated in FIGS. 4-7. For example, the multi-wall design reduces noise compared to the single wall design. Specifically, the internal wall 1200 provides an extra layer of sound dampening that reduces noise from the power transmission system 402 (e.g., gear trains) and other internal components. In certain embodiments, the internal wall 1200 is filled with a sound-dampening material, such as a grease, that may also serve to lubricate the power transmission system 402. The internal wall 1200 may isolate the power transmission system 402 (and any grease or other lubricant) from other components, such as the motor 400 or circuit board 404, inside the motorized gearbox assembly 102.

The internal wall 1200 may also reduce noise by increasing rigidity within the motorized gearbox assembly 102. For example, instead of clamping the shaft of each gear between two pieces (which may, when the gears are under load, urge the pieces to separate), the pins for gears within the internal wall 1200 may be inserted through holes in a monolithic component. When the gears are under load, these holes will stabilize the pins on which the gears rotate and prevent undesired play between the gears. This will, in turn, reduce noise produced by the gears when under load. The internal wall 1200 may also reduce noise by creating a smaller resonating chamber for the power transmission system 402. The instant inventors have found that the multi-wall design illustrated in FIG. 12 may reduce noise by approximately four times compared to single-wall designs that clamp the gear pins between two components (e.g., two housing components).

Figure 13:
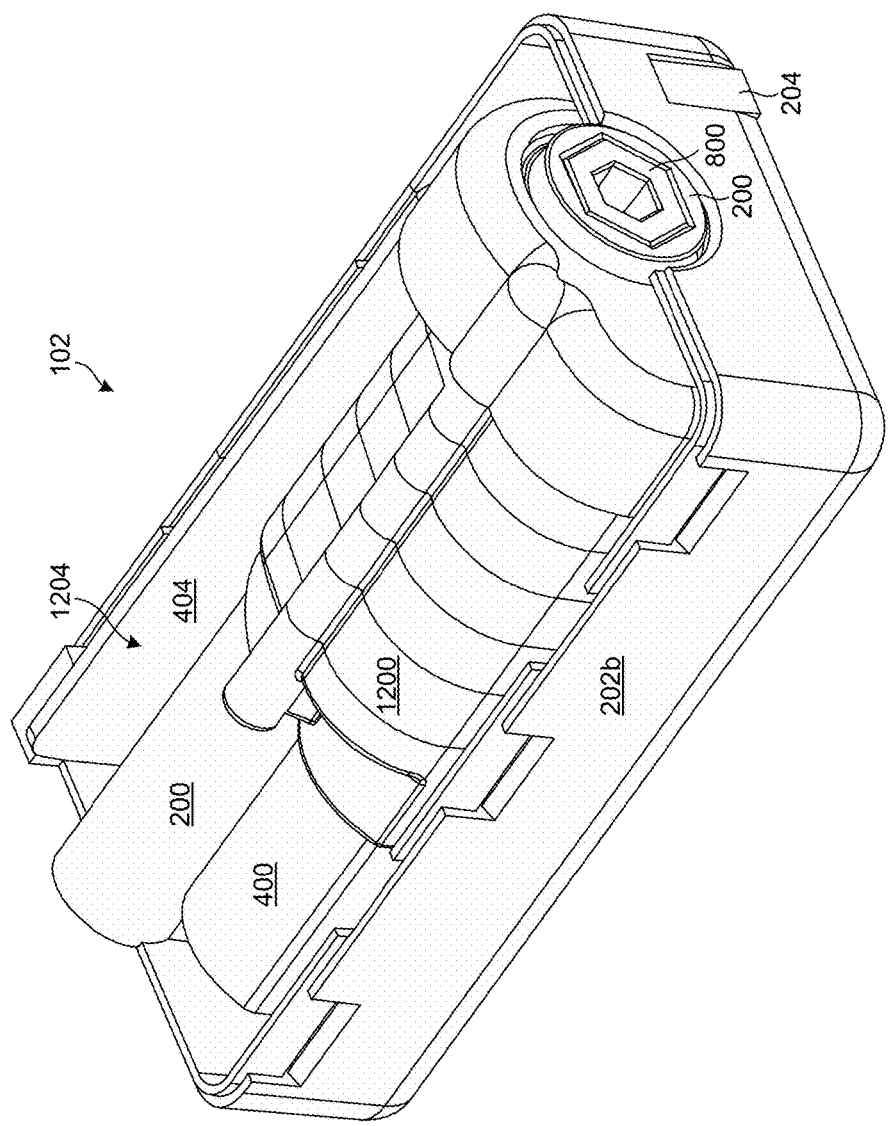
FIG. 13 is another perspective view of internal components of the motorized gearbox assembly illustrated in FIG. 11.
Figure 14:
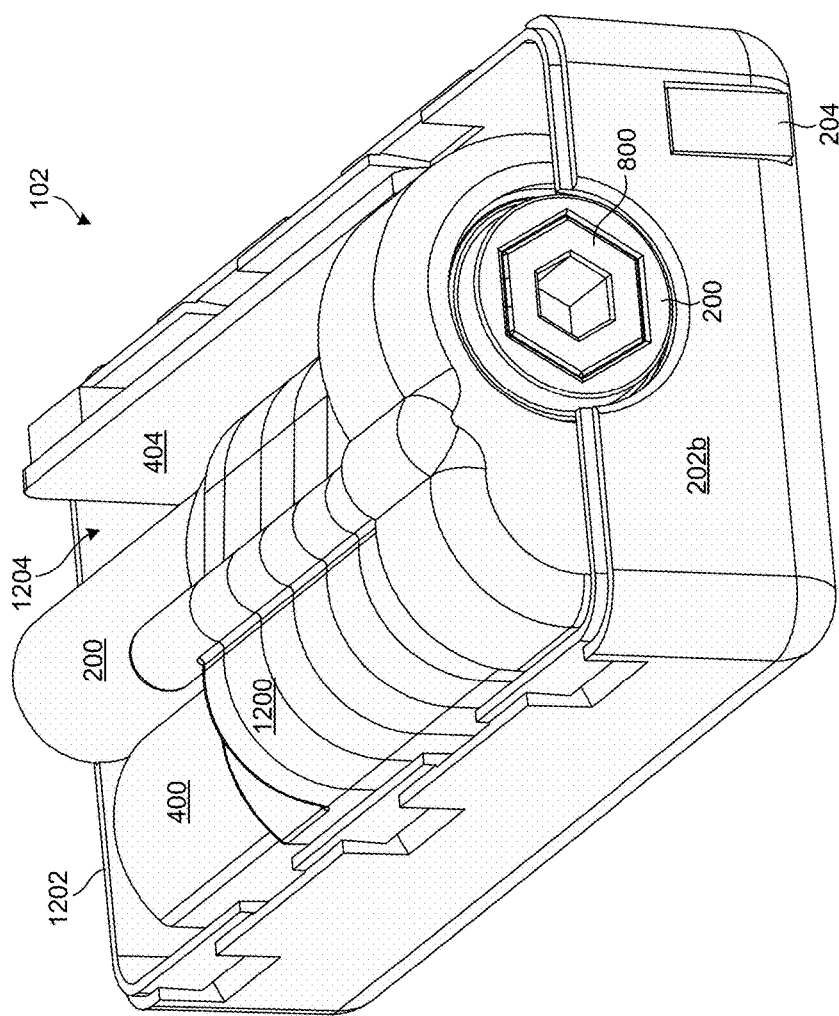
FIG. 14 is another perspective view of internal components of the motorized gearbox assembly illustrated in FIG. 11, particularly showing an adapter insert to interlock with and apply torque to a tilt rod.

FIGS. 13 and 14 show the interior of the motorized gearbox assembly 102 of FIG. 12 from two additional angles, particularly showing the opposite end of the output shaft 200 and an adapter insert 800. As shown in FIGS. 13 and 14, the internal wall 1200 may, in certain embodiments, be segmented to allow the gears and pins of the power transmission system 402 to be assembled using through-holes in the internal wall 1200, as previously described. In certain embodiments, the power transmission system 402, including the internal wall 1200, may be assembled and inserted into the external wall 1202 along with other components, such as the circuit board 404.

Figure 15:
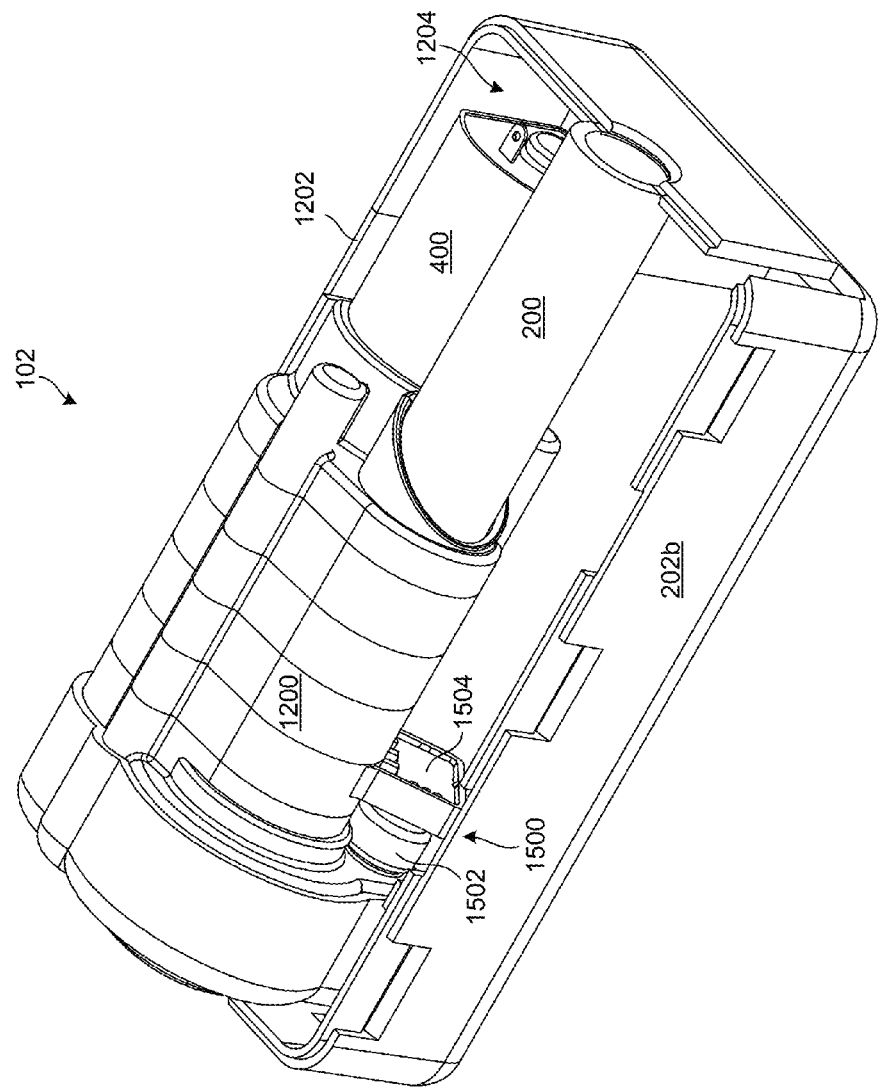
FIG. 15 is another perspective view of internal components of the motorized gearbox assembly illustrated in FIG. 11, particularly showing a position encoder within the motorized gearbox assembly.

Referring to FIG. 15, another view of internal components of the motorized gearbox assembly 102 is illustrated, however with the circuit board 404 removed. From this view, a position encoder 1500 is visible below the internal wall 1200. In order to determine the angle or position of slats 106 at any given time, systems and methods are needed to track the number of rotations and/or angular position of the output shaft 200. A position encoder 1500 may be provided to measure the number of rotations and/or angular position. In certain embodiments, a counter may be maintained in memory (e.g., non-volatile memory on the circuit board 404) to keep track of the number of rotations as well as the current angular position of the position encoder 1500. Using calibration techniques, which will be explained in more detail hereafter, the motorized gearbox assembly 102 may translate the number of rotations and angular position of the position encoder 1500 into an angular position of the window blind's slats 106, thereby allowing the motorized gearbox assembly 102 to know the current angular position of the slats 106 at all times. As will be further explained, the motorized gearbox assembly 102 may use the position encoder 1500 as well as a current sensor to estimate the size of the window blind 100 and/or ensure that excessive force is not applied to the remaining tilt components (e.g. tape roll/drum) of the window blind 100.

Various types of position encoders 1500 may be used in the motorized gearbox assembly 102. In one embodiment, the position encoder 1500 is a rotary resistive position encoder. In another embodiment, as shown in FIG. 15, the position encoder 1500 is a rotary magnetic position encoder 1500. Such a rotary magnetic position encoder 1500 may include a diametrically polarized magnet 1502 that is driven by the output shaft 200. The magnet's rotational position may be monitored by a magnetic resolver 1504. Such an embodiment may be advantageous in that no mechanical shaft may be needed to turn a physical wiper, as required with a resistive encoder. Rather, the angular position may be magnetically communicated to a contactless sensor 1504 located proximate thereto. Also, unlike a resistive encoder, a magnetic encoder 1500 may have no "dead band" (i.e., a portion of the rotation where the internal wiper is no longer connected to an internal resistive element).

Figure 16:
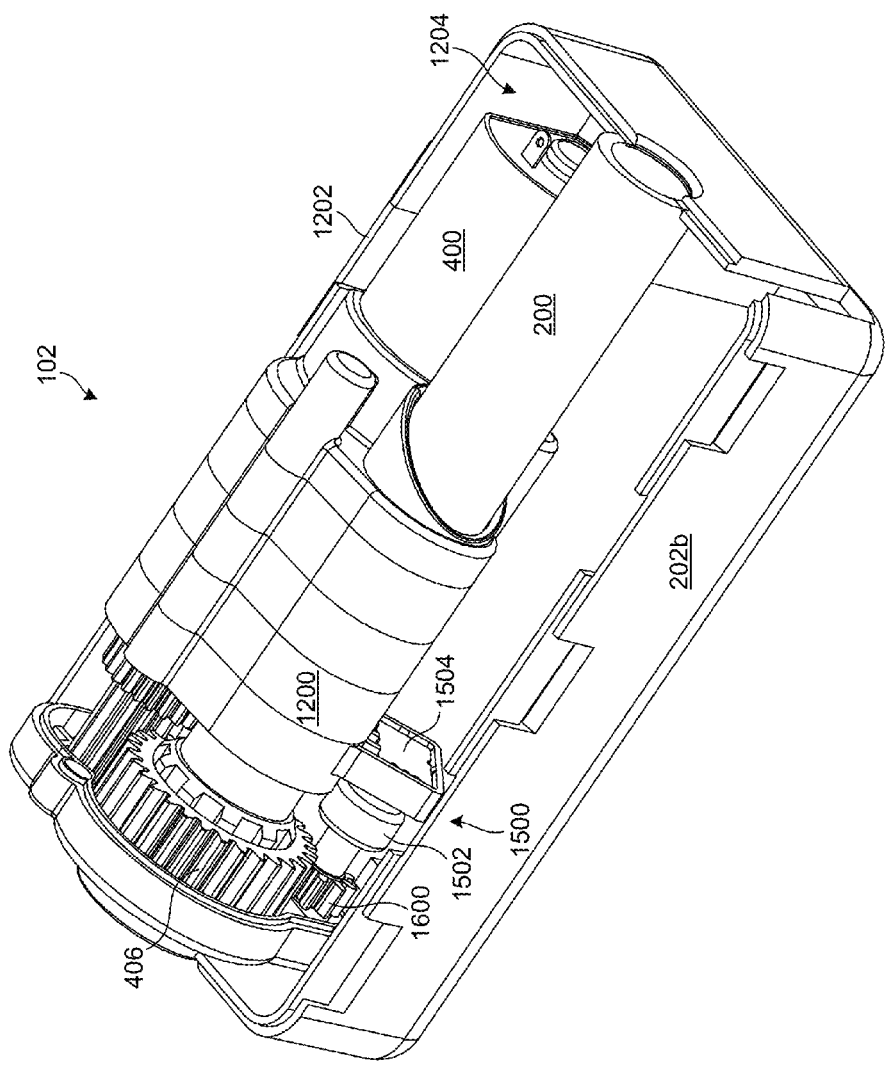
FIG. 16 is another perspective view of internal components of the motorized gearbox assembly illustrated in FIG. 11, particularly showing the position encoder directly driven by the output shaft.
Figure 17:
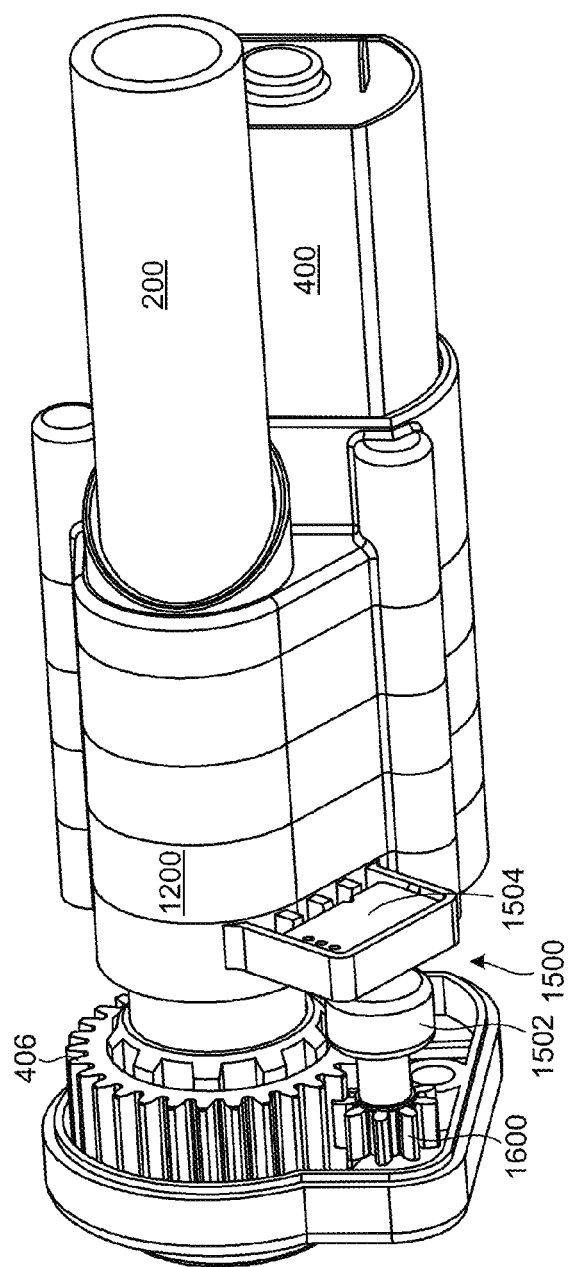
FIG. 17 is another perspective view of the position encoder directly driven by the output shaft.

Referring to FIG. 16, another view of internal components of the motorized gearbox assembly 102 is illustrated. In this view, the circuit board 404 and various segments of the internal wall 1200 have been removed to provide an enhanced view of the position encoder 1500 as well as mechanisms that are used to drive the position encoder 1500. As shown in FIG. 16, in certain embodiments, the position encoder 1500 is driven directly by the output shaft 200. For example, as can be observed in FIG. 16, a main gear 406 coupled to the output shaft 200 directly drives a gear 1600 coupled to the position encoder 1500. In the illustrated example, the smaller size of the gear 1600 compared to the main gear 406 ensures that the position encoder 1500 rotates substantially faster than the output shaft 200. The instant inventors have found that driving the position encoder 1500 with the output shaft 200 reduces inaccuracy (due to slop, play, or the like) that may otherwise occur by driving the position encoder 1500 with gears further back in the drive train. The instant inventors have also found that driving the position encoder 1500 with the main gear 406 provides sufficient data resolution to accurately determine and track the angular position of the slats 106. FIG. 17 shows another view of the position encoder 1500 with the lower housing 202*b* removed.

Figure 18:
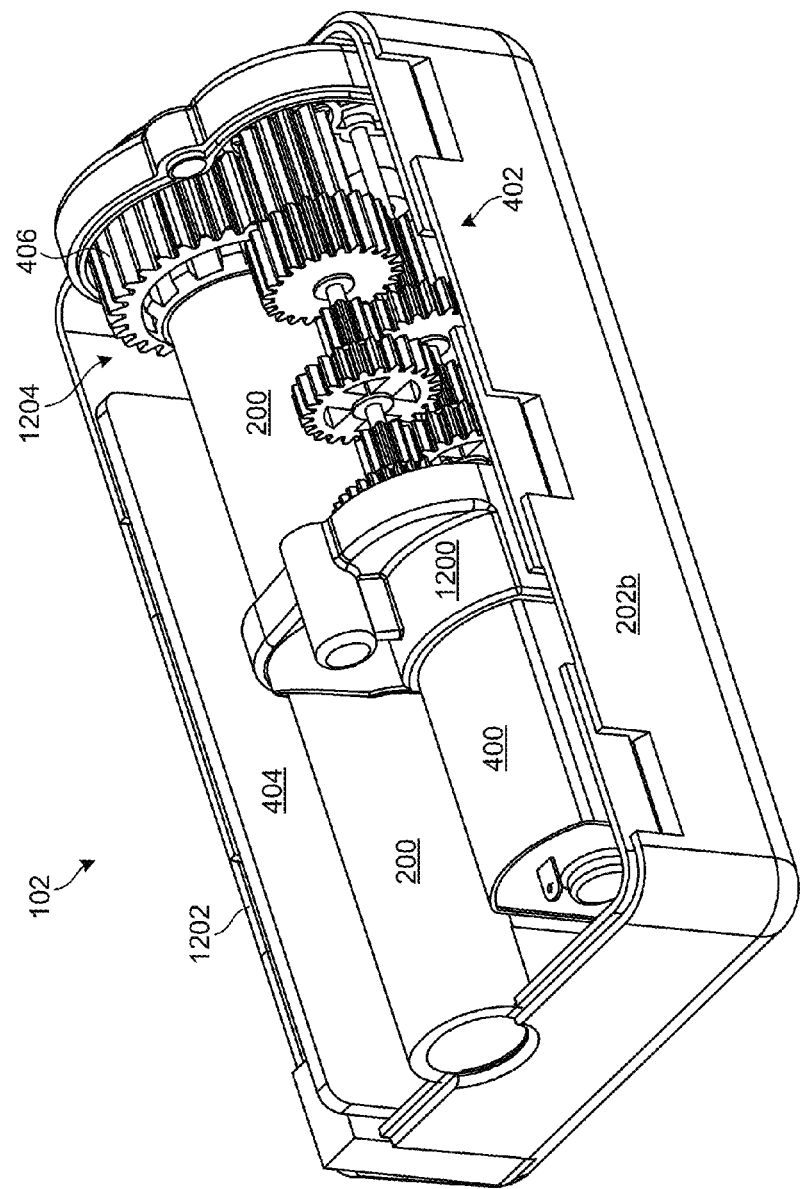
FIG. 18 is a perspective view of internal components of the motorized gearbox assembly of FIG. 11 with most of the internal wall removed.
Figure 19:
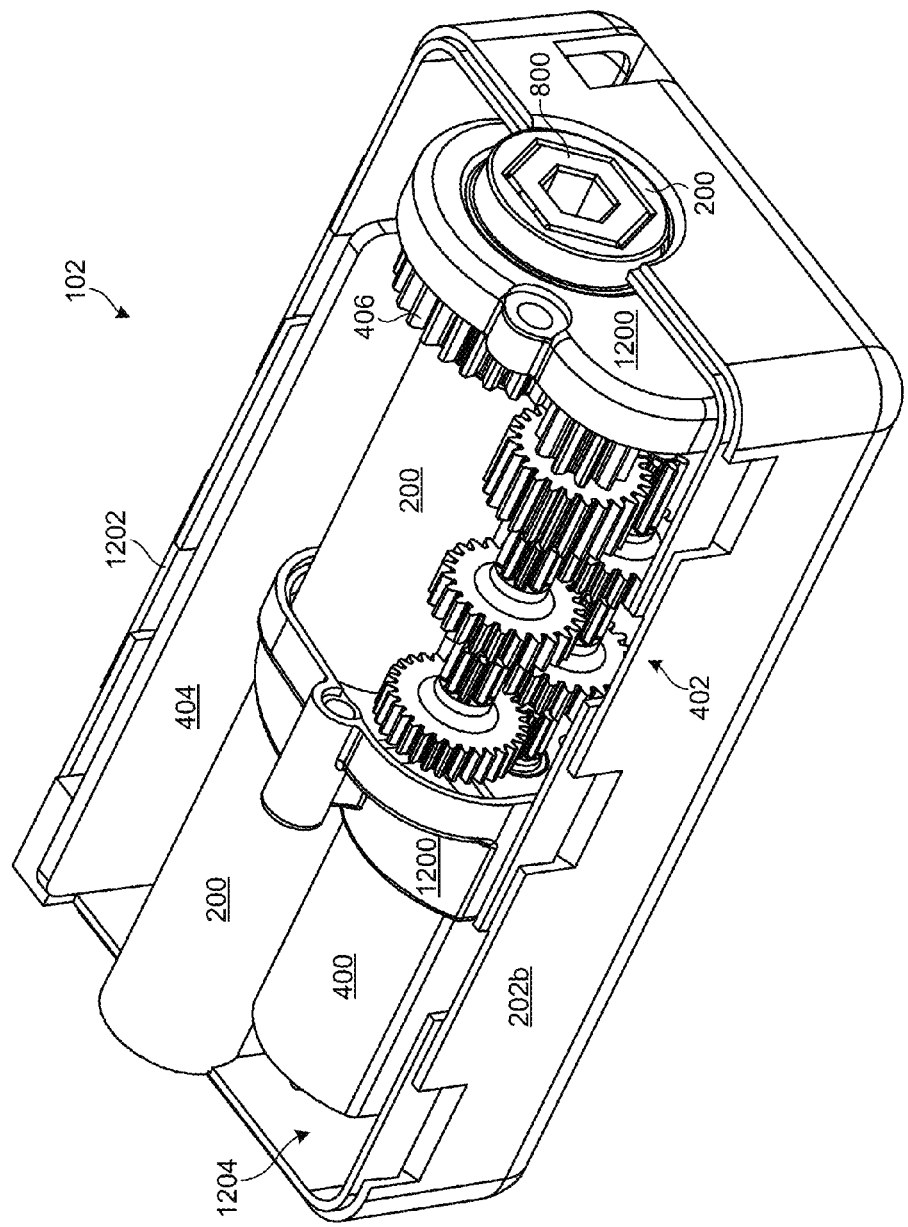
FIG. 19 is another perspective view of internal components of the motorized gearbox assembly of FIG. 11 with most of the internal wall removed.

Referring to FIGS. 18 and 19, several views of the interior of the motorized gearbox assembly 102 are illustrated, with much of the internal wall 1200 removed. These views show gears of the power transmission system 402, including the main gear 406, as well as the output shaft 200 passing through the internal wall 1200. One advantage of the multi-wall design discussed in association with FIG. 12-19 is that it allows cheaper gears (e.g., plastic gears as opposed to metal, molded gears as opposed to machined gears, etc.) to be used without significantly increasing noise produced by the motorized gearbox assembly 102. That is, the multi-wall design may provide sufficient sound dampening to mitigate additional noise created by lower tolerance components. In certain embodiments, vibration-dampening materials (e.g., rubber, foam, elastomers, etc.) may be placed between the motor 400 and internal wall 1200 and the external wall 1202 to ensure that any vibrations produced by the motor 400 and power transmission system 402 are not transmitted to the external wall 1202. This will also reduce noise.

Figure 20:
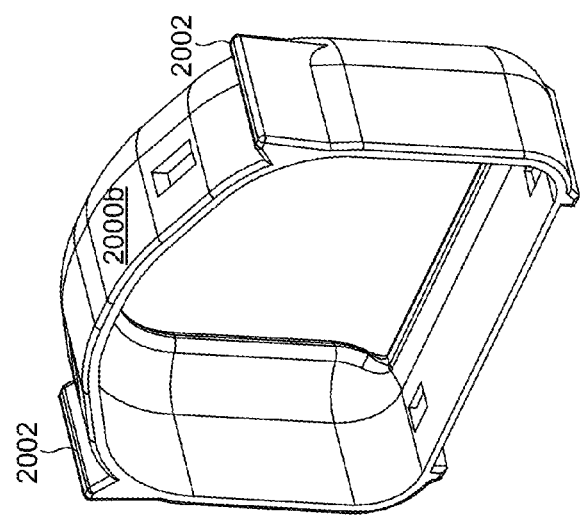
FIG. 20 is a perspective view of another embodiment of a headrail bracket for retaining a motorized gearbox assembly within a headrail.
Figure 20:
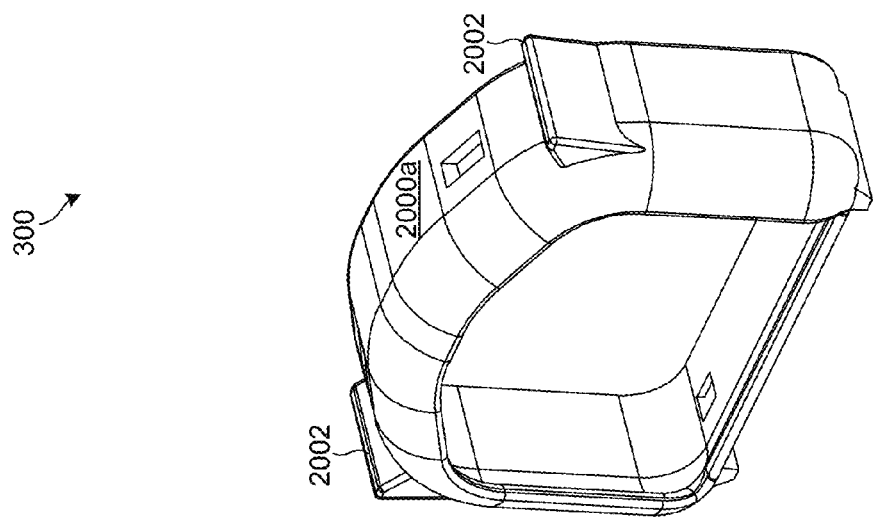

Referring to FIG. 20, another embodiment of a headrail bracket 300 for use with a motorized gearbox assembly 102 in accordance with the invention is illustrated. In this embodiment, the headrail bracket 300 is embodied as a two-piece bracket 300 configured to secure or stabilize each end of the motorized gearbox assembly 102 with respect to the headrail 104. A first component 2000*a* is configured to secure a first end of the motorized gearbox assembly 102 to the headrail 104, and a second component 2000*b* is configured to secure a second end of the motorized gearbox assembly 102 to the headrail 104. Like the example discussed in association with FIG. 3, the headrail bracket 300 illustrated in FIG. 20 may be designed so that it may be inserted into the headrail 104 at an angle and then repositioned to align with the headrail 104.

Figure 23:
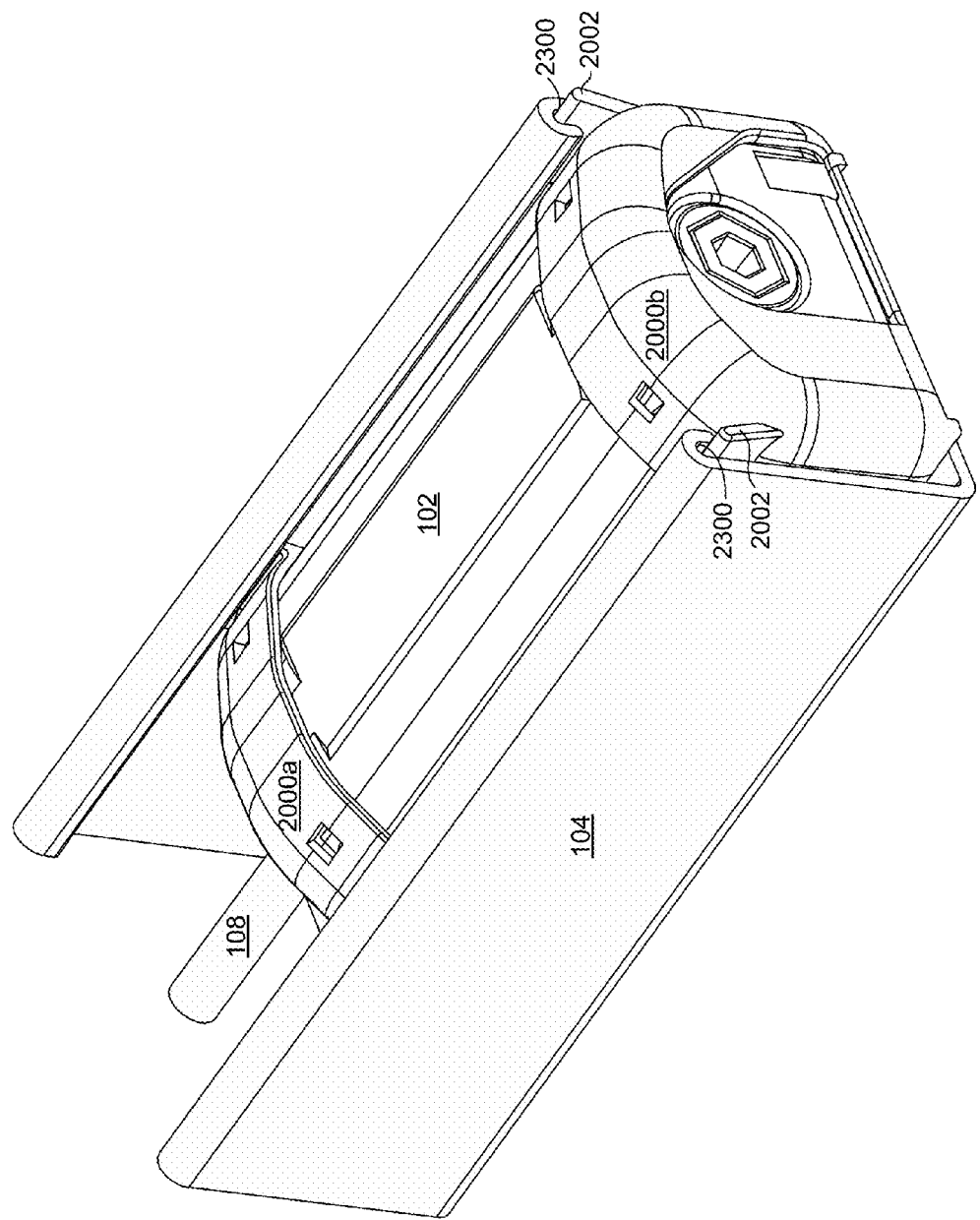
FIG. 23 is a perspective view of the headrail bracket of FIG. 20 used to stabilize a motorized gearbox assembly in accordance with the invention within a headrail.

When aligned, flanges 2002 may sit within a corresponding lip 2300 or groove 2300 of the headrail 104 (as shown in FIG. 23). Once aligned with the headrail 104, the headrail bracket components 2000*a*, 2000*b* may slide over the ends of the motorized gearbox assembly 102 to secure or stabilize the motorized gearbox assembly 102 relative to the headrail 104. In certain embodiments, the headrail bracket 300 is fabricated from an elastomeric material, such as rubber, to allow the headrail bracket 300 to be flexed into position within the headrail 104, as well as allow the headrail bracket 300 to grip and conform around the motorized gearbox assembly 102. Nevertheless, other materials such as plastic or metal may also be used to fabricate the headrail bracket 300.

Figure 21:
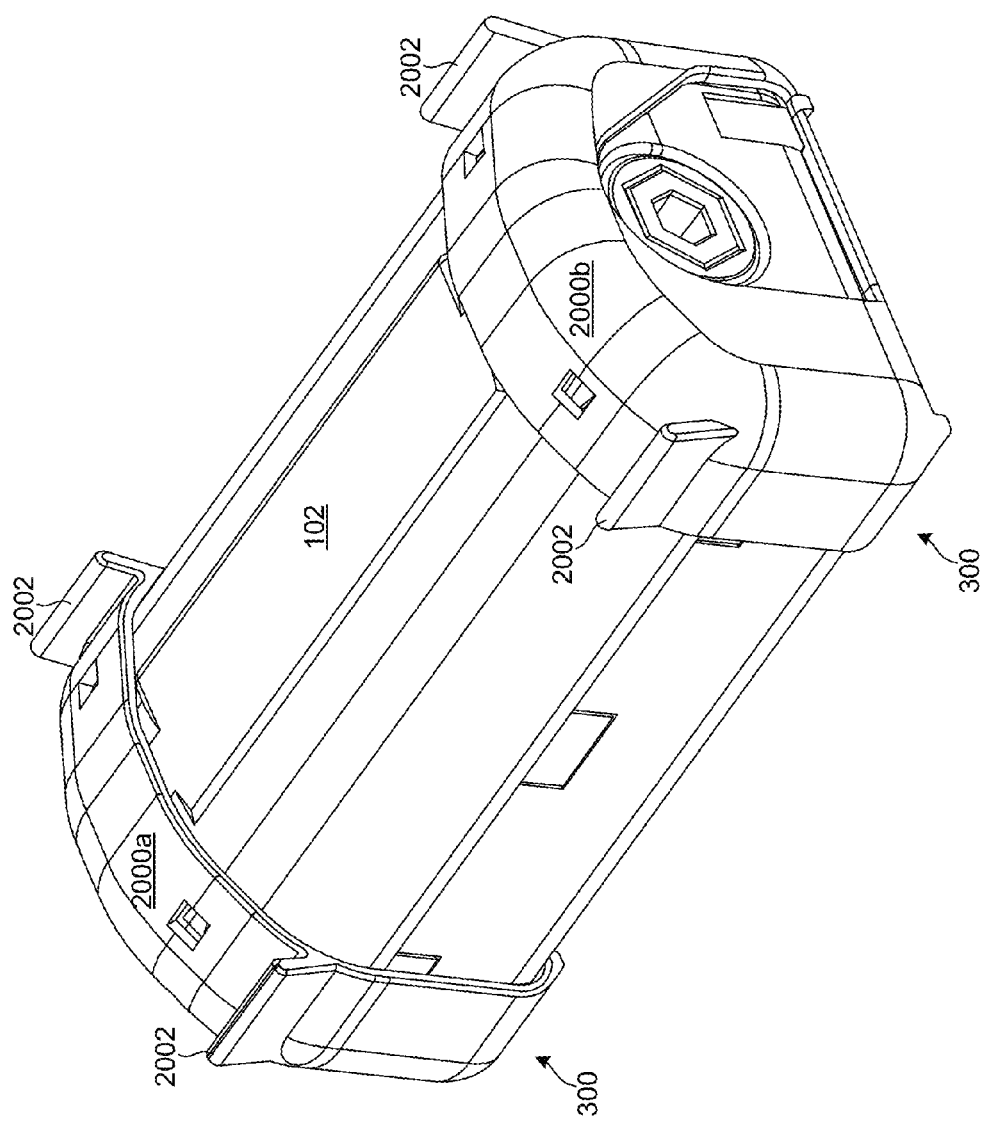
FIG. 21 is a perspective view of the headrail bracket of FIG. 20 installed on a motorized gearbox assembly in accordance with the invention.
Figure 22:
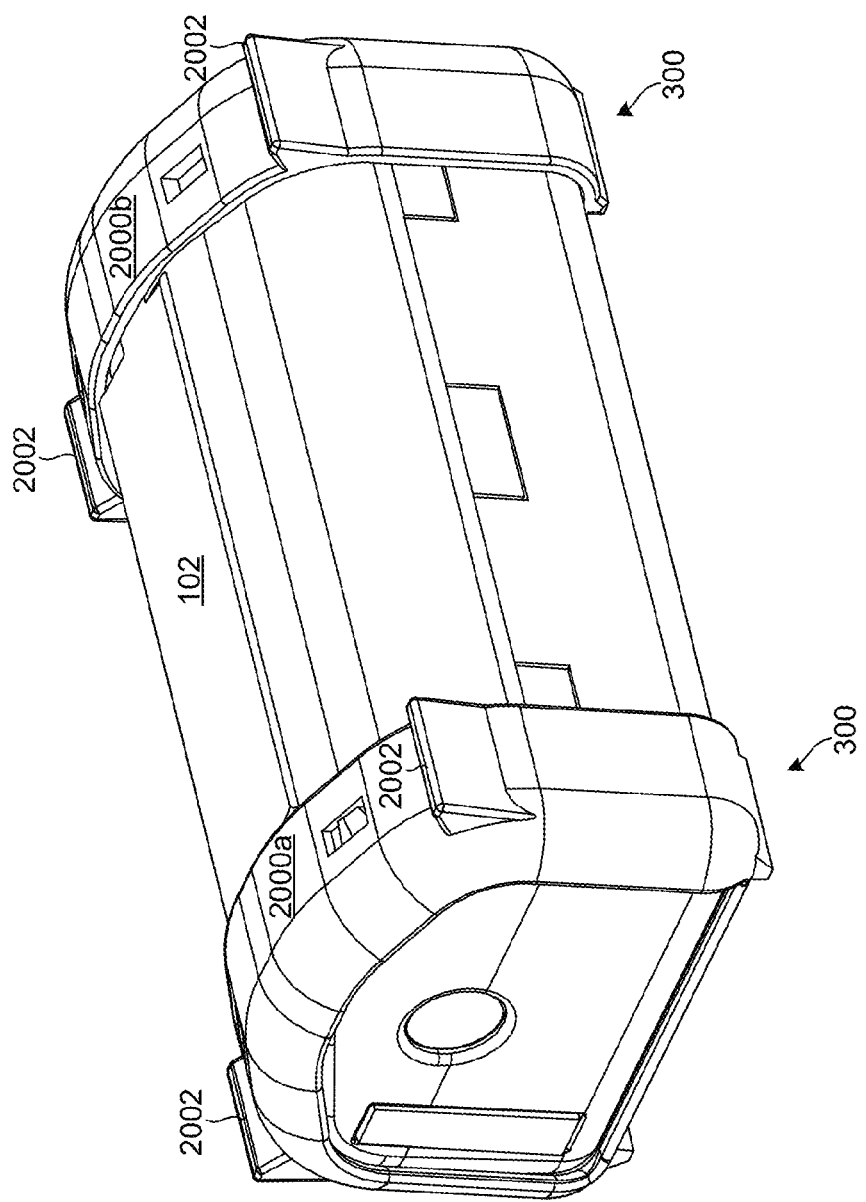
FIG. 22 is another perspective view of the headrail bracket of FIG. 20 installed on a motorized gearbox assembly in accordance with the invention.

FIGS. 21 and 22 show opposing views of the headrail bracket 300 of FIG. 20 installed on the motorized gearbox assembly 102. As can be observed, the headrail bracket 300 may conform to the outer contour of the motorized gearbox assembly 102. FIG. 23 shows a motorized gearbox assembly 102 secured within a headrail 104 using the headrail bracket 300. As can be observed, flanges 2002 of the headrail bracket 300 sit within lips 2300 or grooves 2300 of the headrail 104 to retain or stabilize the motorized gearbox assembly 102 within the headrail 104.

Figure 24:
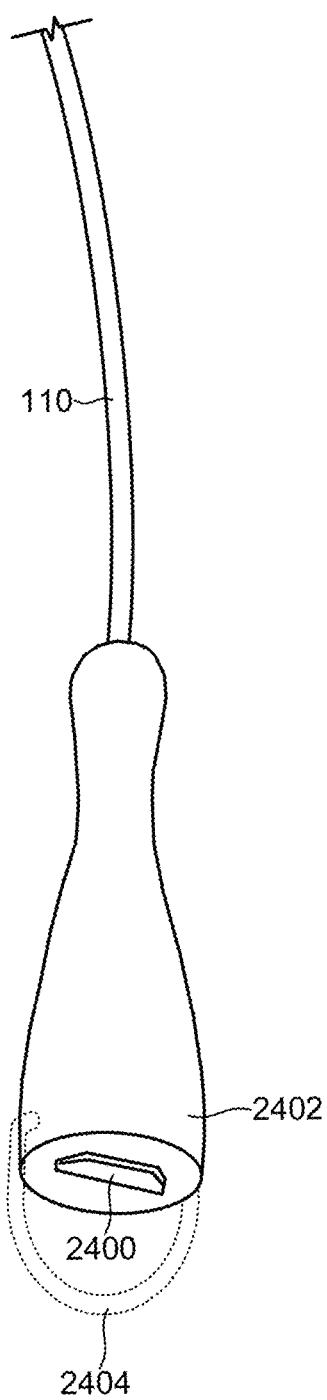
FIG. 24 is cutaway view of one embodiment of a pull cord designed to power a motorized gearbox assembly or charge a battery for powering a motorized gearbox assembly.

Referring to FIG. 24, in certain embodiments in accordance with the invention, a specialized pull cord 110 may be used with the motorized gearbox assembly 102. This pull cord 110 may be used to receive "cord gestures" from a user. For the purpose of this disclosure, "cord gestures" are movements or manipulations of the pull cord 110 such as pull sequences, pull durations, numbers of pulls, durations between pulls, strength of pulls, and combinations thereof. As an example, a first cord gesture (e.g., two quick pulls of the pull cord 110) may be used to open a window blind 100 and a second cord gesture (e.g., a single quick pull of the pull cord 110) may be used to close a window blind 100. In another example, pulling and holding the pull cord 110 may cause the slats 106 to tilt back and forth in continuous succession until the pull cord 110 is released. A controller on the circuit board 404 may translate the cord gestures into commands for controlling the motorized gearbox assembly 102. The pull cord 110 may be any suitable length. In certain embodiments, the length of the pull cord 110 is reduced to less than twelve inches, and in some instances less than six inches, to prevent tangling and/or hazards to children or pets.

In cases where the length of the pull cord 110 is reduced, a hook 2404, loop 2404, or other attachment element 2404 may be incorporated into an end 2402 of the pull cord 110 to allow a rod, wand, cord, or other extension member to connect to, latch on to, or grasp the end 2402 of the pull cord 110. This may allow a user to physically manipulate (tug, twist, etc.) the pull cord 110 even if the user cannot physically reach the pull cord 110. It may also different styles (e.g., lengths, colors, physical configurations, etc.) of extension members to be used with the window blind 100

As shown in FIG. 24, an electrical conductor and connector may, in certain embodiments, be incorporated into the pull cord 110. This may allow data and/or power to be conveyed to the motorized gearbox assembly 102 through the pull cord 110. In certain embodiments, a battery for powering the motorized gearbox assembly 102 may be charged through the pull cord 110. This may be accomplished, for example, by plugging an AC wall adapter into the connector 2400. Any suitable connector 2400 may be used, including but not limited to USB, mini-USB, micro-USB, barrel connectors, or the like. USB-based connectors may be advantageous in that USB wall adapters or power sources may provide a known voltage to the battery.

Figure 25:
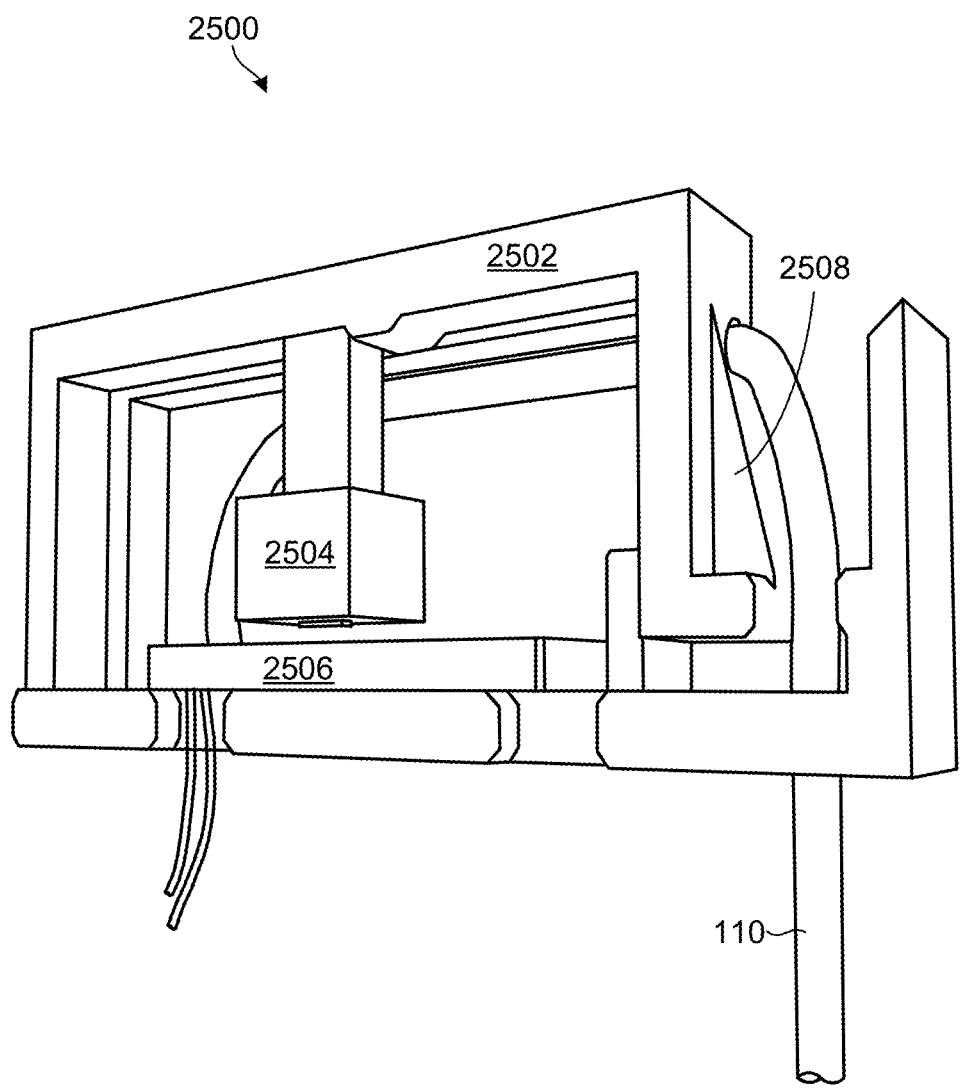
FIG. 25 is a perspective view of one embodiment of a switching mechanism to receive "cord gestures" from a user in a single direction.

Referring to FIG. 25, one embodiment of a switching mechanism 2500 for converting cord gestures into electrical signals is illustrated. Such a switching mechanism 2500 may, in certain embodiments, be housed within the headrail 104 immediately above the pull cord 110. As shown, the switching mechanism 2500 includes a deflectable arm 2502 connected to a contact 2504. The pull cord 110 may be routed through or otherwise connected to the deflectable arm 2502. A chamfer 2508 or other surface 2508 may prevent an undesirable bend or stress in the pull cord 110. When the pull cord 110 is tugged in a downward direction, the deflectable arm 2502 will deflect to move the contact 2504 toward a lower contact 2506. Upon touching, a connection will occur and an electrical signal will be transmitted between the contacts 2504, 2506. In this way, cord gestures may be converted to electrical signals for controlling the motorized gearbox assembly 102.

Figure 26:
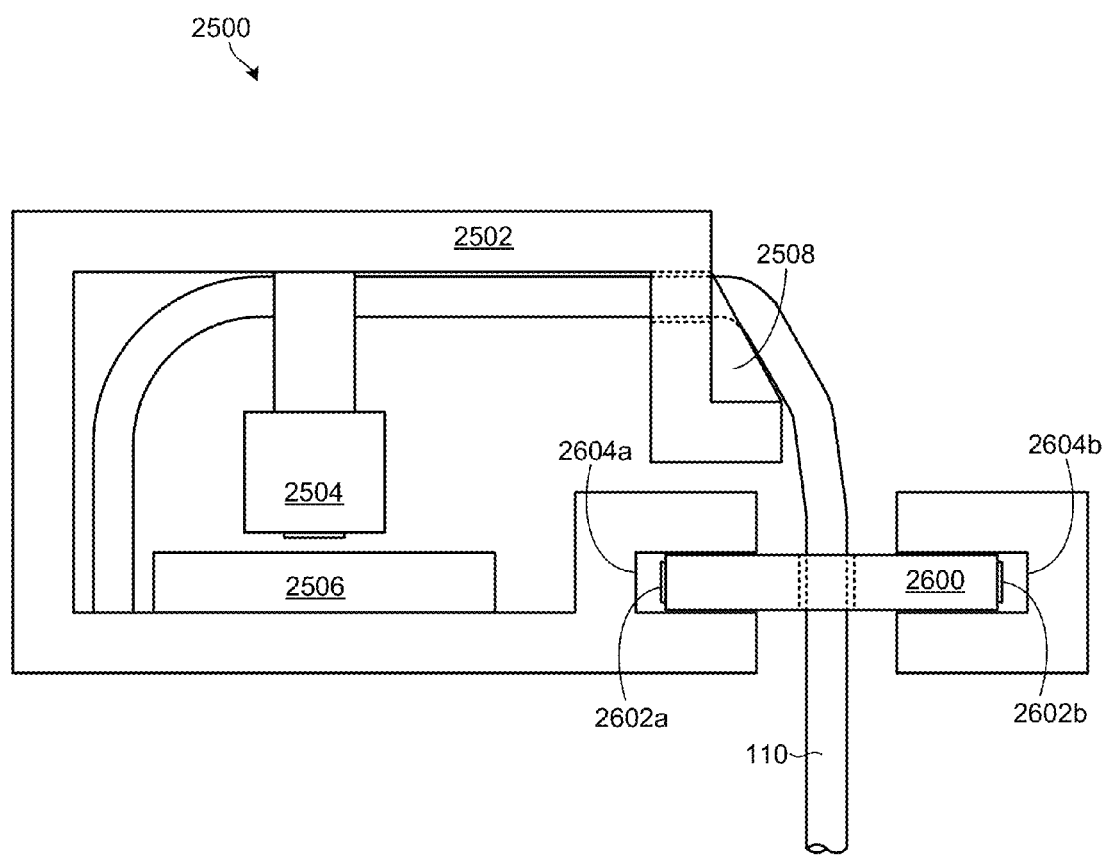
FIG. 26 is a perspective view of one embodiment of a switching mechanism to receive "cord gestures" from a user in multiple directions.

Referring to FIG. 26, in certain embodiments, a switching mechanism 2500 in accordance with the invention may be designed to understand cord gestures in multiple directions. That is, instead of simply understanding pulls in a downward direction, the switching mechanism 2500 may be designed to understand and differentiate side-to-side movement, up-and-down movement, and/or combinations thereof. For example, a pull to one side may be configured to cause a window blind 100 to open whereas a pull to the opposite side may cause the window blind 100 to close.

Like the switching mechanism 2500 discussed in association with FIG. 25, the switching mechanism 2500 of FIG. 26 includes a deflectable arm 2502 and first and second contacts 2504, 2506. These elements 2502, 2504, 2506 may be used to covert downward motion of the pull cord 110 into electrical signals. In addition, the switching mechanism 2500 of FIG. 26 includes a slider 2600 to understand side-to-side motion. As shown, the slider 2600 includes a first contact 2602a and a second contact 2602b. Side-to-side movement of the pull cord 110 may likewise cause the slider 2600 to move side-to-side. In certain embodiments, biasing members (not shown) such as springs may keep the slider 2600 substantially centered between the contacts 2604a, 2604b when no force is applied.

When the slider 2600 is moved in a first direction (leftward in the illustrated embodiment) the contact 2602a may touch the contact 2604a, thereby converting leftward lateral movement of the pull cord 110 into an electrical signal. Similarly, when the slider 2600 is moved in a second direction (rightward in the illustrated embodiment) the contact 2602b may touch the contact 2604b, thereby converting rightward lateral movement of the pull cord 110 into an electrical signal. Using a switching mechanism 2500 that can understand both vertical and lateral movement of the pull cord 110, many more cord gestures and associated commands are possible.

In other or the same embodiments, the pull cord 110 may be replaced or supplemented by buttons, a twist wand, a directional pad, or other controls, in order to control a window blind 100 or other window covering 100. For example, a twist wand may be used to control a window blind 100 by twisting the wand, twisting and holding the wand, tugging on the wand, or the like. Each of these actions may generate different commands to cause a window blind 100 or other window covering 100 to perform different functions, such as open or close. Physically pressing or manipulating buttons or a directional pad may also be used to generate and send different commands to a window blind 100 or window covering 100. In certain embodiments, a pull cord 110 in accordance with the invention may be eliminated altogether. Any charging port in the pull cord 110 may be incorporated into a twist wand, as described above, or incorporated directly into a headrail 104.

Referring generally to FIGS. 27 through 36, in certain embodiments in accordance with the invention, an application may be provided that allows a user to program the motorized gearbox assembly 102 to operate in a desired manner. For example, a user may want the motorized gearbox assembly 102 to open a window blind 100 at a specified time of day and close the window blind 100 at another time of day. The application may also assist the user in programming multiple motorized gearbox assemblies 102. For example, a user's home or business may contain multiple window blinds 100 and it may be inefficient and time-consuming to individually program the motorized gearbox assemblies 102, particularly in cases where the user wants the motorized gearbox assemblies 102 to behave in a similar manner. In certain embodiments, the application may assist the user in programming multiple motorized gearbox assemblies 102 as a group.

In certain embodiments, the application is configured to execute on a user's mobile device, such as a tablet or smart phone. FIGS. 27 through 36 show various exemplary graphical user interface (GUI) pages associated with an application configured to execute on a mobile device. Nevertheless, in other embodiments, the application may be configured to execute on a desktop computer, workstation, laptop, or other suitable computing device.

Figure 27:
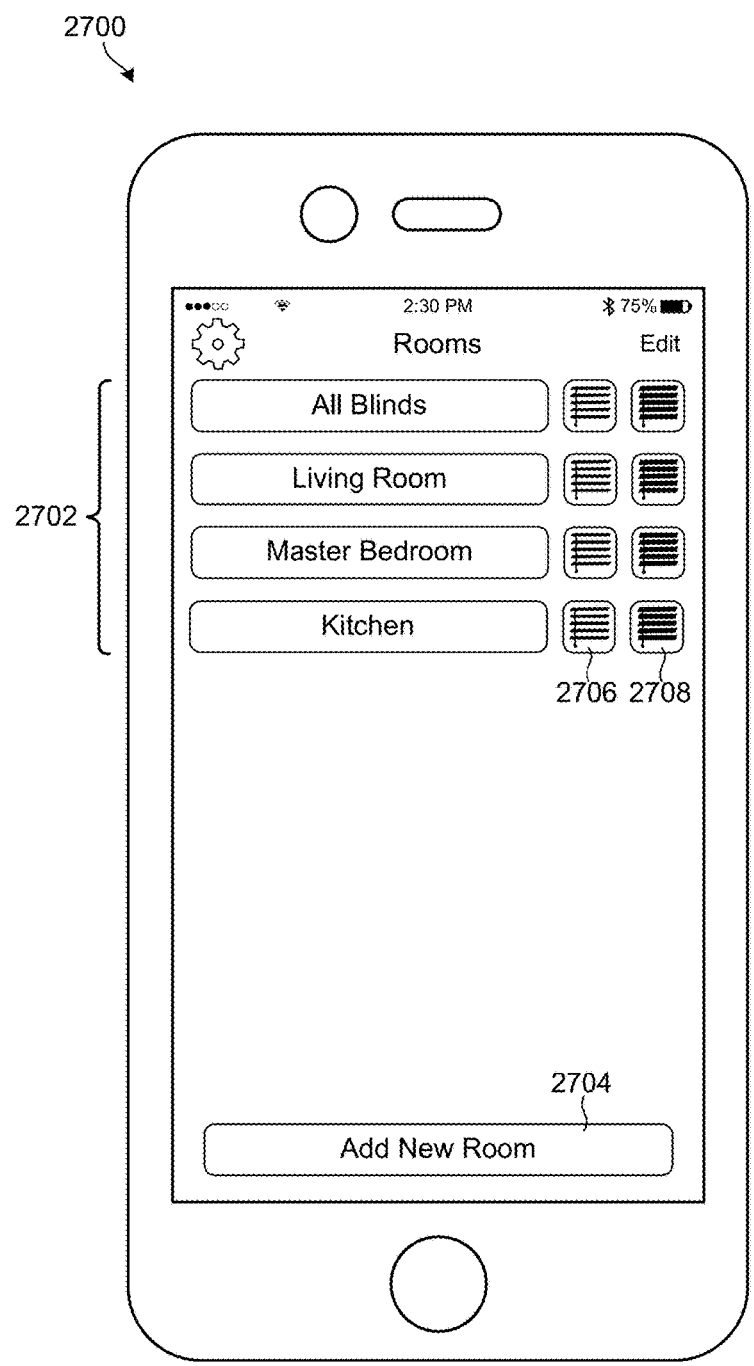
FIG. 27 shows a graphical user interface for setting up and automating window blinds in different rooms or spaces.

Referring to FIG. 27, one embodiment of a GUI page 2700 for setting up and automating window blinds 100 in various rooms of a home or business is illustrated. When automating a home or business, multiple window blinds 100 may be retrofitted with a motorized gearbox assembly 102 in accordance with the invention. In many cases, individual rooms in the home or business may contain multiple window blinds 100. In certain cases, a user may want all window blinds 100 in a home or business, or all window blinds 100 in a particular room of a home or business, to be programmed in the same or a similar manner. Similarly, when using manual controls to operate the window blinds 100, the user may wish to operate all window blinds 100 in a home or business, or in a room of the home or business, as a group as opposed to individually.

FIG. 27 shows one embodiment of a "Rooms" page 2700 that enables a user to establish rooms in a home or business, as well as operate all window blinds 100 in the home or business, or in a room of the home or business, as a group. In the illustrated embodiment, buttons 2702 are provided to represent the home or business, as well as each room that has been established in the home or business. Selecting a button 2702 may enable a user to configure the home or business, or a room in the home or business, such as by adding window blinds 100 to the home, business, or particular room. For example, selecting the "All Blinds" button 2702 may allow the user to configure all window blinds 100 associated with the home or business. Similarly, selecting the "Living Room" button 2702 may allow the user to configure window blinds 100 in the user's living room. An "Add New Room" button 2704 may enable a user to add a new room to the list 2702.

As shown, various manual controls are provided on the "Rooms" page 2700. For example, an open button 2706 may cause all blinds in a home or business, or a particular room in the home or business, to open. Similarly, a close button 2708 may cause all blinds in the home or business, or the particular room in the home or business, to close. The buttons 2706, 2708 may be configured to operate in different ways. For example, pressing and holding the button 2706, 2708 may cause the slats 106 of the window blinds 100 to tilt until the buttons 2706, 2708 are released. This would allow various intermediate tilt positions or angles to be achieves. By contrast, single or double clicking a button 2706, 2708 may cause the slats 106 of the window blinds 100 to open or close completely without having to hold down the corresponding buttons 2706, 2708. This is simply an example of possible operation and is not intended to be limiting.

Figure 28:
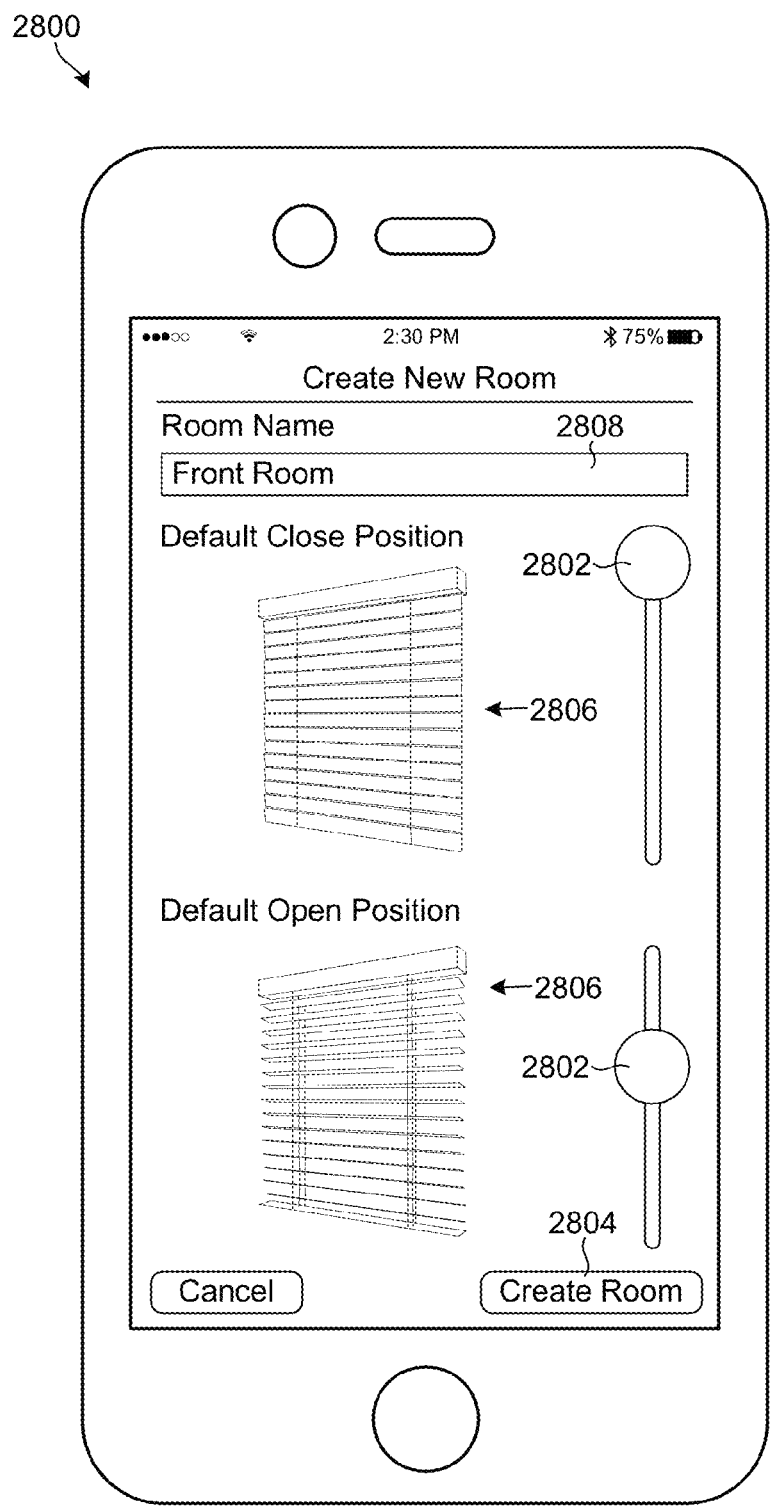
FIG. 28 shows a graphical user interface for creating a new room and establishing a default closed and open position for window blinds associated with the new room.

Referring to FIG. 28, one embodiment of a "Create New Room" page 2800 is illustrated. Such a page 2800 may be displayed upon selecting the "Add New Room" button 2704 discussed in association with FIG. 27. As shown, the "Create New Room" page 2800 enables a user to designate a room name (e.g., "Front Room") in a field 2808, as well as designate a default open and closed position for window blinds 100 associated with the room. As shown in FIG. 28, slider buttons 2802 are provided to enable the user to establish the open and closed positions for the window blinds 100. In certain embodiments, window blind depictions 2806 adjacent to the buttons 2802 are animated in response to movement of the slider buttons 2802. That is, as the slider buttons 2802 are moved up or down, the window blind depictions 2806 appear to open and/or close to reflect the actual position of the slats 106. Once a room is named and the default open and closed positions are established, a "Create Room" button 2804 may be selected to create the room. This will, in turn, cause the room to be added to the list 2702 illustrated in FIG. 27.

Figure 29:
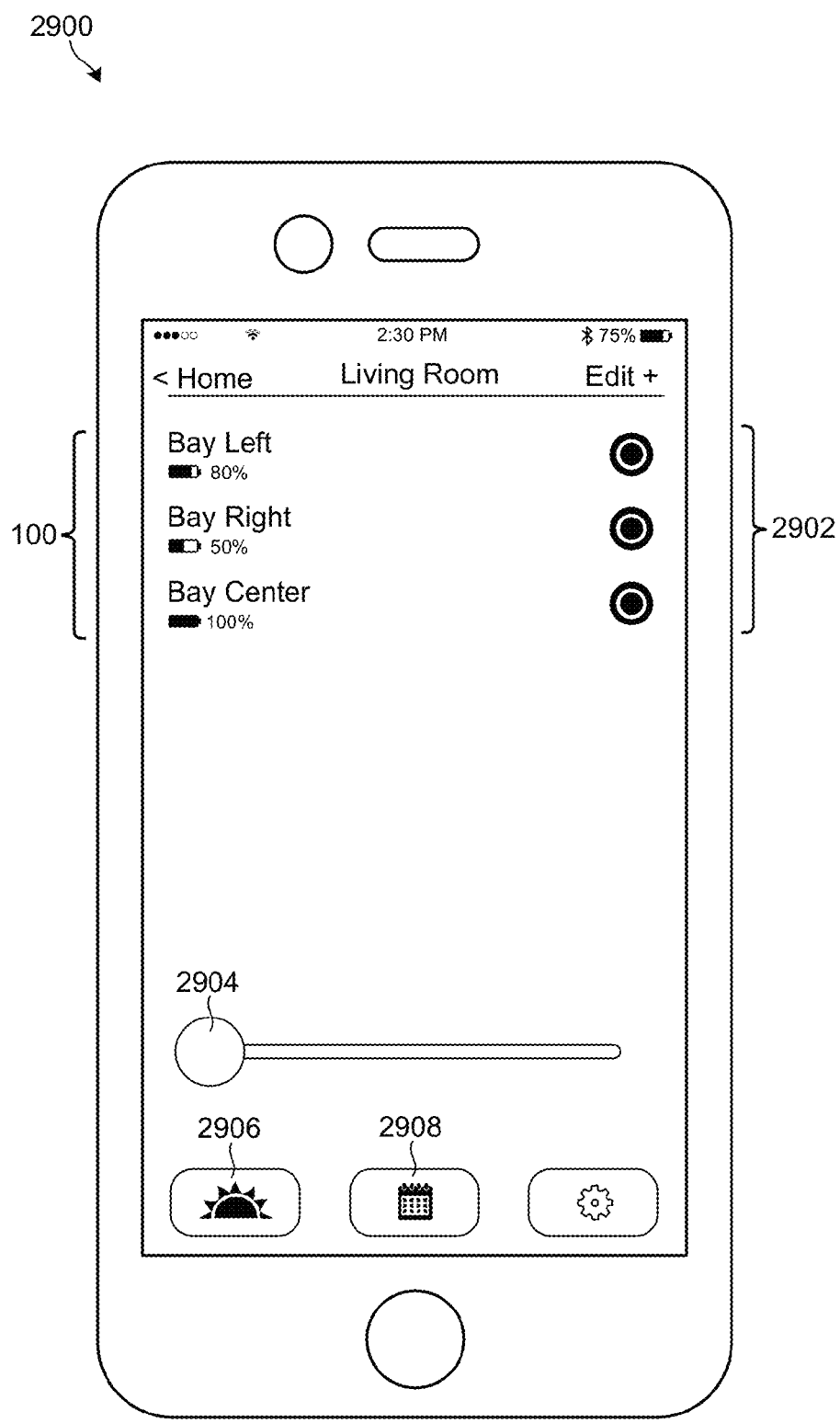
FIG. 29 shows a graphical user interface for monitoring a battery charge level for window blinds in a room.

Referring to FIG. 29, one embodiment of a page 2900 for configuring a room is illustrated. Such a page, for example, may be displayed in response to selecting one of the buttons 2702 illustrated in FIG. 27. This page 2900 may enable a user to add, delete, modify, or monitor window blinds 100 associated with a particular room or space. In the illustrated example, the room "Living Room" includes three window blinds 100, namely "Bay Left," "Bay Right," and "Bay Center." Indicators are provided to show a battery charge level associated with each of the window blinds 100. As further shown, each of the window blinds 100 includes a button/indicator 2902. In certain embodiments, the outer ring may indicate weather the window blind 100 is online and connected whereas the inner circle may enable a user to select the window blind 100 so that it can be controlled and/or configured. For example, upon selecting one or more window blinds 100 in the list, a slider button 2904 may enable the window blinds 100 to be manually opened or closed by moving the slider button 2904.

Figure 33:
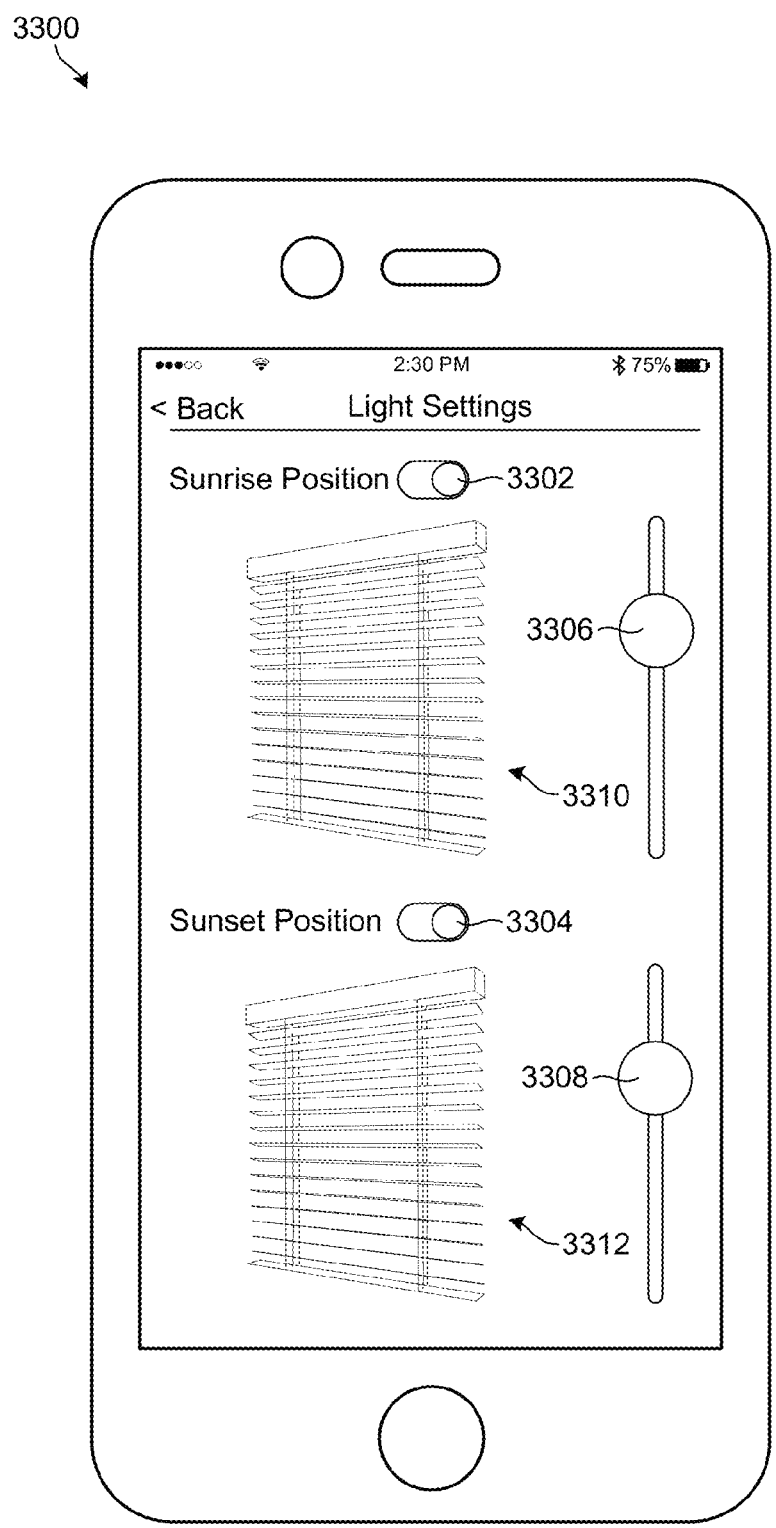
FIG. 33 shows a graphical user interface for adjusting light settings associated with a window blind.

Various different buttons for configuring the window blinds 100 are shown at the bottom of the page 2900. For example, a button 2906 may be selected to configure a window blind 100 or a group of window blinds 100 to operate in accordance with sensed lighting conditions. For example, a user may want a window blind 100 or a group of window blinds 100 to open at sunrise and/or close at sunset. Selecting the button 2906 may open up a page that enables the user to configure the window blinds 100 in such a manner. One embodiment of such a page is illustrated in FIG. 33.

Similarly, a button 2908 may be selected to configure a window blind 100 or a group of window blinds 100 to operate in accordance with a defined schedule. For example, a user may want a window blind 100 or a group of window blinds 100 to open and/or close at designated times. In certain embodiments, different open/close times may be established for different days of the week. Selecting the button 2908 may open up a page that enables the user to configure the window blinds 100 to operate in accordance with the established schedule. One embodiment of such a page is illustrated in FIG. 30.

Figure 30:
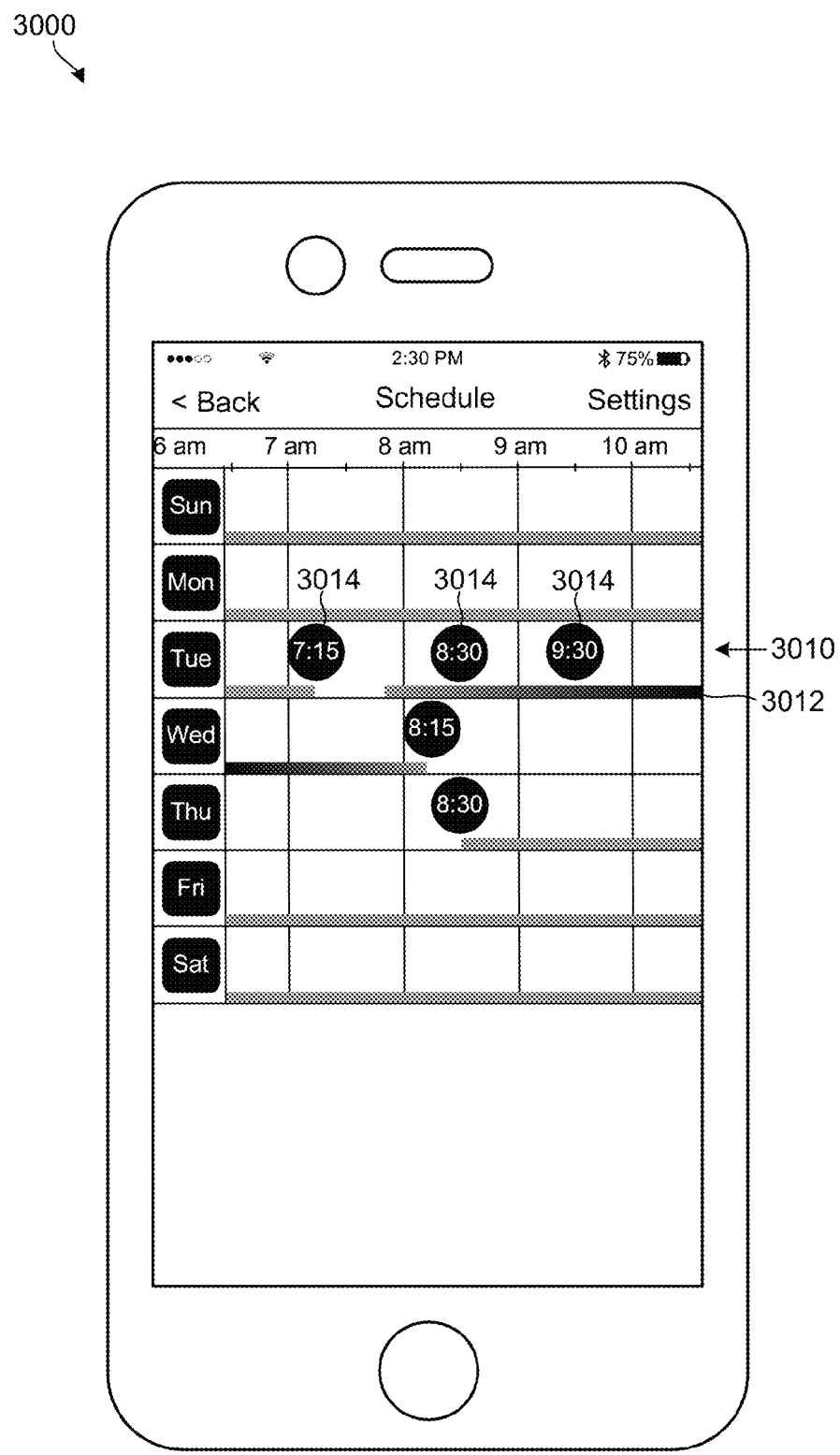
FIG. 30 shows a graphical user interface for displaying a schedule associated with a window blind.

Referring to FIG. 30, one embodiment of a page 3000 for establishing a schedule for a window blind 100 or a group of window blinds 100 is illustrated. In the illustrated embodiment, a time line 3010 is provided for each day of the week. A user may establish different types of events 3014 on the time line 3010. For example, a user may wish to establish an open event 3014 at a designated time and a close event 3014 at a different designated time. For example, as shown in the illustrated embodiment, an open event 3014 is established at 7:15 AM and a close event 3014 is established at 9:30 AM. In certain embodiments, events 3014 may also be established for states other than open/close states. For example, a user may want a window blind 100 or a group of window blinds 100 to be fifty percent (or some other percentage) open at a designed time. In the illustrated embodiment, a partial open event 3014 is established at 8:30 AM.

In certain embodiments, each time line 3010 may have a status bar 3012 associated therewith. This status bar 3012 may show a status of a window blind 100 or a group of window blinds 100 during different time periods. For example, the color white on the status bar 3102 may indicate that a window blind 100 or group of window blinds 100 is open over the indicated time period. Similarly, the color black may indicate that the window blind 100 or group of window blinds 100 is closed during the indicated time period. Shades of grey may indicate a state of partial openness, the degree of which may be indicated by the shade.

In certain embodiments, a gradual change in color along the status bar 3012 may indicate that a window blind 100 or group of window blinds 100 is gradually opening or closing over the indicated time period. For example, as can be observed in FIG. 30, a window blind 100 or group of window blinds 100 is partially open until 7:15 AM, at which time they completely open. The window blind 100 or group of window blinds 100 then gradually close until they reach a designated state of partial openness at 8:15 AM. The window blind 100 or group of window blinds 100 gradually continue to close until they are completely closed at or around 9:30 AM and thereafter. In certain embodiments, an event 3014 may indicate when an operation (open, close, etc.) begins. In other embodiments, an event 3014 may indicate when an operation ends. In yet other embodiments, an operation may be centered with respect to an event 3014 such that the operation may begin before the designate event time and end after the designated event time.

In certain embodiments, creating an event 3014 may be as easy as selecting an area on a time line 3010 where an event 3014 is desired to be placed. A page or menu may appear that allows the user to establish details or settings for the event 3014. Similarly, selecting or manipulating an already existing event 3014 may allow details or settings associated with the event 3014 to be changed. In certain embodiments, a time or day associated with an event 3014 may be changed by simply selecting and dragging the event 3014 to a desired time or day on the page 3000. Other techniques for creating, modifying, or deleting events 3014 may be used and are within the scope of the invention.

Figure 31:
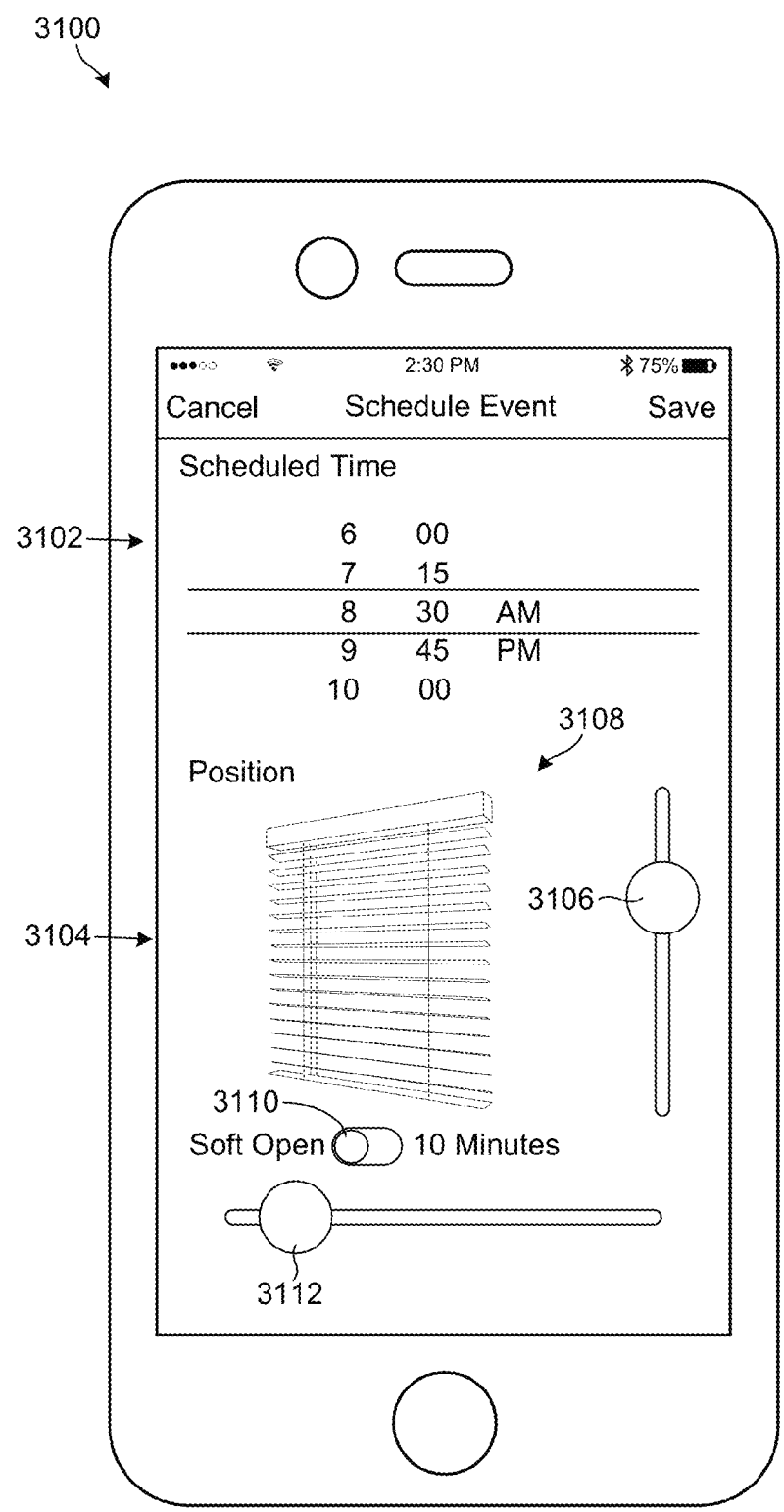
FIG. 31 shows a graphical user interface for scheduling an event associated with a window blind.

Referring to FIG. 31, one embodiment of a page 3100 for creating or modifying an event 3014 is illustrated. In this embodiment, a time-selection feature 3102 enables a user to specify a desired time for an event 3014. Similarly, a position-selection feature 3104 enables a user to specify a desired position for a window blind 100 or group of window blinds 100 for an event 3014. This position-selection feature 310 may, in certain embodiments, enable a user to select an open state, closed state, or an intermediate state associated with the event 3014. In certain embodiments, a slider button 3106 is provided to enable the user to designate the position of the window blind 100 or group of window blinds 100. A window blind graphic 3108 adjacent to the button 3106 may be animated in response to movement of the slider button 3106 to show a position of the window blind 100 or group of window blinds 100.

In certain embodiments, the page 3100 may also enable a user to designate how fast a window blind 100 or group of window blinds 100 opens or closes in association with a particular event 3014. For example, a user may want a window blind 100 or group of window blinds 100 to open or close over a designated period of time (e.g., 10 minutes, 30 minutes, an hour, etc.) instead of opening or closing in an abrupt manner. This may provide a more aesthetically pleasing way to operate the window blinds 100 and/or enable window blinds 100 to operate gradually to mirror or reflect the gradual movement of the sun. This may also maximize the amount of sunlight that is allowed to enter a room while at the same time preventing direct sunlight and associated damage on furniture, rugs, or other objects, even as the angle of incidence of the sun changes throughout the day. In certain embodiments, a button 3110 (e.g., a "soft close" button 3110) may be provided to enable this feature. Similarly, in certain embodiments, a slider button 3112 (or other feature such as an input field) may be provided to enable a user to establish how long it takes for a window blind 100 or group of window blinds 100 to transition between states.

Figure 32:
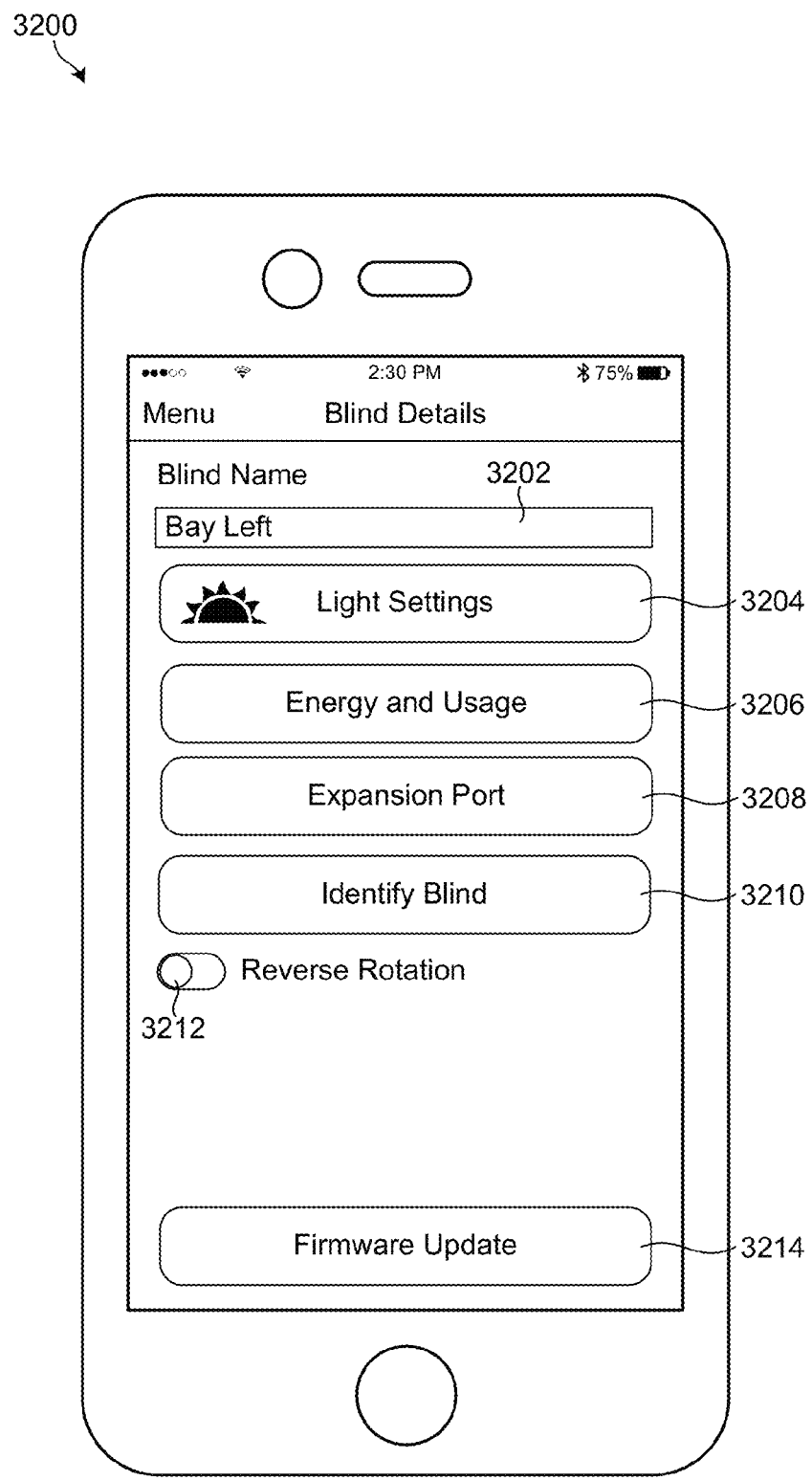
FIG. 32 shows a graphical user interface for setting up and changing settings associated with a window blind.

Referring to FIG. 32, one embodiment of a page 3200 for establishing various details for a window blind 100 is illustrated. As shown, the page 3200 includes a field 3202 for designating or changing a name of a window blind 100. In certain embodiments, descriptive names may be chosen to assist a user in differentiating window blinds 100 from one another. A button 3204 may be selected to configure a window blind 100 to operate in accordance with sensed lighting conditions, such as by opening in response to sunrise and closing in response to sunset. One embodiment of a page for configuring a window blind 100 in this manner will be discussed in association with FIG. 33.

A button 3206 may be configured to display information regarding energy and usage associated with a window blind 100. For example, selecting the button 3206 may enable a user to view a battery charge level, an estimated time that a battery charge will be depleted, usage patterns or particular instances of operation of the window blind 100, or the like.

A button 3208 may enable a user to configure expansion ports or devices connected to expansion ports of the window blind 100. For example, in certain embodiments, sensors such as temperature sensors, security sensors, or the like, may be connected to various expansions ports of a window blind 100 to allow the window blind 100 to provide additional features and functions. The button 3208 may present a screen or page that allows these expansion ports or devices to be configured.

An "identify blind" button 3210 may assist a user in identifying the window blind 100 identified in the field 3202. For example, selecting the button 3210 may cause the window blind 100 to physically move or perform some other function to allow the user to determine which physical window blind 100 corresponds to the window blind 100 identified in the application. This may be helpful in situations where a room, home, or business contains multiple window blinds 100 and the user is unsure which physical window blinds 100 correspond to the blind names listed in the application.

A "reverse rotation" button 3212 may enable functions of a motorized gearbox assembly 102 to be reversed. For example, if a motorized gearbox assembly 102 is installed in a window blind 100 in the wrong (or opposite) direction, the application may allow functions of the motorized gearbox assembly 102 to be reversed instead of requiring removal of the window blind 100 and reinstallation of the motorized gearbox assembly 102 in the opposite direction. Thus, the "reverse rotation" button 3212 may in certain cases save significant amounts of time and make installation of the motorized gearbox assembly 102 substantially fool-proof.

A firmware update button 3214 may enable a user to update firmware on the motorized gearbox assembly 102. One benefit of the motorized gearbox assembly 102 compared to conventional window covering automation systems is the smart technology built into the motorized gearbox assembly 102. Instead of simply receiving and executing commands, the motorized gearbox assembly 102 may have processing capability that allows it to provide additional functionality. For example, in certain embodiments, the motorized gearbox assembly 102 may interface with security sensors for use in a security system, or temperature or humidity sensors for use in a climate-control or HVAC system. The firmware update button 3214 may enable updated firmware to be loaded (e.g., wirelessly loaded) onto the motorized gearbox assembly 102 to either improve existing functionality or expand the functionality of the motorized gearbox assembly 102.

Referring to FIG. 33, one embodiment of a page 3300 for establishing light settings for a window blind 100 or a group of window blinds 100 is illustrated. Such a page 3300 may be displayed in response to selecting the button 2906 discussed in association with FIG. 29 or selecting the button 3204 discussed in association with FIG. 32. The page 3300 may enable a window blind 100 a group of window blinds 100 to be configured to operate in accordance with sensed lighting conditions. When working with a group of window blinds 100, the group may, in certain embodiments, be configured to operate from a single light sensor (possibly a light sensor in single window blind 100 or an external light sensor) in order to substantially synchronize the window blinds 100. In other embodiments, each window blind 100 in the group may operate in accordance with sensed lighting conditions from its own light sensor.

As shown in FIG. 33, in certain embodiments, the page 3300 may include a button 3302 to configure a window blind 100 or group of window blinds 100 to automatically open at sunrise. In certain embodiments, a slider button 3306 may be provided to set the window blind position at sunrise. This may allow the window blind 100 or group of window blinds 100 to be completely or partially opened at sunrise. A window blind graphic 3310 adjacent to the button 3306 may visually open or close in response to movement of the slider button 3306 to show a position of the window blind 100 and/or group of window blinds 100.

Similarly, a button 3304 may be provided to configure a window blind 100 or group of window blinds 100 to automatically close at sunset. A slider button 3308 may, in certain embodiments, be provided to set a desired window blind position at sunset. This may allow the window blind 100 or group of window blinds 100 to be completely or partially closed at sunset. A window blind graphic 3312 adjacent to the button 3308 may visually open or close in response to movement of the slider button 3308 to show a position of the window blind 100 and/or group of window blinds 100.

Figure 34:
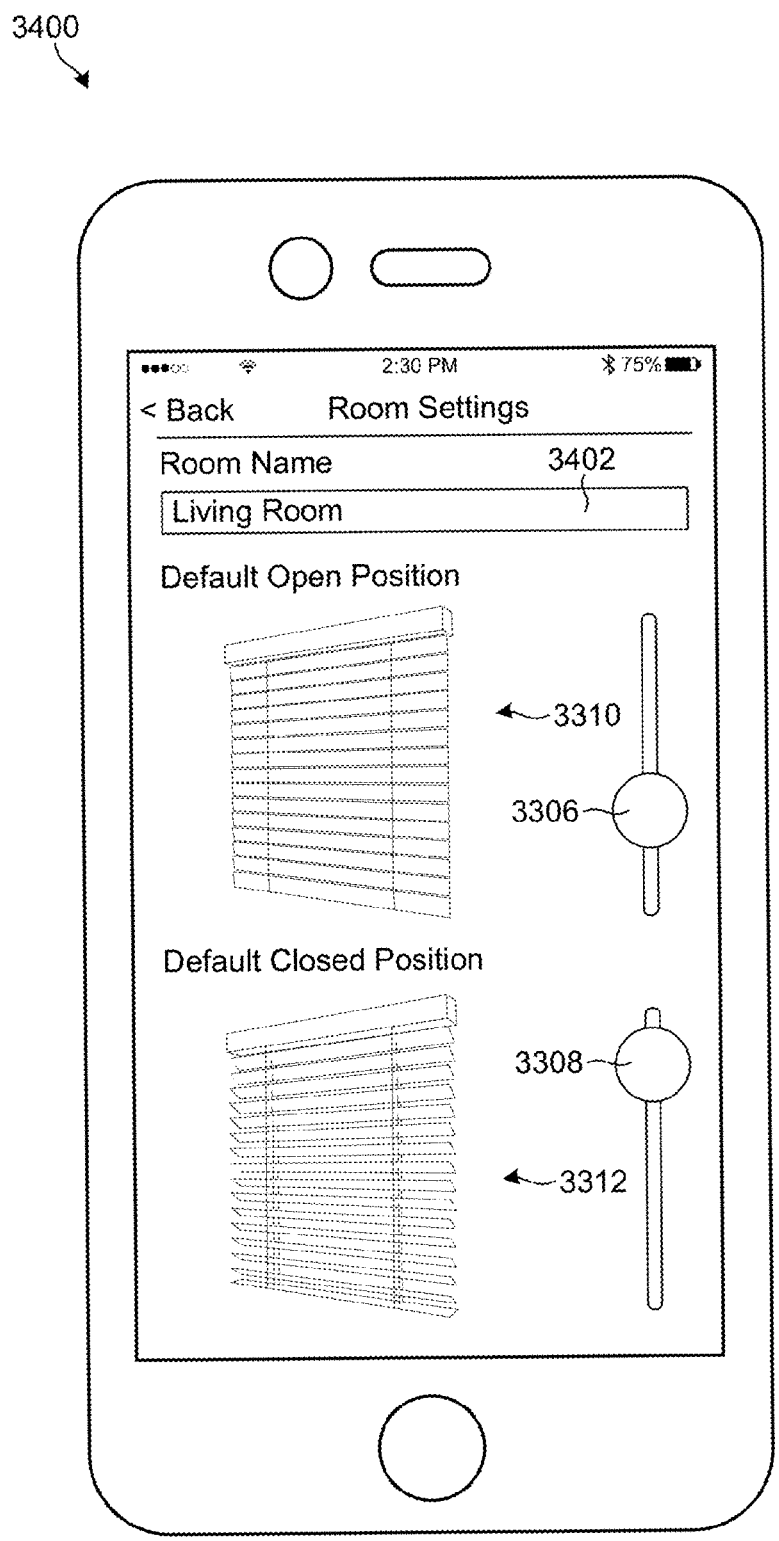
FIG. 34 shows a graphical user interface for adjusting room settings for window blinds in a room.

Referring to FIG. 34, one embodiment of a page 3400 for establishing settings associated with a room is illustrated. Such a page 3400 may be displayed, for example, in response to selecting the button 2702 discussed in association with FIG. 27. The page 3400 may also, in certain embodiments, be displayed in response to selecting the "add new room" button 3704 discussed in association with FIG. 27. As shown, the page 3400 includes a field 3402 to create or edit a room name associated with a particular room or space. The page 3400 also allows default open and closed positions to be established for window blinds 100 associated with a room. In the illustrated example, slider buttons 3306, 3308 are provided to establish the default open and closed positions. Similarly, blind graphics 3310, 3312 may be provided to visually represent the default open and closed positions. When an open or close button 2706, 2708 is selected for a room, as previously discussed in association with FIG. 27, the window blinds 100 in the room may be opened or closed in accordance with the default positions.

Figure 35:
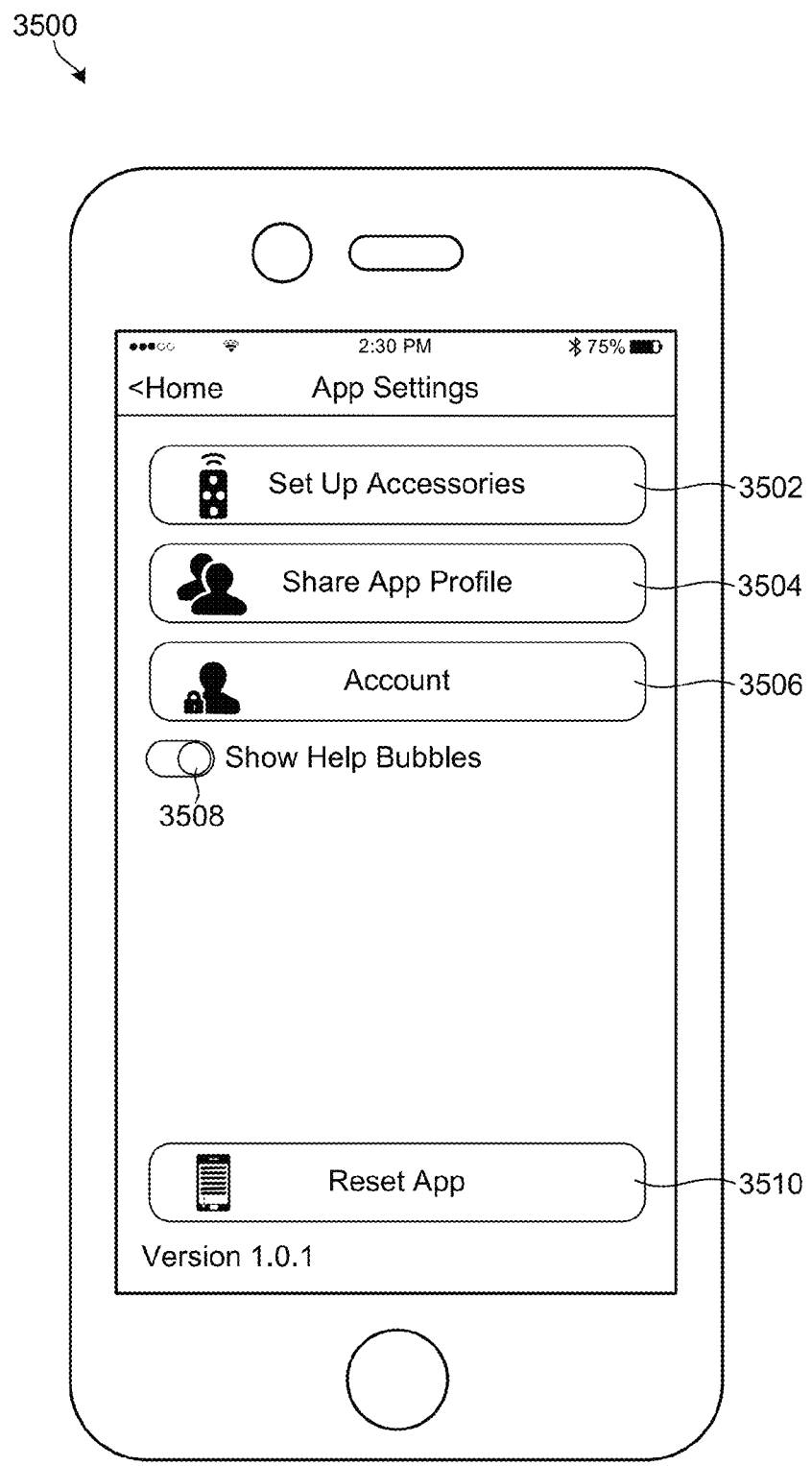
FIG. 35 shows a graphical user interface for establishing settings associated with an application.

Referring to FIG. 35, one embodiment of an "app settings" page 3500 is illustrated. In the illustrated embodiment, the page 3500 includes a "set up accessories" button 3502, "share app profile" button 3504, account button 3506, "show help bubbles" 3508, and "reset app" button 3510. These buttons are provided by way of example and are not intended to be limiting.

A "setup accessories" button 3502 may be provided to set up accessories related to a window blind 100 or a group of window blinds 100. Such accessories may include, for example, a wall switch configured to control window blinds 100, a USB or HDMI dongle configured to control window blinds 100, a temperature sensor connected to a window blind 100, a security sensor connected to a window blind 100, or the like. A page 3600 for setting up such accessories will be discussed in association with FIG. 36.

A "share app profile" button 3504 may enable settings established on a first device (e.g., smart phone, tablet, laptop, etc.) to be mirrored to a second device (e.g., smart phone, tablet, laptop, etc.). For example, if a large number of window blinds 100 have been set up, named, and configured on a first device, the "share app profile" button 3504 may allows these setting to be mirrored to a second device without having to once again set up, name, and configure the window blinds 100.

An account button 3506 may be used to establish a username, password, user preferences, and other account-related information associated with a user. In certain embodiments, a "show help bubbles" button 3508 may cause the application to display help information for screens, buttons, or other features or functionality in the application. These "help bubbles" may be displayed, for example, when a user touches, hovers over, or otherwise selects different screens, buttons, or features in the application. A "reset app" button 3510 may enable a user to reset the application. In certain embodiments, this may erase window blind and other configuration information in the application, thereby allowing the user to start anew.

Figure 36:
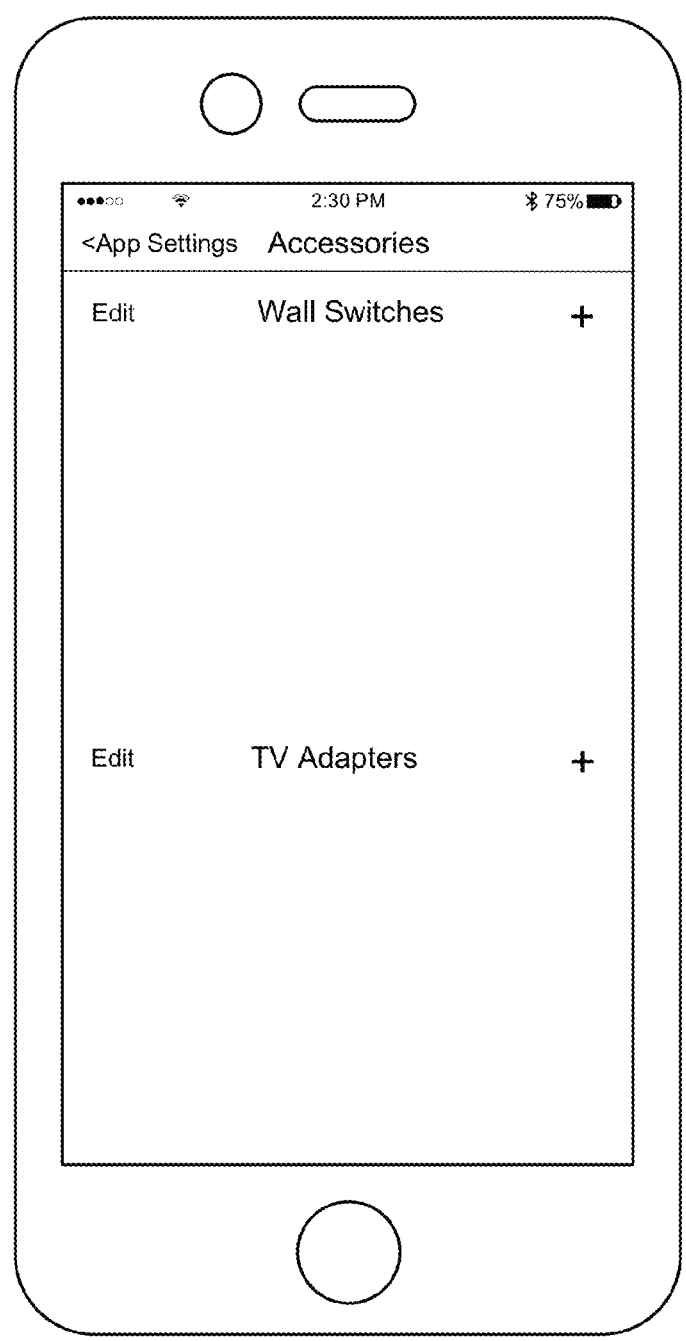
FIG. 36 shows a graphical user interface for adding or editing accessories associated with a room or window blind.

Referring to FIG. 36, one embodiment of a page 3600 for managing accessories related to a window blind 100 or a group of window blinds 100 is illustrated. In this example, the page 3600 shows a list of "wall switches" and "TV adapters." In certain embodiments, a window blind 100 or group of window blinds 100 may be controlled (e.g., wirelessly controlled) by a wall switch, such as a specialized wall switch. One embodiment of such a specialized wall switch will be discussed in association with FIG. 40. Such a wall switch may, in certain cases, be used in place of or in addition to the manual controls provided by the application. As shown, the page 3600 may enable new wall switches to be added to the system as well as editing of existing wall switches.

Similarly, the page 3600 allows "TV adapters" to be added to the system or existing TV adapters to be edited. In certain embodiments, a window blind 100 or a group of window blinds 100 may be controlled by a video display adapter, such as a USB or HDMI dongle plugged into a USB or HMDI port of a video display. Such a video display adapter may be configured to generate a signal when a video display (e.g., a television, projector, etc.) is turned on or off. That is, the window blind 100 or group of window blinds 100 may automatically open or close in response to receiving the signal. This may allow a room or space to be automatically darkened when a television, projector, or other media device is turned on, and automatically lightened when the television, projector, or other media device is turned off. As shown, the page 3600 may enable new TV adapters to be added to the system as well as editing of existing TV adapters.

Figure 37:
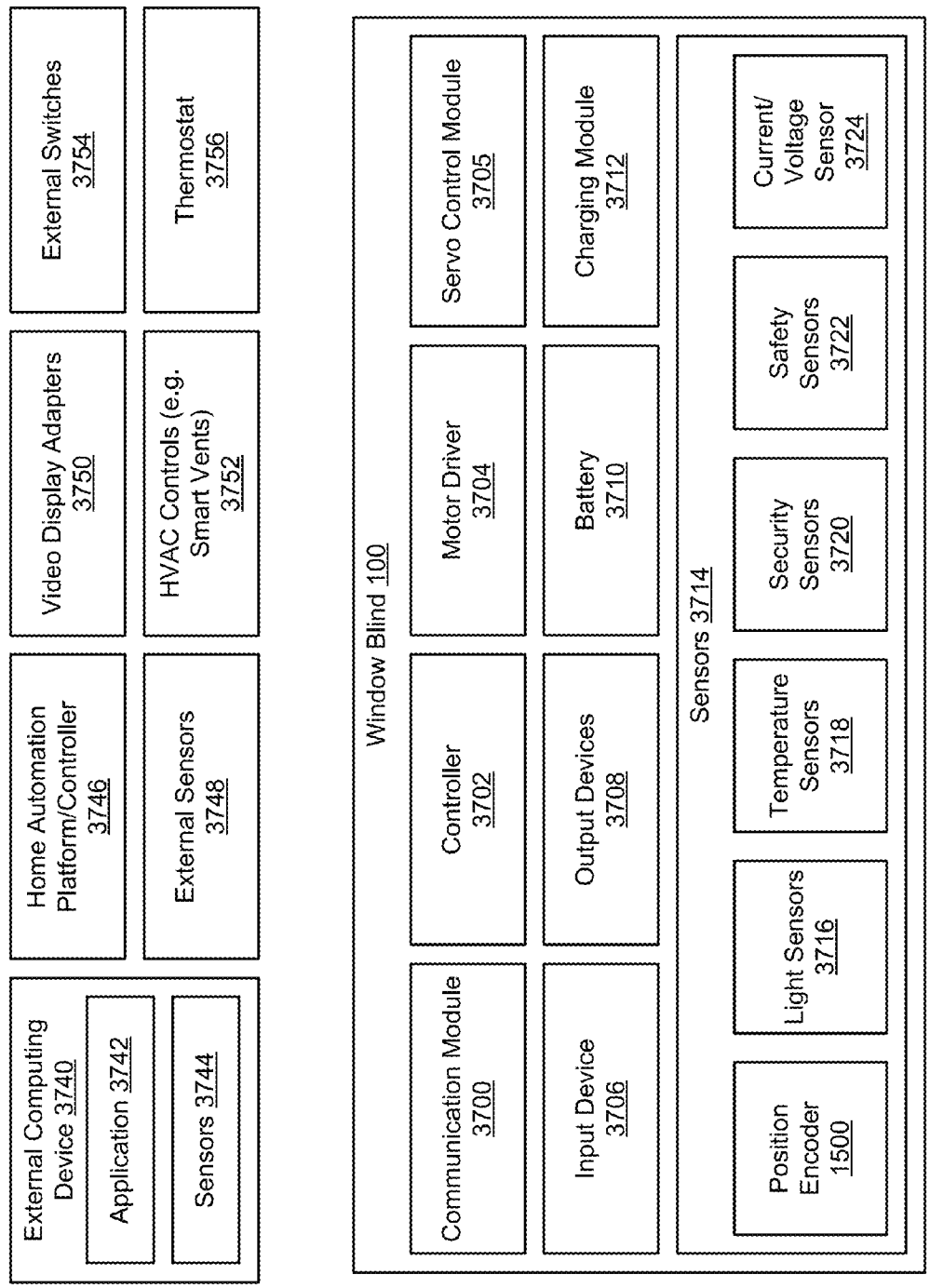
FIG. 37 is a high-level system view showing various components internal to and external to an automated window blind in accordance with the invention.
Figure 38:
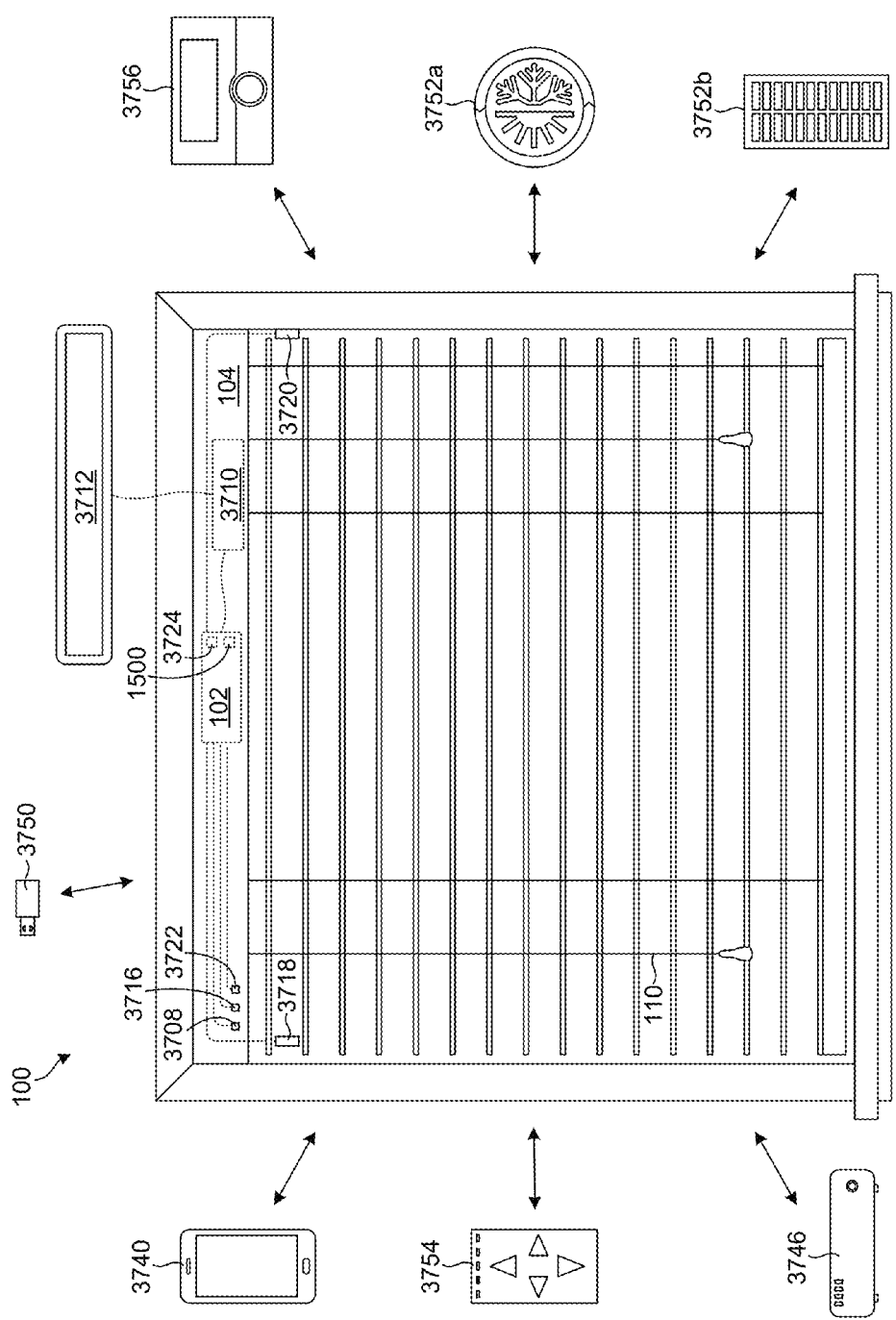
FIG. 38 is a high-level view of the system of FIG. 37, particularly showing possible physical locations of various components described in association with FIG. 37.

Referring to FIGS. 37 and 38, a high-level system view showing various components internal to and external to a window blind 100 is illustrated. Various of the components (e.g., controller 3702, communication module 3700, motor driver 3704, etc.) shown inside the window blind 100 may be implemented within the motorized gearbox assembly 102, such as on the circuit board 404 or within the housing 202 of the motorized gearbox assembly 102, although this is not necessary in all embodiments. Other components (e.g., battery 3710) may be implemented outside of the motorized gearbox assembly 102 but within the headrail 104 of the window blind 100. Yet other components (light sensors 3716, temperature sensors 3718, security sensors 3720, solar cell 3712 etc.) may be implemented outside of the headrail 104 of the window blind 100. For example, a temperature sensor 3718 or security sensor 372 may be mounted to a window and connected to the controller 3702 (using, for example, wires routed through the headrail 104). Nevertheless, the location and placement of the components illustrated in FIG. 37 may vary in different embodiments and is not intended to be limiting.

As shown, an automated window blind 100 outfitted with a motorized gearbox assembly 102 in accordance with the invention may include one or more of the following: a communication module 3700, controller 3702, motor driver 3704, servo control module 3705, input device(s) 3706, output device(s) 3708, battery 3710, and charging module 3712. The window blind 100 may also include one or more sensors 3714, such as a position encoder 1500, light sensor 3716, temperature sensor 3718, security sensor 3720, safety sensor 3722, and current/voltage sensor 3724. The manner in which the various components of the window blind 100 are used will be discussed in more detail hereafter.

A communication module 3700 may enable wireless communication between the window blind 100 and external devices. In one embodiment, the communication module 3700 includes a Bluetooth chip that allows the window blind 100 to communicate with an external computing device 3740, wall switch 3754, video display adapter 3750, home automation controller 3746, or the like, using Bluetooth signals. In other embodiments, the communication module 3700 enables communication using other communication protocols, such as WIFI, Z-Wave, Zigbee, or the like. In certain embodiments, a bridge may be used to enable translation and compatibility between different communication protocols.

The communication module 3700 may also, in certain embodiments, act as a repeater to repeat signals to other devices. This may allow the communication module 3700 (and associated window blind 100) to form part of a mesh network of interconnected devices. In some cases a window blind 100 may originate signals that are used to control other devices. For example, a temperature sensor 3718 connected to a window blind 100 may measure temperature at or near a window. The measured temperature may be transmitted to a thermostat 3756 or other device to make adjustments to an HVAC system. Additionally, or alternatively, commands may be sent directly to an HVAC system to make adjustments thereto. Thus, in certain embodiments, the communication module 3700 may originate signals that are used to control devices external to the window blind 100.

A controller 3702 may be configured to control the window blind 100 and perform other functions, such as gathering information at or near the window blind 100, controlling devices external to the window blind 100, receive and execute commands from devices external to the window blind 100, and the like. As can be appreciated by those of skill in the art, the controller 3702 may be programmable and may include a processor and memory to store and execute program code. As was discussed in association with FIGS. 27 through 36, the controller 3702 may be programmed to operate a window blind 100 in accordance with a designated schedule or in response to sensed lighting conditions. Once programmed, the controller 3702 may operate the window blind 100 on its own without requiring commands from external devices. The controller 3702 may also be configured to receive commands (e.g., open or close commands) from an external device such as a smart phone and operate the window blind 100 accordingly. Thus, presence of the controller 3702 may enable the automated window blind 100 to independently operate on its own (without centralized control), or operate in response to commands from a centralized controller external to the window blind 100.

Control signals generated by the controller 3702 may be sent to a motor driver 3704 in order to operate the motor 400 previously discussed. In certain embodiments, these control signals may be converted to modulated control signals using a suitable modulation technique (e.g., pulse-width modulation, or PWM). The modulated control signals may be sent to the motor driver 180 to operate the motor 54, which may in turn adjust the angular position of the window blind slats 106. In certain embodiments, a servo control module 3705 may provide feedback to the controller 3702 regarding the angular position of the slats 106 (using the position encoder 1500) relative to a desired angular position so that the operation of the motor 400 can be adjusted accordingly. This may reduce error between a desired angular position and an actual angular position of the slats 106.

The window blind 100 may also include various input devices 3706 and output devices 3708. Input devices 3706 may include, for example, various sensors 3714 for gathering data in and around the window blind 100. An input device 3706 may also, in certain embodiments, include an audio sensor for receiving voice commands or other audible signals, such as voice commands to open or close a window blind 100 or group of window blinds 100. In certain embodiments, the pull cord 110 previously discussed may function as an input device 3706 if the pull cord 110 is used to upload data to the motorized gearbox assembly 102. Other types of input devices 3706 are possible and within the scope of the invention. Input devices 3706 may be incorporated into a headrail 104 of the window blind 100, a solar panel attached to the window blind 100, or the like.

Output devices 3708 may include, for example, LEDs, alarms, speakers, or devices to provide feedback to a user. Such output devices 3708 may, for example, indicate when a battery level for a window blind 100 is low; when motion has been detected by a window blind 100 (in embodiments where a motion sensor 3724 is incorporated into the window blind 100); when connectivity is enabled, disabled, or lost between the window blind 100 and other devices; when the window blind 100 has experienced an error or other fault condition; when the window blind 100 has detected smoke, carbon monoxide, or other gases (in the event a smoke or gas detector 3722 is incorporated into the window blind 100); when a security event is detected by the window blind 100, or the like. Such output devices 3708 may, in certain embodiments, be incorporated into a headrail 104 of the window blind 100, a solar panel attached to the window blind 100, or the like.

The window blind 100 may also include a battery 3710 to power the motorized gearbox assembly 102. In certain embodiments, the battery 3710 is housed within the headrail 104 of the window blind 100, external to the motorized gearbox assembly 102. The battery 3710 may be rechargeable and may be recharged through the pull cord 110 previously discussed. Alternatively, or additionally, the battery 3710 is recharged by a solar panel attached to the window blind 100. For example, a solar panel may be attached to the headrail 104 of the window blind 100 between the headrail 104 and the window. This will allow sunlight to shine on the solar panel while substantially hiding the solar panel from view within the interior of a home or business. In other embodiments, solar panels may be incorporated into or attached to the slats 106 of a window blind 100. In certain embodiments, a charging module 3712 may boost low voltage from a solar panel to a higher voltage needed to charge the battery 3710 and/or operate various components within the motorized gearbox assembly 102.

As shown, the window blind 100 may include various types of sensors 3714. Some of these sensors 3714 may be related to operation of the window blind 100. Other sensors 3714 may take advantage of the window blind's special placement within a home or building, namely on or near windows or other openings. The proximity of window blinds 100 to windows and other openings make it possible for smart window blinds 100 to provide a wide variety of features and functions not normally associated with window blinds 100.

As previously mentioned, a position encoder 1500 may be used to track the number of rotations and/or angular position of the output shaft 200. The number of rotations and angular position of the output shaft 200 may be translated into an angular position of window blind slats 106 after the window blind 100 has been calibrated. Various techniques for calibrating a window blind 100 will be discussed in association with FIG. 39.

A light sensor 3716 may sense light levels at or around a window blind 100. Various types of light sensors 3716, including photovoltaic cells, cameras, photo diodes, proximity light sensor, or the like, may be used depending on the application. In certain embodiments, a light sensor 3716 may sense light external to a window. This may allow a window blind 100 to open or close in response to lighting conditions outside a building. For example, a window blind 100 may be configured to open at sunrise and close at sunset. Alternatively, or additionally, a window blind 100 may be configured to open (either fully or partially) when conditions are overcast, thereby letting more light into a room or space, and close (either fully or partially) in response to detecting full sunlight, thereby letting less light into a room or space. In certain embodiments, a light sensor 3716 may be used to determine a total amount of light energy entering a room or space through a window. This information may be used to adjust a window blind 100 or window covering 100, or adjust HVAC system parameters.

A light sensor 3716 may also be configured to sense light levels internal to a window, such as within a room or interior space. This may allow a window blind 100 to be adjusted based on interior light levels. For example, a window blind 100 may be opened in response to lower levels of interior light and closed in response to higher levels of interior light. In certain embodiments, various algorithms may be used to adjust window blinds 100 in response to both exterior and interior light levels, as opposed to just one or the other. Thus, in certain embodiments light sensors 3716 may be provided to sense both exterior and interior light levels.

In certain embodiments, the opening and closing of window blinds 100 may be coordinated with the turning on or off of lights in a room or space. For example, if lights in a room are turned off, window blinds 100 may be opened to compensate for the reduced amount of light. This allows natural light to replace artificial light and creates opportunities for conserving energy. In certain embodiments, lights may be automatically turned off and window blinds 100 may be automatically opened to replace artificial light with natural light when conditions allow. In such embodiments, the window blinds 100 and interior lighting may be controlled by a home automation platform or other controller to provide desired amounts of light in a room or space while simultaneously conserving energy.

A temperature sensor 3718 may be used to sense temperature at or around a window associated with the window blind 100. In certain embodiments, the temperature sensor 3718 is configured to sense a temperature external to a window. For example, an infrared thermometer may be used to infer the temperature external to a window by detecting thermal radiation emitted from objects outside the window. In other embodiments, the temperature sensor 3718 is configured to sense a temperature internal to the window. In yet other embodiments, the temperature sensor 3718 is configured to sense a temperature of the window itself.

In certain embodiments, a window blind 100 may be adjusted based on a temperature sensed by the temperature sensor 3718. For example, if an interior temperature of a room is deemed to be too low, the window blind 100 may open to let in additional sunlight and warm the room. Similarly, if the interior temperature of the room is deemed to be too high, the window blind 100 may close to reduce an amount of sunlight entering the MOM.

The window blind 100 may also use the temperature sensor 3718 to anticipate changes in temperature. For example, if an exterior temperature or temperature of a window decreases (indicating it is getting colder outside), the window blind 100 may be configured to open the blinds and warm a room in an effort to mitigate anticipated cooling of the room. Similarly, if an exterior temperature or temperature of a window increases (indicating it is getting warmer outside), the window blind 100 may be configured to close the blinds in an effort to mitigate anticipated warming of the room.

In addition to adjusting the window blind 100 itself, temperature measured at or near the window blind 100 may be used adjust an HVAC system. The instant inventors have found that measuring temperature at or near a window may be more effective than measuring temperature inside a room (as performed by most thermostats) since windows are located at the boundaries of a room. Temperature changes at these boundaries tend to lead temperature changes in other parts of the room at least partly because windows tend to provide lesser levels of insulation compared to walls and other parts of the room. Thus, temperature readings gathered by a window blind 100 in accordance with the invention may be used as part of a climate control system to adjust various HVAC system parameters. In certain embodiments, a window blind 100 in accordance with the invention may actually replace a traditional thermostat used in homes or other establishments. That is, a window blind 100 in accordance with the invention may monitor temperature at or near a window and, in response, relay at least one of commands and information to an HVAC controller to regulate room temperature in accordance with the monitored temperature. This may, in certain embodiments, eliminate the need for a conventional thermostat, or improve the function of conventional thermostats by providing improved temperature readings from boundaries (e.g., windows) in a room.

Due to the placement of window blinds 100 at or near windows, a window blind 100 in accordance with the invention may also advantageously include security sensors 3720 to monitor security at or near a window. In one embodiment, the security sensor 3720 is a proximity sensor configured to detect opening and/or closing of a window or door. In another embodiment, the security sensor 3720 is an impact sensor configured to detect impacts on and/or breakage of a window. For example, an accelerometer may act as an impact sensor to detect an extent of force on a window. Different alerts or notifications may be sent to a user or other entity depending on the extent of the impact. For example, touching a window may trigger a low priority alert or notification. Larger forces (causing a window to break, for example) may trigger higher priority alerts or notifications. In some embodiments, high priority alerts may be configured to trigger gathering of camera footage at or near a window.

In another embodiment, the security sensor 3720 is a camera configured to gather video or still shots at or around a window. In certain embodiments, an LED or other lighting may be provided for recording video or still shots in low lighting conditions. The video or still shots may be streamed wirelessly to a centralized security system or stored on the motorized gearbox assembly 102 for later retrieval. In other embodiments, the security sensor 3720 is a motion sensor configured to detect motion at or around a window. In yet other embodiments, the security sensor 3720 is an audio sensor configured to collect audio at or around a window. By incorporating security sensors 3720 into window blinds 100, security may be monitored at each window. In certain embodiments, information from the security sensors 3720 is relayed to a centralized security system. In other embodiments, a window blind 100 in accordance with the invention may be configured to act as a centralized security system by gathering information from security sensors 3720 located at various window blinds 100. Such a centralized security system may, in certain embodiments, send notifications to a user, smart device, security company, law enforcement office, or the like, when breaches of security are detected.

Various security sensors 3720 may be configured to work together in certain embodiments. For example, a motion sensor 3720 may, upon sensing motion, trigger operation of a camera 3720, microphone 3720, or other data gathering sensor 3720. In other embodiments, a motion sensor 3720 may trigger illumination of an LED or other output device, thereby warning a potential intruder that he or she has been detected. This may provide a deterrent effect. In other embodiments, a motion sensor 3720 may trigger operation of a window blind 100. For example, if a motion sensor 3720 detects that an intruder is approaching a window, the motion sensor 3720 may trigger closing of the window blind 100 to obstruct the view through the window. Thus, security sensors 3720 may, in certain embodiments, trigger automatic operation of a window blind 100 or a group of window blinds 100.

To further increase security, a window blind 100 in accordance with the invention may be password protected to prevent unauthorized access or control. Multiple failed password attempts may instigate a lockout from the window blind 100. In certain embodiments, a manual unlock may be accomplished by physically manipulating the window blind itself. For example, the window blind 100 may be unlocked by manually tugging on a pull cord 110 or performing some other manual adjustment or reset of the window blind 100.

The sensors 3714 may also, in certain embodiments, include safety sensors 3722 such as smoke detectors, carbon monoxide sensors, or the like. Outfitting window blinds 100 with such sensors 3722 may provide a large number of sensors at prime locations throughout a home or business, while at the same time eliminating or reducing the need to equip a home or business with separate independent sensors. In certain embodiments, alerts or notifications may be sent to a user or first responder when smoke, carbon monoxide, or other critical substances or gases have been detected.

A current/voltage sensor 3724 may be provided to sense current or voltage associated with the motor 400. In certain embodiments, this information may be used to ensure that the motor 400 not overloaded. The current/voltage may also be used to calibrate the window blind 100. For example, when the slats 106 of a window blind 100 are fully tilted (i.e., have reached their maximum angular position), the current of the motor 400 may spike in response to their non-movement. This spike in current may indicate that a maximum angular position has been reached. The angular position of the slats 106 may be recorded at this point (using the position encoder 1500) to remember the maximum angular position. The slats 106 of the window blind 100 may then be tilted in the opposite direction until they stop (i.e., reach their minimum angular position). The current of the motor 400 may again spike in response to the non-movement of the slats 106. This spike may indicate that a minimum angular position has been reached. The minimum angular position may be recorded. In this way, the current/voltage sensor 3724 may be used in conjunction with the position encoder 1500 to learn the angular range of motion and stopping points of the window blind slats 106. In certain embodiments, this calibration technique may be performed when the motorized gearbox assembly 102 is initially powered up or installed in a window blind 100. Once the calibration is performed, the motorized gearbox assembly 102 may, through various calculations, move the slats 106 to any desired angle or position between the stopping points. As will be explained in more detail hereafter, the current/voltage sensor 3724 may, along with the position encoder 1500, be used to estimate a size of a window blind 100. Knowing the size of the window blind 100 may be used to prevent overtorquing of the window blind tilting mechanism.

As further shown in FIG. 37, a window blind 100 may, in certain embodiments, interface with devices external to the window blind 100. For example, the window blind 100 may communicate with an external computing device 3740, such as a smart phone, tablet, laptop, desktop computer, or the like. The external computing device 3740 may, in certain embodiments, execute an application 3742 for setting up, managing, and controlling the automated window blind 100. One example of such an application 3742 was discussed in association with FIGS. 27 through 36.

In certain embodiments, sensors 3744 embedded within the external computing device 3740 may be used to configure the window blind 100. For example, as will be discussed in more detail in association with FIG. 44, GPS and/or compass sensors 3744 embedded in a smart phone may be used to determine a position and orientation of a window associated with the window blind 100. This position and orientation may, in turn, be used to determine a position of the sun over time relative the window. The window blind 100 may then be programmed so that it opens and/or closes (i.e., the slats 106 are tilted) in a way that takes into account the position of the sun over time relative to the position and orientation of the window. In other embodiments, the position and orientation may be used to determine which way a camera or other device incorporated into a window blind 100 is facing.

An automated window blind 100 in accordance with the invention may also, in certain embodiments, interface with a home automation platform/controller 3746. Although an automated window blind 100 in accordance with the invention may be programmed to operate on its own, the window blind 100 may also be configured to work with various home automation systems using their native protocols, or using a bridge that translates the native protocols into the window blind's native protocol. For example, an automated window blind 100 may be controlled by and communicate with a centralized home automation system or controller using Z-Wave, Zigbee, Insteon, or other home automation protocols.

An automated window blind 100 in accordance with the invention may also be configured to interface with external sensors 3748. Although various sensors 3714 (as previously discussed) may be located in the window blind 100 or in close proximity to the window blind 100, other sensors 3748 may be located external to the window blind 100 and, in some cases, be far removed from the window blind 100. For example, a temperature sensor located in one part of a building may be used to trigger operation of window blinds 100 in other parts of the building. In other cases, readings from multiple sensors 3748 located throughout a building may be used to influence operation of a window blind 100 or a group of window blinds 100. In certain cases, data may be gathered from external sensors 3748 and wirelessly communicated to a window blind 100 or group of window blinds 100.

In certain embodiments, an automated window blind 100 in accordance with the invention may interface with one or more video display adapters 3750 (e.g., TV adapters 3750). In certain embodiments, a video display adapter 3750 may be embodied as a USB or HDMI dongle plugged into a USB or HMDI port of a video display. The instant inventors have found that, with most video displays (e.g., televisions), a USB or HMDI port of the video display becomes live (i.e., energized) when the video display is turned on. This same USB or HMDI port goes dead when the video display is turned off. Using this knowledge, a video display adapter 3750 in accordance with the invention may be designed that generates a signal when the video display is turned on. This signal may cause a window blind 100 or group of window blinds 100 to close when the video display is turned on (thereby darkening a room or space) and open when the video display is turned off (thereby lightening the room or space). Such a system may provide simple, inexpensive, automated window covering control for home theaters, entertainment rooms, or other spaces. In certain embodiments, a video display adapter 3750 such as that described above may also be used to control devices other than window blinds 100 or coverings 100, such as lighting, fans, audio/visual equipment, switches, or the like.

An automated window blind 100 in accordance with the invention may also interface with various HVAC controls 3752. For example, as previously mentioned, in certain embodiments a window blind 100 in accordance with the invention may measure temperature at or near a window and relay this temperature to a thermostat 3756, which may in turn adjust various HVAC parameters. In other cases, the window blind 100 may actually function as a thermostat by directly adjusting HVAC parameters. Thus, the window blind 100 may, in certain embodiments, replace a conventional thermostat. In doing so, the window blind 100 may rely on its own temperature sensor 3718 and/or temperature sensors from other window blinds 100 or devices in making determinations with regard to adjusting HVAC parameters.

Adjusting HVAC parameters may include, for example, switching heating or cooling devices 3752 on or off, regulating a flow of air or heat transfer fluid, or adjusting other features of an HVAC device. Adjusting HVAC parameters may also include automatically adjusting smart vents 3752b or smart windows 3752b that regulate air flow into a room or space. This may provide more targeted heating and/or cooling of a room or area, as opposed to adjusting the heating and/or cooling of an entire building. In certain cases, smart windows 3752b may be opened if favorable temperatures are detected external to a home or business, and these temperatures can bring an interior temperature closer to a desired interior temperature. This may conserve energy and reduce utilization of conventional heating and cooling systems.

Figure 40:
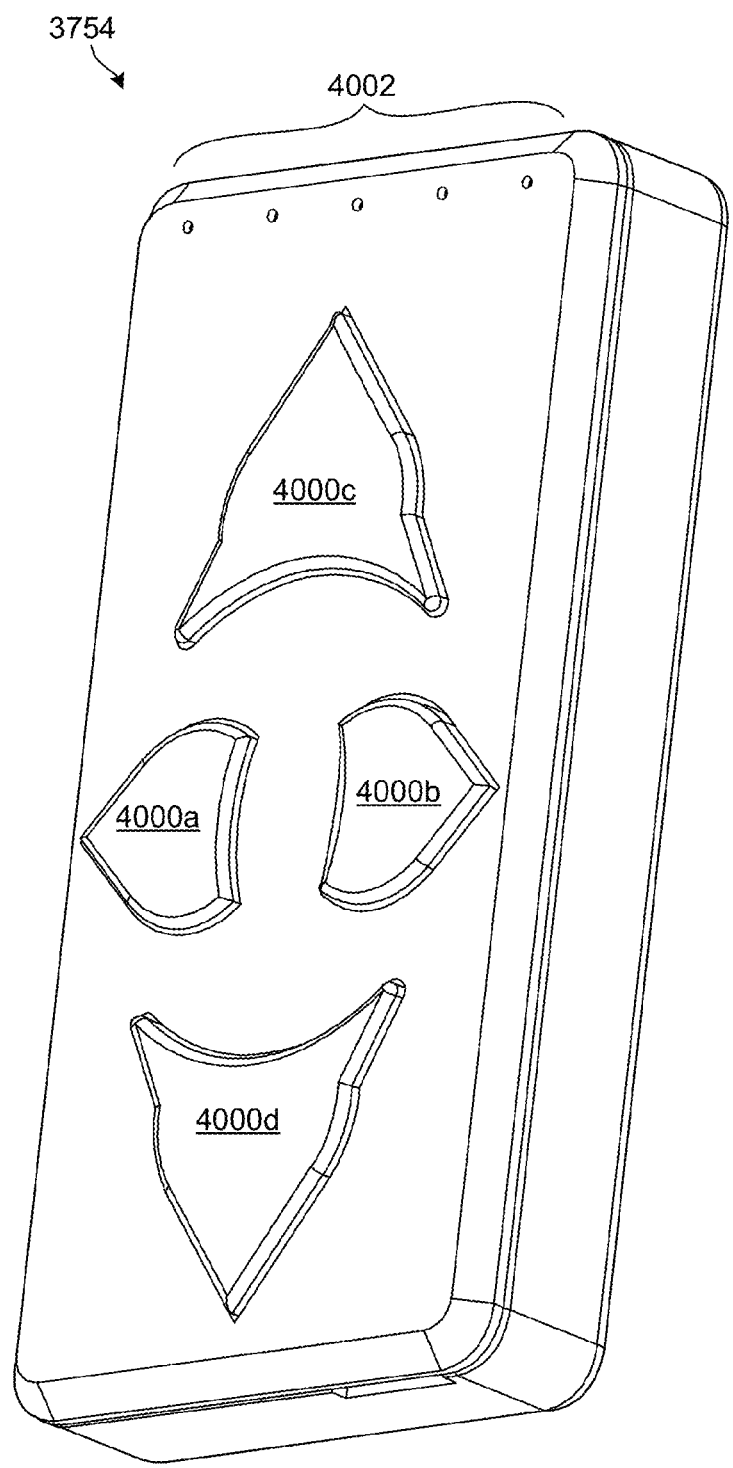
FIG. 40 is a perspective view of one embodiment of a specialized wall switch in accordance with the invention.

As previously mentioned, a window blind 100 or group of window blinds 100 in accordance with the invention may also be controlled (e.g., wirelessly controlled) by external switches 3754, such as a remote control or the specialized wall switch discussed in association with FIG. 40. These switches 3754 may provide additional mechanisms for controlling a window blind 100 or group of window blinds 100. In certain cases, a wall switch 3754 or remote control 3754 may provide a faster and more convenient way to control a window blind 100 or group of window blinds 100 than an application 3742. In certain embodiments, an external switch 3754 in accordance with the invention may provide functionality to control devices other than window blinds 100, as will be discussed in more detail hereafter.0

Figure 39:
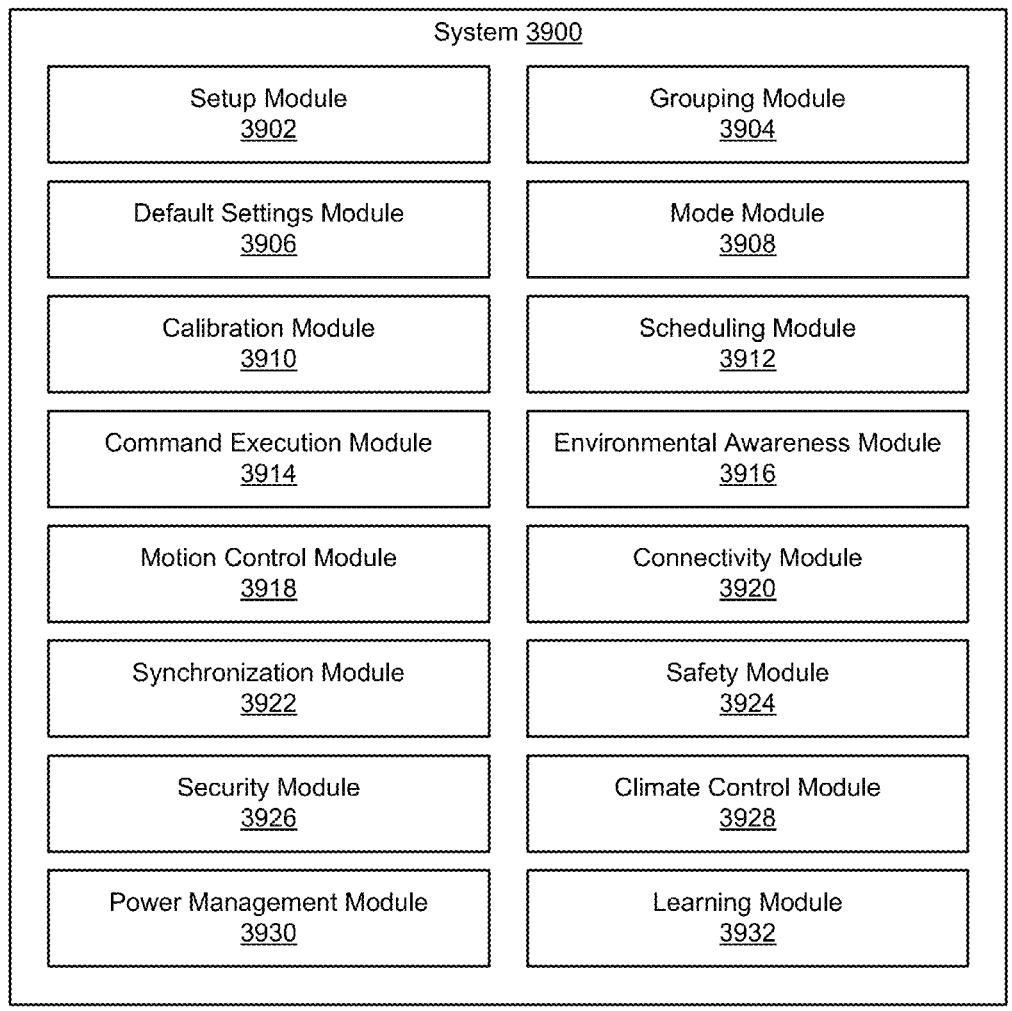
FIG. 39 is a high-level view showing various modules providing different functionality in the system of FIG. 37.

Referring to FIG. 39, various modules included in a system 3900 in accordance with the invention are illustrated. These modules may be embodied in hardware, software, firmware, or a combination thereof. The modules are illustrated to show functionality that may be provided by the disclosed system 3900 as opposed to the locations where such functionality is implemented. For example, the functionality of some modules may be implemented entirely or mostly in a motorized gearbox assembly 102 in accordance with the invention. Other functionality may be implemented in an application 3742 executing on an external computer device 3740, such as a smart phone or tablet. Other functionality may be implemented in a home automation controller 3746. Yet other functionality may be distributed between one or more of a motorized gearbox assembly 102, external computing devices 3740, home automation controller 3746, and other devices. Thus, the location where the modules are implemented may vary in different embodiments.

Once outfitted with a motorized gearbox assembly 102 in accordance with the invention, a setup module 3902 may allow a window blind 100 to be set up. Setting up the window blind 100 may include, for example, detecting the automated window blind 100 (with an external computing device 3740), pairing the automated window blind 100 with the external computing device 3740 (when using Bluetooth, for example), naming the automated window blind 100, assigning the automated window blind 100 to a room, space, or group of window blinds 100, establishing default open and/or closed position for the window blind 100, setting up a schedule or manner of operation for the window blind 100, and the like. In certain embodiments, the setup module 3902 may use one or more of the other modules illustrated in FIG. 39 to perform these tasks.

A setup module 3902 may, in certain embodiments, enable automated window blinds 100 to be ordered for a room or space. For example, the setup module 3902 may enable a user to input measurements for window blinds 100 in a room or space. In certain embodiments, the setup module 3902 may also allow the user to assign names to the window blinds 100 according to their location in the room or space. These names may be printed on the window blinds 100 at a manufacturing plant so that the window blinds 100 arrive at the user's home or business pre-labeled. This will ideally help the user quickly identify where the window blinds 100 are to be installed.

A grouping module 3904 may enable multiple window blinds 100 to be set up and controlled as a group. In certain embodiments, this may be accomplished by configuring one window blind 100 in the group to act as a master and the other window blinds 100 in the group to act as slaves of the master. The group of window blinds 100 may, in certain embodiments, be configured to operate from a single schedule or sensors on a single window blind 100, external computing device 3740, or home automation controller 3746, thereby ensuring the window blinds 100 in the group are synchronized. In such an embodiment, the group of window blinds 100 may operate in response to a command or commands from the master window blind 100, external computing device 3740, or home automation controller 3746. In certain embodiments, separate commands are sent to each window blind 100 belonging to a group to cause them to act in a synchronized manner. In other embodiments, a single command that is addressed to multiple window blinds 100 is sent. Each window blind 100 may receive the command and either execute or discard the command based on whether the command is addressed to the window blind 100.

In other embodiments, the group of window blinds 100 may each operate from an identical schedule programmed into each window blind 100, or from individual sensors in each window blind 100 that are configured in the same way. As previously mentioned, an application 3742 in accordance with the invention may, in certain embodiments, provide buttons or options that allow window blinds 100 to be grouped, as well as provide buttons or options that allow the window blinds 100 to be controlled or programmed as a group as opposed to individually. The grouping module 3904 may also allow groups to be modified, such as by renaming a group, adding window blinds 100 to a group, naming window blinds 100 within a group, removing window blinds 100 from a group, and the like.

A default settings module 3906 may allow various default setting a to be established for a window blind 100 or a group of window blinds 100. For example, a default open and/or closed position may be established for a window blind 100 or group of window blinds 100. When, a window blind 100 is opened, such as by selecting an "open" button in an application 3742 or other device, the window blind 100 may stop at the default open position. Similarly, when a window blind 100 is closed, such as by selecting a "close" button in the application 3742 or other device, the window blind 100 may stop at the default closed position. Other default settings are possible and within the scope of the invention.

A mode module 3908 may enable a user to establish and select from various modes for a window blind 100 or group of window blinds 100. Such modes may change the behavior of a window blind 100 or group of window blinds 100. For example, a user may establish an "at home" mode and an "away" mode that causes the user's window blinds 100 to behave differently based on whether the user is at home or away from home. For example, the user's window blinds 100 may be configured to open or close at different times or in response to different conditions based on whether the user is at home or away. An "away" mode in particular may, in certain embodiments, be configured to make a home or business appear to be occupied, such as by moving window blinds 100 periodically. Other window blinds 100 may remain closed to prevent viewing of valuable items within the home or business. The user may manually set the mode or the mode may be set automatically in response to different conditions (e.g., detecting activity or inactivity in a home using a motion sensor, detecting the presence or absence of a smart device, tag, or other device carried by an occupant, for example).

A calibration module 3910 may be configured to calibrate a motorized gearbox assembly 102 in accordance with the invention. For example, when a motorized gearbox assembly 102 is initially installed in a window blind 100, the motorized gearbox assembly 102 may tilt the slats 106 in both directions to determine the angular range of motion. That is the motorized gearbox assembly 102 may tilt the slats 106 in a first direction until the slats 106 reach a first stopping point, and then tilt the slats 106 in the opposite direction until the slats 106 reach a second stopping point. Because, the slats 106 may not have a hard stop in either direction, in certain embodiments the slats 106 are tilted until the current of the motor 400 reaches a specified threshold (or until the position encoder 1500 detects that movement has substantially stopped) and then titled in the opposite direction until the current of the motor 400 reaches the specified threshold (or until the position encoder 1500 detects that movement has substantially stopped). Alternatively, or additionally, the slats 106 may be tilted until the angular velocity of the slats 106 falls below a specified threshold and then titled in the opposite direction until the angular velocity of the slats 106 falls below the specified threshold. In this way, the calibration module 3910 may determine the limits of angular travel. Once these limits are determined using the position encoder 1500, the slats 106 may be tilted to any intermediate angle between the limits using a simple calculation, and/or the motorized gearbox assembly 102 may be able to determine a current angular position of the slats 106.

In certain embodiments, the calibration module 3910 may also be configured to determine a size of the window blind 100, such as the window blind's length, width, overall area, or weight. This may be important to properly calibrate the window blind 100 and ensure that a tilting mechanism of the window blind 100 is not overtorqued. For example, a larger window blind 100 may require more force to operate the window blind 100 and a smaller window blind 100 may require less force to operate the window blind 100, due to the weight of their respective slats 106 and structure. Calculating the size of the window blind 100 may ensure that a proper amount of power (and thus force) is applied to the blinds tilting mechanism. In certain embodiments, the calibration module 3910 may calculate the weight by examining an amount of current drawn by the motor 400 (as measured by the current sensor 3724) in relation to an amount angular movement or speed of the slats 106 (as measured by the position encoder 1500). The more current that is drawn for a given angular distance or speed, the larger the size of the window blind 100.

A scheduling module 3912 may be configured to schedule operation of a window blind 100 or group of window blinds 100. Various different techniques may be used to schedule operation of a window blind 100. In certain embodiments, a user may designate open/close times as discussed in association with FIG. 30. In other cases, a schedule may be automatically determined based on a time of year and/or location or orientation of a window blind 100. For example, a user may schedule a window blind 100 to open at sunrise and close at sunset. The scheduling module 3912 may reference a database or utilize an algorithm to determine sunrise and sunset times for the window blind 100 based on the window blind's location and the time of year and schedule opening and closing times accordingly. These opening and closing times may be adjusted throughout the year as the position of the sun changes.

In other cases, the scheduling module 3912 may consider the orientation of a window blind 100. Based on the window blind's orientation and the incidence of the sun on the window blind 100 at different times of day, the opening and closing times may be adjusted. The opening and closing times may be adjusted based on the changing incidence of the sun on the window blind 100 over time. In certain embodiments, each window blind 100 may keep track of a current date and time using an internal clock or by referencing an external clock so that the position of the sun for the date and time can be determined.

A command execution module 3914 may enable a window blind 100 to respond to commands in additional to following a schedule or operating in response to sensed lighting conditions. For example, a user may wish to manually open and close a window blind 100 or a group of window blinds 100 by selecting buttons or options in an application 3742, or using a specialized wall switch 3754. For example, a window blind 100 or a group of window blinds 100 may open in response to receiving an open command and close in response to receiving a close command. A stop command may cause the window blind 100 or group of window blinds 100 to stop at their current angular position. Other commands are possible and within the scope of the invention.

An environmental awareness module 3916 may allow a window blind 100 or group of window blinds 100 to operate in response to environmental conditions. For example, a window blind 100 or group of window blinds 100 may be configured to open or close in response to changing lighting conditions, changing temperature conditions, detected motion, detected noise, detected security situations, detected safety situations, or the like. These conditions may be conditions inside a building, outside a building, or a combination thereof. The environmental awareness module 3916 may require sensors, placed at suitable locations, to detect environmental conditions that may trigger operation of the window blinds 100.

A motion control module 3918 may be configured to control the motion of a window blind 100. As previously mentioned, functionality may be provided to designate how fast a window blind 100 or group of window blinds 100 opens or closes in association with a particular event. As an example, a user may want a window blind 100 or group of window blinds 100 to open or close over a specified period of time (e.g., 10 minutes, 30 minutes, an hour, etc.) instead of opening or closing in an abrupt manner. In other cases, the window blinds 100 may move gradually to mirror movement of the sun. In some cases, this may make movement of the window blinds 100 undetectable to the naked eye. The motion control module 3918 may enable this functionality. The motion control module 3918 may provide this functionality by performing slight incremental angular movements (possibly invisible to the eye) of the slats 106 over a specified period of time. Alternatively, or additionally, the motion control module 3918 may simply adjust the speed of the motor 400. In certain embodiments, this may be accomplished using pulse-wide modulation (PWM) or other techniques to adjust the speed of the motor 400.

A connectivity module 3920 may be used to provide connectivity between a window blind 100 and other devices. This may include providing connectivity between a window blind 100 and an external computing device 3740, a home automation platform/controller 3746, external sensors 3748, video display adapters 3750, HVAC controls 3752, external switches 3754, thermostats 3756, or other window blinds 100. Any suitable communication protocol may be used. In certain embodiments, the connectivity module 3920 allows devices to act as repeaters of a signal, thereby allowing the devices to form a mesh network of interconnected devices.

A synchronization module 3922 may enable a window blind 100 to be synchronized with an external computing device 3740, such as a smart phone or tablet. For example, the synchronization module 3922 may enable a window blind 100 to synchronize its date and time with the date and time of the external computing device 3740. The synchronization module 3922 may also enable the window blind 100 to synchronize itself with various sensors 3744 of the external computing device 3740. For example, as shown in FIG. 44, an external computing device 3740 may, in certain embodiments, be aligned with a window 4400 associated with a window blind 100 or other window covering. Aligning the external computing device 3740 with the window 4400 may include, for example, setting the external computing device 3740 flat on the window sill 4402 and aligning it with a corner or center of the window sill 4402 such that the external computing device 3740 is oriented substantially normal to the window 4400. An option may then be selected in the application 3742 that causes the external computing device 3740 to record the current position (GPS coordinates, height, etc.) and/or orientation of the external computing device 3740 using the external computing device's internal sensors (e.g., compass and/or GPS sensors). The position and orientation of the window 4400 and associated window blind 100 may be extrapolated from the position and orientation of the external computing device 3740.

In certain embodiments, additional information, such as the size and dimensions (e.g., height, width) of the window 4400 may be input to the external computing device 3740 by the user to further define the position and orientation of the window 4400. Once the position and orientation of a window 4400 are known, a window blind 100 may be programmed to operate (e.g., open/close) based on the position and orientation of the window 4400 in relation to the position and orientation of the sun. The position and orientation of the window 4400 may also be used to determine how and when sunlight will be incident on a solar panel used to power a window blind 100 or charge a battery 3710.

In certain embodiments, the operation of a window blind 100 or group of window blinds 100 may be synchronized with a calendar, timer, or alarm clock of an external computing device 3740. For example, an alarm clock associated with an external computing device 3740 may cause a window blind 100 or group of window blinds 100 to open and thereby allow sunlight to enter a room or space. Similarly, a calendar event or expiration of a timer may cause a window blind 100 or group of window blinds 100 to open or close.

A safety module 3924 in accordance with the invention may be configured to provide various safety features at or near a window blind 100. For example, as previously explained, a window blind 100 in accordance with the invention may be equipped with safety sensors 3722 such as smoke detectors, carbon monoxide sensors, or the like. In certain embodiments, the safety module 3924 may monitor these safety sensors 3722 and generate notifications or set off alarms when a hazardous or safety-related condition is detected.

A security module 3926 may be configured to monitor security at or near a window 4400 associated with a window blind 100. As previously mentioned, one or more security sensors 3720 may incorporated into or located proximate a smart window blind 100 in accordance with the invention. Using the security sensors 3720, the security module 3926 may detect events such as, opening or closing of a window, impacts on a window, breakage of a window, motion near a window, sound near a window, or the like. When a security-related event or condition is detected, the security module 3926 may generate a notification, set off an alarm, or the like. In certain embodiments, the security module 3926 is configured to monitor security conditions at multiple windows, thereby providing comprehensive security throughout a home or business.

A climate control module 3928 may be configured to monitor and adjust the climate within a room or space. As previously mentioned, a window blind 100 in accordance with the invention may be equipped with temperature sensors 3718, humidity sensors, or the like. These sensors may be used to monitor the climate internal to or external to a room or space. Using these sensors, the climate control module 3928 may monitor the climate and make adjustments where needed. In certain embodiments, the climate control module 3928 sends information to a thermostat 3756 so that the thermostat 3756 can adjust HVAC parameters (heating, cooling, humidity, air circulation, etc.) accordingly. In other embodiments, the climate control module 3928 adjusts the HVAC parameters directly.

A power management module 3930 may be configured to manage power required by a window blind 100 in accordance with the invention. As previously mentioned, the window blind 100 may be powered by a battery 3710. In certain embodiments, this battery 3710 is charged by a solar panel 3712. The solar panel 3712 may be accompanied by a charging module 3712 to boost a low voltage of the solar panel (in reduced lighting conditions) to a higher voltage needed to charge the battery and/or operate components of the motorized gearbox assembly 102. In other embodiments, the battery 3710 is charged through a pull cord 110.

In certain embodiments, the power management module 3930 may track power levels and/or usage trends of a window blind 100 or group of window blinds 100 and make or suggest adjustments to more efficiently utilize power. For example, the power management module 3930 may adjust or suggest adjusting a number of scheduled openings/closings to extend battery life. In certain embodiments, the power management module 3930 may put a window blind 100 (or selected components of a window blind 100) into a sleep or lower power mode when the window blind 100 and/or any attached components (e.g., sensors) are not in use. Various events (detected motion, security events, safety-related events, etc.) may wake up a window blind 100 or selected components of a window blind 100. A window blind 100 may also wake up when communications are received from external devices, such as an external computing device 3740, home automation controller 3746, video display adapter 3750, external switch 3754, other window blinds 100, or the like.

A learning module 3932 may be configured to learn a user's tendencies and operate a window blind 100 or group of window blinds 100 in accordance with those tendencies. For example, the learning module 3932 may observe that a user opens or closes a window blind 100 at specific times of the day or in response to certain lighting conditions. This observation may take place continually or over a specified period of time. The learning module 3932 may then program the window blind 100 or instruct the window blind 100 to open or close at the observed times or in accordance with some algorithm designed to implement user preferences. In another example, the learning module 3932 may observe that the user opens or closes certain window blinds 100 at the same time or proximate in time and then program the window blinds 100 to open and close together as a group at the observed time. In yet other cases, the learning module 3932 may observe an angle that slats 106 are adjusted to and adjust the slats 106 accordingly. Other types of learning are possible and within the scope of the invention.

Referring to FIG. 40, one embodiment of a specialized wall switch 3754 in accordance with the invention is illustrated. The specialized wall switch 3754 may be battery powered or connected to a building's electrical system. The specialized wall switch 3754 enables large number of different devices (e.g., window blinds 100 or groups of window blinds 100, lights, fans, heating systems, cooling systems, etc.) to be controlled (e.g., wirelessly controlled) with a single switch 3754, without requiring separate controls for each device or system. As shown the specialized wall switch 3754 includes a set of directional buttons 4000a-d for selecting a device or system to control, as well as adjusting an amount associated with the device or system. A first pair of directional buttons 4000a, 4000b enables a user to select a current function for the specialized wall switch 3754. A set of indicators 4002 (e.g., colored LEDs 4002, LEDs 4002 with accompanying pictures or icons, etc.) may be provided to indicate the current function of the specialized wall switch 3754. A second pair of directional buttons 4000c, 4000d enables the user to increase or decrease an amount associated with the current function. The first and second pairs of directional buttons 4000a-d may be oriented substantially perpendicular to one another. Similarly, the buttons 4000a-d may be embodied as separate buttons 4000a-d, as illustrated, or be embodied as one or more rocker or rocker-like switches, a directional pad, a control pad, a joystick, touchscreen with virtual directional buttons, or the like. For the purposes of the disclosure and claims, each of these embodiments will be collectively referred to as a "directional switching device."

Figure 41:
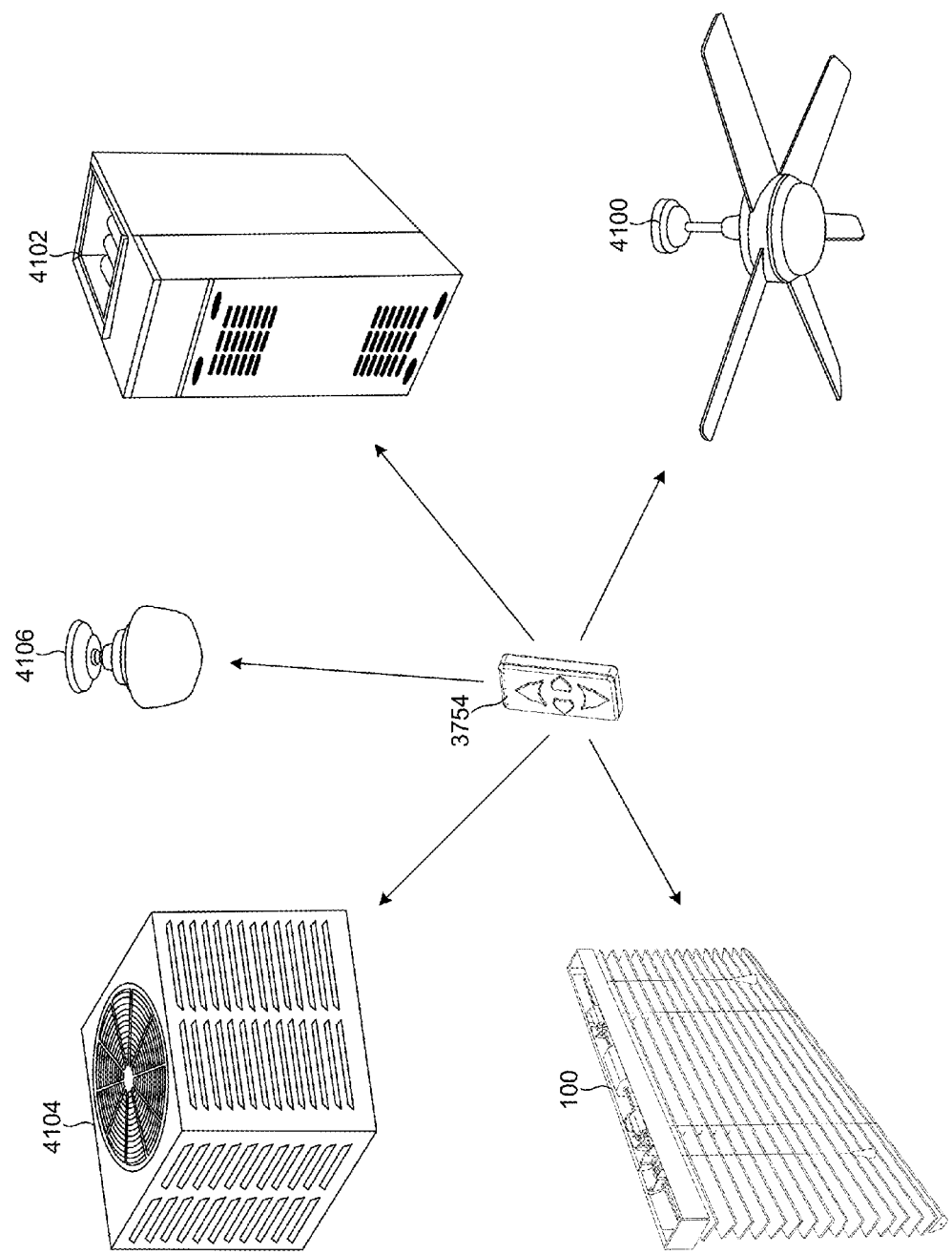
FIG. 41 is a high-level view showing various components that may be controlled by the specialized wall switch discussed in association with FIG. 40.

For example, referring to FIG. 41, while continuing to refer generally to FIG. 40, the illustrated specialized wall switch 3754 may be configured to control five different devices or systems, such as a window blind 100 or group of window blinds 100, a fan 4100, a heating system 4102 such as a furnace, a cooling system 4104, and lights 4106. These functions are presented by way of example and not limitation. Other types and numbers of functions are possible and within the scope of the invention.

A center indicator 4002 may be white and illuminate when lights 4106 are the current function. When lights 4106 are the current function, the buttons 4000c, 4000d may increase or decrease the intensity of the lights 4106, or turn the lights 4106 on or off. A first indicator 4002 right of center may be blue and illuminate when a cooling system 4104 is the current function. When the cooling system 4104 is the current function, the buttons 4000c, 4000d may turn a desired temperature up or down or, in other embodiments, turn the cooling system 4104 on or off. A first indicator 4002 left of center may be red and illuminate when a heating system 4102 is the current function. When the heating system 4102 is the current function, the buttons 4000c, 4000d may turn the desired temperature up or down or, in other embodiments, turn the heating system 4102 on or off.

A second indicator 4002 right of center may be green and illuminate when a ceiling fan 4100 (or other air circulation device 4100) is the current function. When the fan 4100 is the current function, the buttons 4000c, 4000d may adjust the speed of the fan 4100 up or down. A second indicator 4002 left of center may be yellow and illuminate when a window blind 100 or group of window blinds 100 is the current function. When a window blind 100 or group of window blinds 100 is the current function, the buttons 4000c, 4000d may adjust the tilt of the slats 106 of the window blind 100 or group of window blinds 100 or, alternatively, cause the window blind 100 or group of window blinds 100 to open or close.

Figure 42:
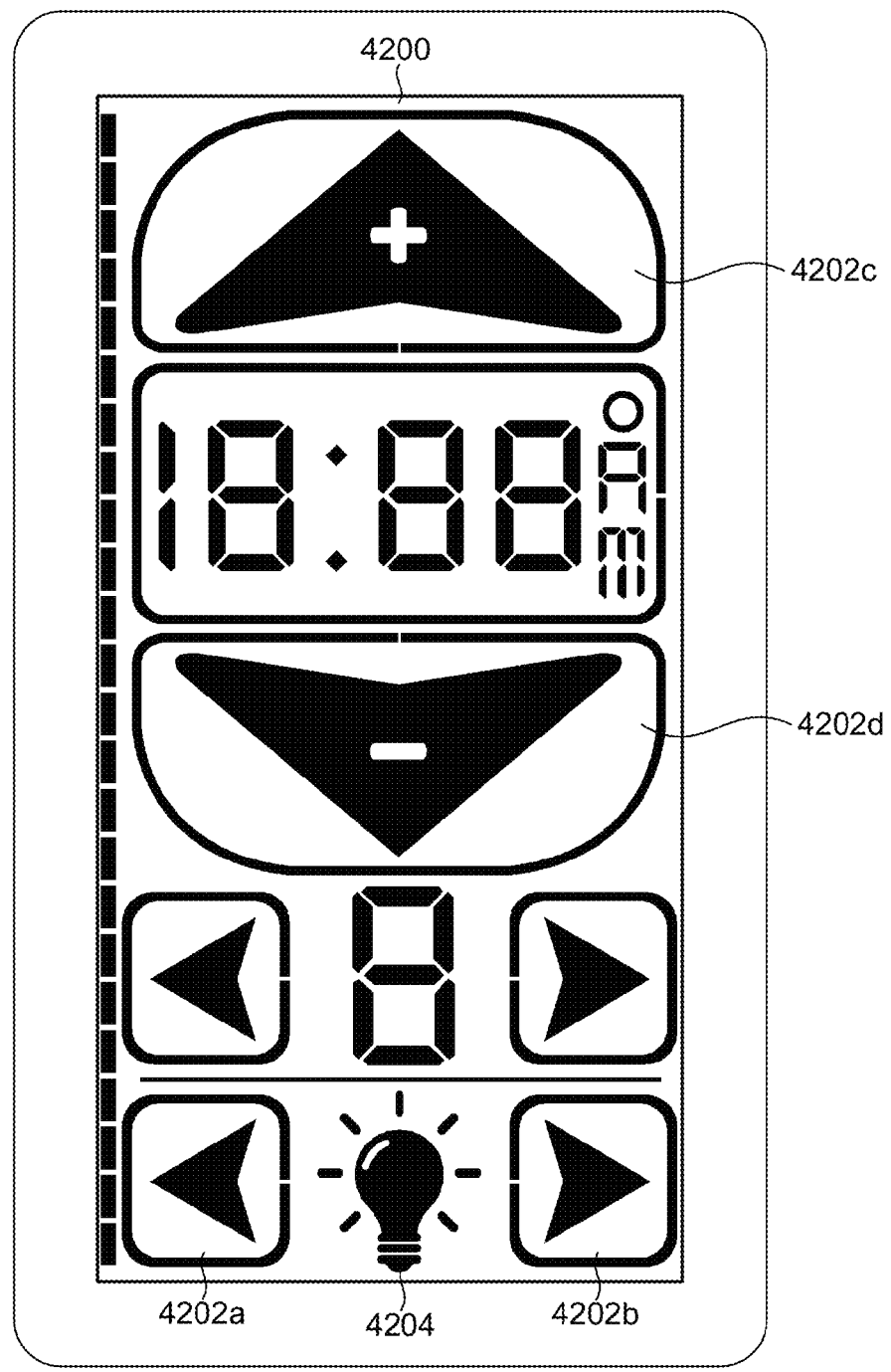
FIG. 42 shows one embodiment of a touchscreen providing functionality similar to the specialized wall switch illustrated in FIG. 40.
Figure 43:
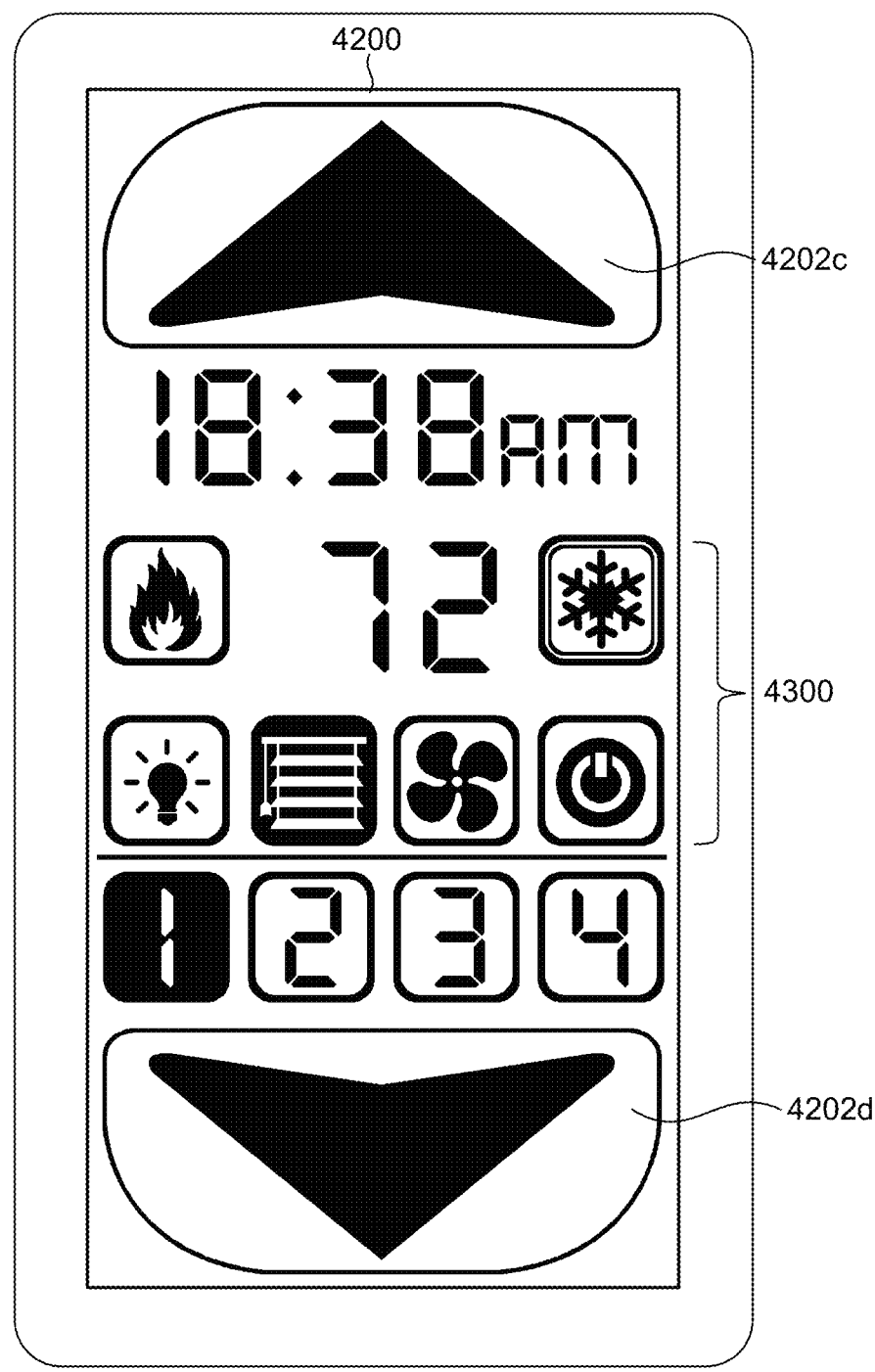
FIG. 43 shows another embodiment of a touchscreen providing functionality similar to the specialized wall switch illustrated in FIG. 40.

Referring to FIG. 42, in certain embodiments the specialized wall switch 3754 illustrated in FIG. 40 may be embodied as a touchscreen 4200 providing virtual directional controls similar to the physical controls shown of FIG. 40. As shown the touchscreen 4200 includes a set of virtual directional buttons 4202a-d for selecting a device or system to control, as well as adjusting an amount associated with the device or system. A first pair of virtual directional buttons 4202a, 4202b enables a user to select a current function for the touchscreen 4200. An indicator icon 4204 may be provided to indicate the current function of the touchscreen 4200. A second pair of virtual directional buttons 4202c, 4202d enables the user to increase or decrease an amount associated with the current function. FIG. 43 shows an embodiment similar to that of FIG. 42 except that the virtual directional buttons 4202a, 4202b are replaced by virtual buttons 4300 or icons 4300 enabling a user to directly select a current function. In the embodiment shown in FIG. 43, the virtual button 4300 or icon 4300 representing the current function is bolded or has its colors inverted.

Although particular reference has been made herein to window blinds 100 and window blind actuation mechanisms, various features and functions of the disclosed embodiments of the invention may equally apply to other types of automated window coverings (e.g., automated shutters, curtains, shades, etc.) and window covering actuation mechanisms. The disclosed features and functions may also be applicable to other aspects of window blinds 100. For example, different features and functions disclosed herein may be used to automatically raise and lower the slats 106 of window blinds 100 as opposed to just adjusting the tilt of the slats 106. Thus, where applicable, the disclosed features and functions may be used with other types of window coverings and window covering actuation mechanisms.

The apparatus and methods disclosed herein may be embodied in other specific forms without departing from their spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A remotely controlled window covering, comprising:
a gearbox disposed within a headrail of the window covering, comprising an internal enclosure and an external enclosure, wherein the internal enclosure encloses gears, and wherein the external enclosure encloses the internal enclosure and creates a cavity between the internal enclosure and the external enclosure;
a motor disposed in the gearbox inside the external enclosure, wherein the motor applies torque to the gears;
a controller controlling operation of the motor, the controller disposed in the cavity;
an output shaft comprising an axial bore extending through the internal enclosure and the external enclosure, wherein the gears apply torque to the output shaft;
a window covering tilt rod that passes through the bore of the output shaft;
a selectable tilt rod adapter fixedly disposed within the bore of the output shaft, and
the adapter having an internal shape complementary to the tilt rod and an external shape complementary to the bore of the output shaft, wherein the output shaft applies torque to the tilt rod via the tilt rod adapter; and
a directional switching device that provides directional control along multiple axes, wherein directional control along a first axis selects a current function from a plurality of functions, and directional control along a second axis increases or decreases an amount associated with the current function, wherein the first axis is perpendicular to the second axis, wherein the directional switching device communicates with the controller, and wherein one of the plurality of functions includes adjusting a tilt of the window covering, and the amount includes the amount and direction of the tilt.

2. The apparatus of claim 1, further comprising at least one indicator indicating the current function of the directional switching device.

3. The apparatus of claim 2, wherein the at least one indicator comprises at least one colored light that indicates the current function based on light color.

4. The apparatus of claim 2, wherein the at least one indicator comprises at least one picture that indicates the current function.

5. The apparatus of claim 2, wherein the at least one indicator uses a display that indicates the current function.

6. The apparatus of claim 1, wherein selection of a first function from the plurality of functions causes the directional switch to wirelessly control a first device and selection of a second function from the plurality of functions causes the directional switching device to wirelessly control a second device.

7. The apparatus of claim 1, wherein the directional switching device is a wall-mounted directional switching device.

8. The apparatus of claim 1, wherein the directional switching device is implemented by at least one of: a plurality of buttons, a rocker switch, a rocker-like switch, a directional pad, a control pad, and a joystick.

9. The apparatus of claim 1, wherein the directional switching device is implemented on a touchscreen.

* * * * *